US010772080B2

(12) United States Patent
Kimura et al.

(10) Patent No.: US 10,772,080 B2
(45) Date of Patent: *Sep. 8, 2020

(54) WIRELESS COMMUNICATION DEVICE, WIRELESS COMMUNICATION METHOD, AND PROGRAM

(71) Applicant: SONY CORPORATION, Tokyo (JP)

(72) Inventors: Ryota Kimura, Tokyo (JP); Hiromasa Uchiyama, Tokyo (JP); Sho Furuichi, Tokyo (JP); Ryo Sawai, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,160

(22) Filed: Dec. 27, 2018

(65) Prior Publication Data

US 2019/0132820 A1    May 2, 2019

Related U.S. Application Data

(63) Continuation of application No. 15/327,613, filed as application No. PCT/JP2015/069945 on Jul. 10, 2015, now Pat. No. 10,219,249.

(51) Int. Cl.
*H04W 72/04* (2009.01)
*H04L 1/18* (2006.01)
(Continued)

(52) U.S. Cl.
CPC .......... *H04W 72/04* (2013.01); *H03M 13/27* (2013.01); *H03M 13/3769* (2013.01);
(Continued)

(58) Field of Classification Search
CPC .......... H04B 1/707; H04B 2201/70701; H04B 7/2628; H04J 13/00; H04J 13/16
(Continued)

(56) References Cited

U.S. PATENT DOCUMENTS 8,498,357 B2    7/2013  Jung et al.
9,445,430 B2    9/2016  Nobusawa et al.
(Continued)

FOREIGN PATENT DOCUMENTS

CN    101459494 A    6/2009
CN    101946441 A    1/2011
(Continued)

OTHER PUBLICATIONS

Extended European Search Report dated Apr. 24, 2018 in corresponding European Patent Application No. 15845230.0, 14 pages.
(Continued)

*Primary Examiner* — Peter G Solinsky
*Assistant Examiner* — Sanjay K Dewan
(74) *Attorney, Agent, or Firm* — Xsensus LLP

(57) ABSTRACT

A wireless communication device, a wireless communication method, and a program capable of contributing to improvement of wireless communication technology related to IDMA. The wireless communication device includes: a wireless communication unit that performs wireless communication using interleave division multiple access (IDMA) with another wireless communication device; and a controller that controls an interleave length in an interleave process for IDMA by the wireless communication unit.

18 Claims, 40 Drawing Sheets

(51) Int. Cl.
*H04L 5/00* (2006.01)
*H04J 11/00* (2006.01)
*H03M 13/27* (2006.01)
*H03M 13/37* (2006.01)
*H03M 13/00* (2006.01)
*H04L 1/00* (2006.01)
*H03M 13/09* (2006.01)
*H03M 13/11* (2006.01)
*H03M 13/23* (2006.01)
*H03M 13/29* (2006.01)
*H03M 13/41* (2006.01)
*H03M 13/17* (2006.01)

(52) U.S. Cl.
CPC ........ *H03M 13/6306* (2013.01); *H04J 11/00* (2013.01); *H04J 11/005* (2013.01); *H04L 1/005* (2013.01); *H04L 1/0041* (2013.01); *H04L 1/0071* (2013.01); *H04L 1/1812* (2013.01); *H04L 1/1819* (2013.01); *H04L 5/0007* (2013.01); *H03M 13/09* (2013.01); *H03M 13/1102* (2013.01); *H03M 13/1111* (2013.01); *H03M 13/17* (2013.01); *H03M 13/23* (2013.01); *H03M 13/2957* (2013.01); *H03M 13/41* (2013.01); *H03M 13/6362* (2013.01); *H04L 1/0061* (2013.01); *H04L 1/0067* (2013.01); *H04L 5/0023* (2013.01); *H04L 5/0032* (2013.01); *H04L 5/0073* (2013.01)

(58) Field of Classification Search
USPC ........................................... 370/335
See application file for complete search history.

(56) References Cited

U.S. PATENT DOCUMENTS

| | | | |
|---|---|---|---|
| 9,461,765 | B2 | 10/2016 | Eroz et al. |
| 2006/0039271 | A1 | 2/2006 | Li et al. |
| 2009/0060094 | A1 | 3/2009 | Jung et al. |
| 2009/0132872 | A1 | 5/2009 | Leung et al. |
| 2012/0051335 | A1 | 3/2012 | Kimura et al. |
| 2015/0172007 | A1 | 6/2015 | Oketani |
| 2015/0381318 | A1 | 12/2015 | Zhang et al. |
| 2016/0127085 | A1 | 5/2016 | Kim et al. |
| 2018/0054270 | A1 | 2/2018 | Xiong et al. |

FOREIGN PATENT DOCUMENTS

| | | |
|---|---|---|
| JP | 2004-194288 A | 7/2004 |
| JP | 2006-94048 A | 4/2006 |
| JP | 2007-135201 A | 5/2007 |
| JP | 2007-151093 A | 6/2007 |
| JP | 2009-55228 A | 3/2009 |
| JP | 2010-263490 A | 11/2010 |
| JP | 2013-179417 A | 9/2013 |
| JP | 2014-99836 A | 5/2014 |
| WO | 2014/020798 A1 | 2/2014 |
| WO | 2014/045899 A1 | 3/2014 |

OTHER PUBLICATIONS

Written Opinion and Search Report dated Apr. 23, 2018 in corresponding Singaporean Patent Application No. 11201702097T, 8 pages.
Combined Chinese Office Action and Search Report dated May 23, 2018 in corresponding Patent Application No. 201580050167.1 (with English Translation), 21 pages.
Li Ping et al., "The OFDM-IDMA Approach to Wireless Communication Systems", IEEE Wireless Communications, vol. 14, No. 3, XP011189162, Jun. 1, 2007, pp. 18-24.
Muhammad Majid Butt, "Provision of Guaranteed QoS with Hybrid Automatic Repeat Request in Interleave Division Multiple Access Systems", Proc., IEEE International Conference on Communication Systems, ICCS 2006, Singapore, XP031042229, Oct. 1, 2006, pp. 1-5.
"3rd Generation Partnership Project; Technical Specification Group Radio Access Network; Physical layer aspects for AV evolved Universal Terrestrial Radio Access (UTRA), (Release 7)", 3GPP TR 25.814 V7.1 .0 (Sep. 2009), Technical Report, XP50909969 Oct. 2, 2006, 132 pages.
Qian Huang et al., "A QoS Architecture for IDMA-based Multi-service Wireless Networks", IEEE International Conference on Communications, Aug. 13, 2007, pp. 5070-5075.
Peter Adam Hoeher et al., "Multi-Layer Interleave-Division Multiple Access for 3GPP Long Term Evolution", IEEE International Conference on Communications, Aug. 13, 2007, 7 pages (with Cover page).
Katsutoshi Kusume et al., "IDMA vs. CDMA: Detectors, Performance and Complexity", IEEE Global Telecommunications Conference, 2009, GLOBECOM 2009, Mar. 4, 2010, 8 pages.
International Search Report dated Sep. 29, 2015, in PCT/JP2015/069945, filed on Jul. 10, 2015.
Chen, et al., "An Interleave-Division Multiplexing (IDM) based modulation for 3GPP LTE Downlink", Communications and Networking in China, 2008, pp. 1-4.
Lou et al., "IDMA-based cooperative partial packet recovery: principles and applications", EURASIP Journal on Wireless Communications and Networking, 2012, pp. 1-14.
Ritt et al., "Text Proposal on IDMA for Inter-cell interference mitigation", in TR 25.814, 3GPP TSG RAN WG1#42, R1-050783, London, UK, Aug. 29-Sep. 2, 2005, 17 pages.
Chinese Notification of Reasons for Rejection dated Mar. 5, 2019 in Chinese Application No. 2016-550000.
Chinese Notification of the Second Office Action dated Jan. 11, 2019 in Chinese Application No. 201580050167.1.
Chinese Office Action dated Jun. 17, 2019 in Chinese Application No. 201580050167.1.

FIG. 10

WIRELESS COMMUNICATION DEVICE, WIRELESS COMMUNICATION METHOD, AND PROGRAM

CROSS-REFERENCE TO RELATED APPLICATIONS

This application is a continuation of U.S. patent application Ser. No. 15/327,613, filed on Jan. 19, 2017, which is a National Stage Entry of International Patent Application No. PCT/JP2015/069945, filed on Jul. 10, 2015, and claims priority to Japanese Patent Application 2014-195261, filed in the Japanese Patent Office on Sep. 25, 2014, the entire contents of which is hereby incorporated herein by reference in its entirety.

TECHNICAL FIELD

The present disclosure relates to a wireless communication device, a wireless communication method, and a program.

BACKGROUND ART

Recent wireless communication environment shave faced an abrupt data traffic increase problem. Accordingly, interleave division multiple access (IDMA) has drawn attention as one of radio access technologies (RAT) of fifth generation mobile communication systems (5G). For example, a technology for reducing inter-cell interference or intra-cell interference according to the principle of IDMA is being developed as a technology related to IDMA.

For example, Patent Literature 1 below discloses a technology through which a user in a cell cancels inter-cell interference by applying different interleave patterns while maintaining orthogonality using time division multiple access (TDMA), frequency division multiple access (FDMA) or the like and performs multi-user detection (MUD).

Furthermore, Patent Literature 2 below discloses a technology for applying different interleaves to a plurality of signals multiplexed to the same spatial stream in multi-input multi-output (MIMO) and multi-antenna spatial multiplexing.

CITATION LIST

Patent Literature

Patent Literature 1: JP 2004-194288A
Patent Literature 2: JP 2009-55228A

DISCLOSURE OF INVENTION

Technical Problem

However, technical fields related to IDMA require further performance improvement. Accordingly, the present disclosure proposes a novel and improved wireless communication device, wireless communication method and program capable of contributing to improvement of wireless communication technology related to IDMA.

Solution to Problem

According to the present disclosure, there is provided a wireless communication device including: a wireless communication unit that performs wireless communication using interleave division multiple access (IDMA) with another wireless communication device; and a controller that controls an interleave length in an interleave process for IDMA by the wireless communication unit.

According to the present disclosure, there is provided a wireless communication device including: a wireless communication unit that performs wireless communication using IDMA with another wireless communication device; and a controller that controls the wireless communication unit to perform a deinterleave process depending on an interleave length used for an interleave process for IDMA by the other wireless communication device.

According to the present disclosure, there is provided a wireless communication method including: performing wireless communication using IDMA with another wireless communication device; and controlling an interleave length in an interleave process for IDMA through a processor.

According to the present disclosure, there is provided a wireless communication method including: performing wireless communication using IDMA with another wireless communication device; and controlling a deinterleave process depending on an interleave length used for an interleave process for IDMA by the other wireless communication device to be performed through a processor.

According to the present disclosure, there is provided a program for causing a computer to function as: a wireless communication unit that performs wireless communication using IDMA with another wireless communication device; and a controller that controls an interleave length in an interleave process for IDMA by the wireless communication unit.

According to the present disclosure, there is provided a program for causing a computer to function as: a wireless communication unit that performs wireless communication using IDMA with another wireless communication device; and a controller that controls the wireless communication unit to perform a deinterleave process depending on an interleave length used for an interleave process for IDMA by the other wireless communication device.

Advantageous Effects of Invention

According to the present disclosure described above, it is possible to contribute to improvement of wireless communication technology related to IDMA. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 10 is a block diagram illustrating an example of a logical configuration of a wireless communication unit of the transmitting station according to the present embodiment.

MODE(S) FOR CARRYING OUT THE INVENTION

Figure 1:
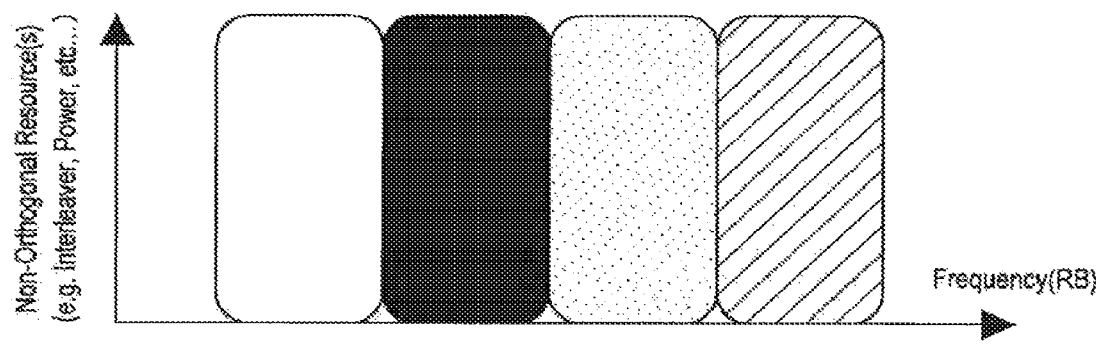
FIG. 1 is an explanatory diagram of a technology related to IDMA

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Also, in this specification and the appended drawings, elements having substantially the same function and structure may in some cases be distinguished by different letters appended to the same sign. For example, multiple elements having substantially the same function and structure are distinguished as transmitting stations 100A, 100B, and 100C, as appropriate. On the other hand, when not particularly distinguishing each of multiple elements having substantially the same function and structure, only the same sign will be given. For example, the transmitting stations 100A, 100B, and 100C will be simply designated as the transmitting station 100 when not being particularly distinguished.

A description will be given in the following order.

1. Introduction
   1-1. IDMA
   1-2. Wireless communication system
2. Examples of configurations
   2-1. Example of configuration of transmitting station
   2-2. Example of configuration of receiving station
   2-3 Example of configuration of communication control device
3. Example of operation process
4. Details of functions
   4-1. Processing of physical layer in transmitting station
   4-2. Interleave setting
   4-3. Interleave setting related to retransmission
   4-4. Combination with other multiplexing methods or other multiple access methods
   4-5. Processing of physical layer in receiving station
   4-6. Deinterleave setting
   4-7. Control information
5. Application examples
6. Conclusion <Introduction>
[1-1. IDMA]

First, a technology related to IDMA will now be described with reference to FIGS. 1 to 4. FIGS. 1 to 4 are explanatory diagrams of the technology related to IDMA.

Non-orthogonal multiple access has drawn attention as a 5G radio access technology following Long Term Evolution (LTE)/LTE-Advanced (LTE-A).

In orthogonal frequency division multiple access (OFDMA) or single-carrier FDMA (SC-FDMA) employed in LTE, radio resources are allocated such that they do not overlap between user equipments in a cell. Radio resources are frequency or time resources for wireless communication and there are various types of radio resources, such as a resource block, a subframe, a resource element and the like. Such radio access technology for allocating radio resources without overlap is also called orthogonal multiple access.

FIG. 1 illustrates an example of radio resource allocation in orthogonal multiple access. In FIG. 1, the horizontal axis indicates frequency, and radio resources allocated to users are represented in different colors for the respective users. As illustrated in FIG. 1, different resource blocks (RBs) in the frequency direction may be allocated to users, for example, in orthogonal multiple access.

On the other hand, in non-orthogonal multiple access, radio resources are allocated in such a manner that at least part of the radio resources overlap between user equipments in a cell. When non-orthogonal multiple access is employed, signals transmitted and received by user equipments in a cell may interfere with each other in a radio space. However, a receiving side may acquire information of each user through a predetermined decoding process. In addition, it is theoretically known that non-orthogonal multiple access can achieve higher communication capacity (or cell communication capacity) than orthogonal multiple access when appropriate radio resource allocation is realized.

Figure 2:
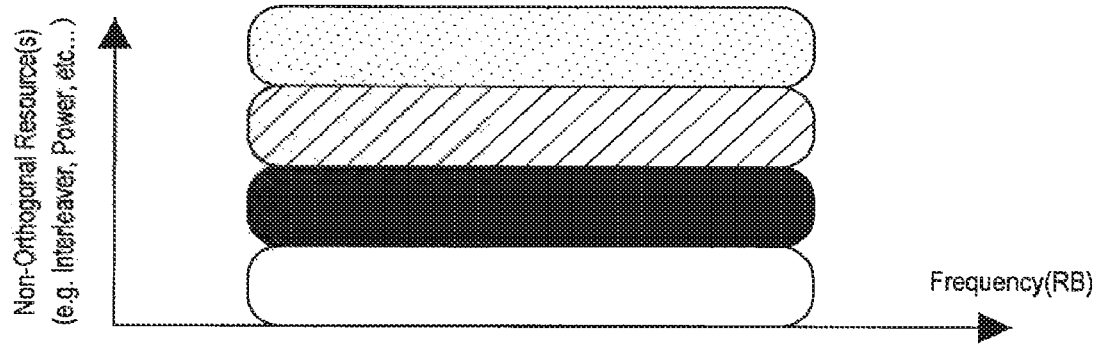
FIG. 2 is an explanatory diagram of a technology related to IDMA

FIG. 2 illustrates an example of radio resource allocation in non-orthogonal multiple access. In FIG. 2, the horizontal axis indicates frequency, and radio resources allocated to users are represented in different colors for the respective users. As illustrated in FIG. 2, resource blocks (RBs) overlapping in the frequency direction may be allocated to users, for example, in non-orthogonal multiple access.

IDMA is one example of radio access technologies classified as non-orthogonal multiple access. In IDMA, an interleave pattern used for a device at a transmitting side to interleave a transmission signal in order to identify a user signal is differently allocated to each user. Then, a device at a receiving side separately decodes user signals using deinterleave patterns corresponding to interleave patterns allocated to respective users. IDMA has the advantage of a low signal processing load on a device at a transmitting side. This advantage is regarded as important, particularly in uplink (UL) from a user equipment to an eNB.

Figure 3:
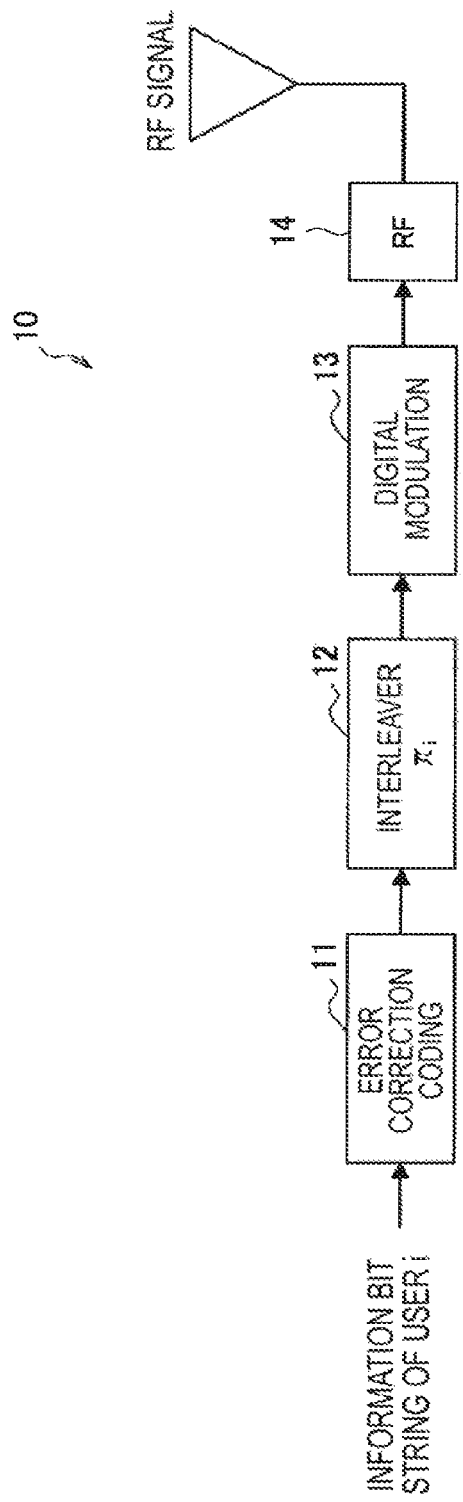
FIG. 3 is an explanatory diagram of a technology related to IDMA

FIG. 3 illustrates an example of a basic configuration of a transmitting station 10 performing wireless communication using IDMA. As illustrated in FIG. 3, the transmitting station 10 includes an error correction coding circuit 11, an interleaver ($\pi i$) 12, a digital modulation circuit 13 and a radio frequency (RF) circuit 14. The error correction coding circuit 11 error-optimal-codes an information bit string of a user i. The interleaver ($\pi i$) 12 is an interleaver for which interleave setting for the user i has been performed and interleaves the error-correction-coded information bit string. The digital modulation circuit 13 digitally modulates the interleaved information bit string. The RF circuit 14 performs various signal processes on the digitally modulated signal and transmits a wireless signal via an antenna. Interleave setting is setting related to at least one of an interleave pattern or an interleave length (interleave size).

Figure 4:
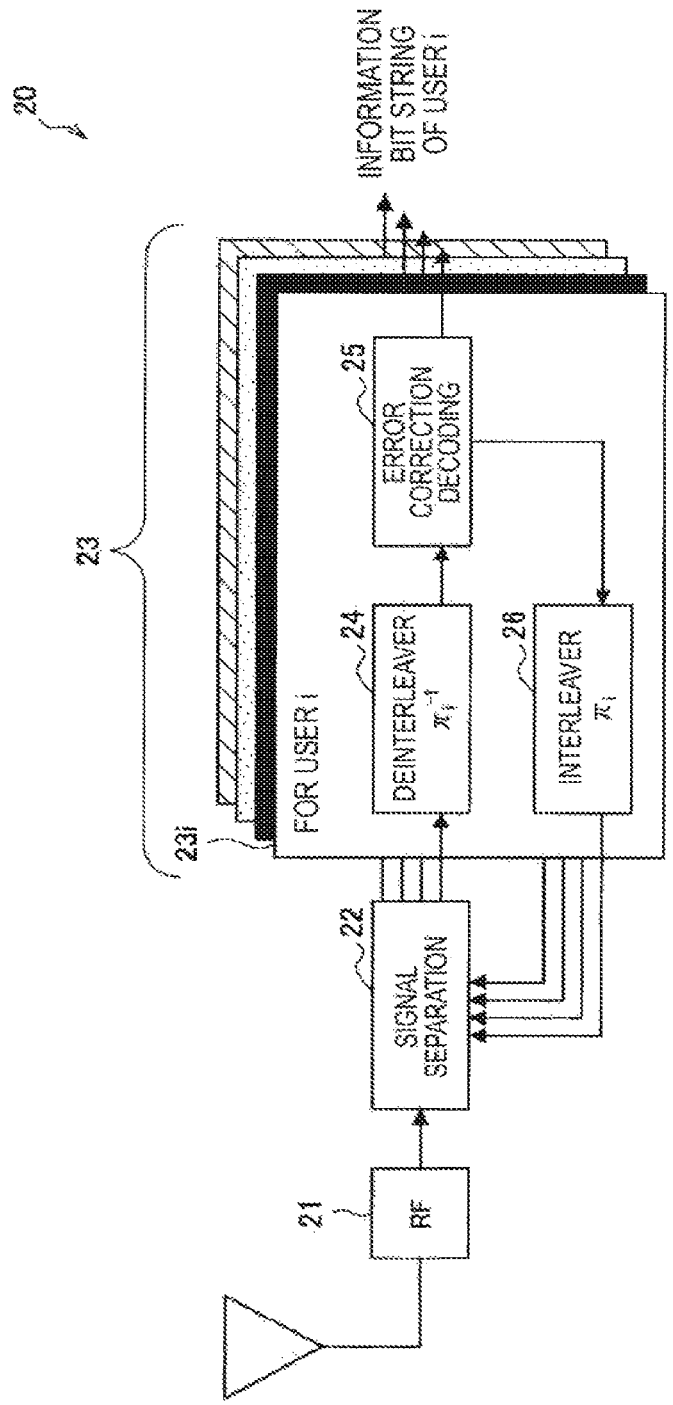
FIG. 4 is an explanatory diagram of a technology related to IDMA

FIG. 4 illustrates an example of a basic configuration of a receiving station 20 performing wireless communication using IDMA. As illustrated in FIG. 4, the receiving station 20 includes an RF circuit 21, a signal separation circuit 22 and decoding circuits 23. The RF circuit 21 performs various signal processes on a wireless signal received through an antenna and outputs the signal to the signal separation circuit 22. The signal separation circuit 22 has a function of separating a composite signal obtained by synthesizing signals from users into signals for the respective users and outputs the separated user signals to corresponding decoding circuits 23. For example, the decoding circuit 23i includes a deinterleaver ($\pi_i^{-1}$) 24 for which deinterleave setting for the user i has been performed, an error correction decoding circuit 25 and an interleaver ($\pi_i$) 26 for which interleave setting for the user i has been performed. The decoding circuit 23i receives a user signal from the user i and performs a deinterleave process through the deinterleaver ($\pi_i^{-1}$) 24 and decoding through the error correction decoding circuit 25. The decoding circuit 23i outputs the user signal as an information bit string of the user i when the user signal has been correctly decoded. In addition, the decoding circuit 23i interleaves the decoded signal through the interleaver ($\pi_i$) 26 and returns the signal to the signal separation circuit 22 as a user signal for the user i. Such user signal return is performed for all user signals. The signal separation circuit 22 re-separates the returned user signals and re-outputs the separated user signals to the decoding circuits 23. The receiving station 20 decodes the user signals by repeating the signal processes in the signal separation circuit 22 and the decoding circuits 23.

[1-2. Wireless Communication System]

(1-2-1. Overall Configuration)

Figure 5:
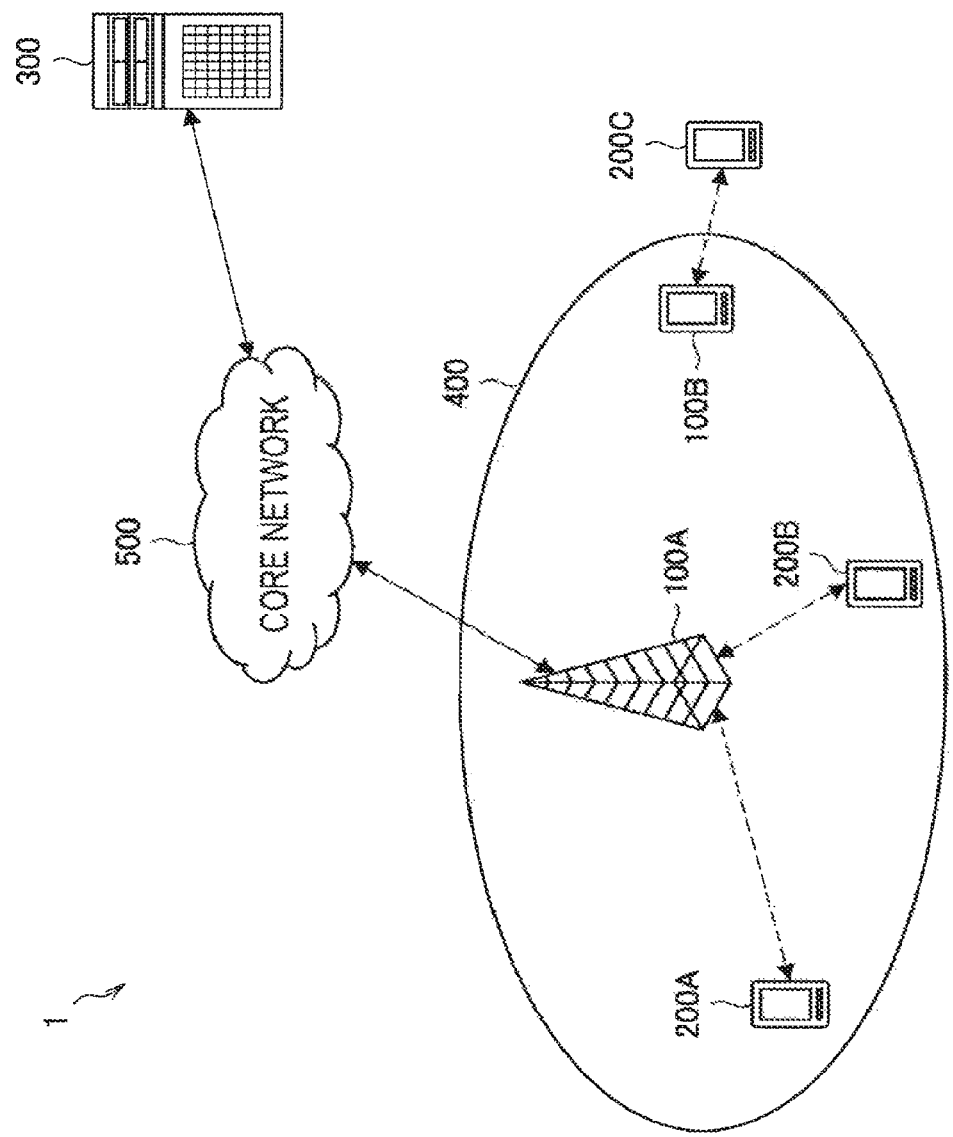
FIG. 5 is an explanatory diagram of an overview of a wireless communication system according to an embodiment of the present disclosure.

FIG. 5 is an explanatory diagram of an overview of a wireless communication system according to an embodiment of the present disclosure. As illustrated in FIG. 5, the wireless communication system 1 according to the present embodiment includes a transmitting station 10), a receiving station 200), a communication control device 300 and a core network 500.

The transmitting station 100 is a device that transmits data to the receiving station 200. For example, the transmitting station 100 is an evolutional Node B (eNB) or an access point in a cellular system. In addition, the receiving station 200 is a wireless communication device that receives data transmitted from the transmitting station 100. For example, the receiving station 200 is a user equipment (UE) in the cellular system.

In the example illustrated in FIG. 5, a transmitting station 100A is an eNB that provides wireless communication services to one or more terminal devices located inside of a cell 400. In addition, receiving stations 200A and 200B are UEs provided with the wireless communication services by the eNB. For example, the eNB 100A may transmit data to the UEs 200A and 200B. The eNB 100A is connected to the core network 500. The core network 500 is connected to a packet data network (PDN) via a gateway device. The cell 400 may be operated according to any wireless communication system such as Long Term Evolution (LTE), LTE-Advanced (LTE-A), GSM (registered trademark), UMTS, W-CDMA, CDMA 2000, WiMAX, WiMAX 2 or IEEE 802.16.

Here, one device may function as the transmitting station 100 or the receiving station 200. In addition, one device may function as both the transmitting station 100 and the receiving station 200. For example, a UE may serve as the receiving station 200 that receives data from an eNB through downlink and also serve as the transmitting station 100 that transmits data to the eNB through uplink. 1G In addition, an eNB may serve as the receiving station 200 that receives data from a UE through uplink and also serve as the transmitting station 100 that transmits data to the UE through downlink Furthermore, UEs may perform wireless communication with each other. In the example illustrated in FIG. 5, a UE 100B directly performs wireless communication with a UE 200C. Such a communication system is also called device-to-device (D2D) communication. D2D communication may be recognized as communication other than communication between an eNB and a UE in a cellular system. In addition, communication in a wireless communication system having no centralized control node which is as powerful as an eNB in a cellular system may be included in D2D communication in a broad sense. For example, a wireless local area network (WLAN) system may be an example of such a wireless communication system.

The communication control device 300 is a device that cooperatively controls wireless communication in the wireless communication system 1. In the example illustrated in FIG. 5, the communication control device 300 is a server. For example, the communication control device 300 controls wireless communication in the transmitting station 100 and the receiving station 200. In addition to the example illustrated in FIG. 5, the communication control device may be realized, for example, as any device (physical device or logical device) inside or outside of the transmitting station 100, the receiving station 200 or the core network 500.

Operations related to wireless communication in the wireless communication system 1 according to the present embodiment will be described.

(1-2-2. Downlink Case)

First, a process when wireless communication is performed from an eNB to a UE will be described.

In a normal cellular system, an eNB manages/controls radio resources in a centralized manner in downlink and uplink wireless communication in many cases. In the case of downlink, first of all, the eNB announces, to a UE, radio resources to which a downlink data channel (e.g., PDSCH) to be received has been allocated. For such announcement, a control channel (e.g., PDCCH) is generally used. Then, the eNB transmits data to each UE using downlink radio resources allocated to each UE.

The UE attempts to receive and decode a transmitted signal using the radio resource of the downlink data channel announced by the eNB. The UE transmits an ACK signal to the eNB when the UE has successfully decoded the signal and transmits a NACK signal to the eNB when the UE has failed to decode the signal Success or failure of decoding may be determined by a result of a cyclic redundancy check (CRC) check added to the transmitted data, or the like, for example.

The eNB determines that data transmission has failed when the NACK signal is received from the UE or no return signal is received. Then, the eNB performs a retransmission process for retransmitting the data of which transmission has failed. In the retransmission process, announcement of radio resources to which a downlink data channel has been allocated from the eNB to the UE and data transmission using the announced radio resources are performed as in the process described above. The eNB repeats the retransmission process until an ACK signal is received from the UE or a predetermined maximum number of retransmissions is reached.

(1-2-3. Uplink Case)

Next, a process when wireless communication is performed from a UE to an eNB will be described.

Differently from the downlink, an eNB performs announcement of radio resources and a UE performs data transmission in the uplink case, whereas an eNB performs both announcement of radio resources and transmission of data in the downlink case. Specifically, the eNB announces, to the UE, radio resources to which an uplink data channel (e.g., PUSCH) to be used for transmission has been allocated. A control channel (e.g., PDCCH) is generally used for the announcement. Then, the UE transmits data to the eNB using the announced uplink data channel.

The retransmission process is similar to the downlink case. For example, the UE determines that data transmission has failed and performs retransmission when a NACK signal is received from the eNB or no return signal is received. Here, the eNB may perform announcement of radio resources to be used for the UE for retransmission simultaneously with transmission of the NACK signal because the eNB controls and manages radio resources of uplink data channels.

(1-2-4. D2D Communication Case)

Lastly, a process in D2D communication in which wireless communication is performed between UEs will be described.

A UE at a transmitting side may transmit data without announcing radio resources used for transmission. The UE at the transmitting side may recognize radio resources to be used for transmission, for example, through announcement from an external device or by performing carrier sensing, spectrum sensing or the like. The retransmission process is the same as the downlink case and the uplink case described above.

<2. Examples of Configurations>

Examples of basic configurations of the transmitting station 100, the receiving station 20 and the communication control device 300 according to the present embodiment will be described with reference to FIGS. 6 to 8.

[2-1. Example of Configuration of Transmitting Station]

Figure 6:
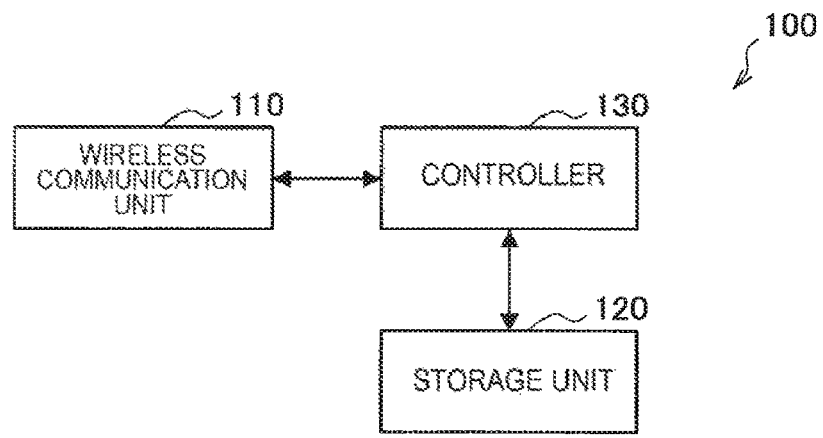
FIG. 6 is a block diagram illustrating an example of a logical configuration of a transmitting station according to the present embodiment.

FIG. 6 is a block diagram illustrating an example of a logical configuration of the transmitting station 100 according to the present embodiment. As illustrated in FIG. 6, the transmitting station 100 includes a wireless communication unit 110, a storage unit 120 and a controller 130.

(1) Wireless Communication Unit 110

The wireless communication unit 110 performs transmission-reception of data to/from other wireless communication devices. The wireless communication unit 110 according to the present embodiment has a function of performing wireless communication with other wireless communication devices using IDMA. For example, the wireless communication unit 110 interleaves transmission target data using interleave setting allocated to the transmitting station 100 and transmits the interleaved transmission target data to the receiving station 200. The wireless communication unit 110 may perform transmission/reception of control information to/from the receiving station 100 or the communication control device 300. The detailed functional configuration of the wireless communication unit 110 will be described below.

(2) Storage Unit 120

The storage unit 120 has a function of storing various types of information. For example, the storage unit 120 stores information announced by the communication control device 300.

(3) Controller 130

The controller 130 serves as an operation processing device and a control device and controls the overall operation in the transmitting station 100 according to various programs. For example, the controller 130 has a function of controlling interleave setting in an interleave process for IDMA through the wireless communication unit 110. Specifically, the controller 130 controls at least one of an interleave pattern and an interleave length used by an interleaver. The controller 130 may facilitate signal separation at the receiving station 200 by varying at least the interleave length. The detailed functional configuration of the controller 130 will be described below. Hereinafter, the interleave process for IDMA is simply called an interleave process or interleave.

[2-2. Example of Configuration of Receiving Station]

Figure 7:
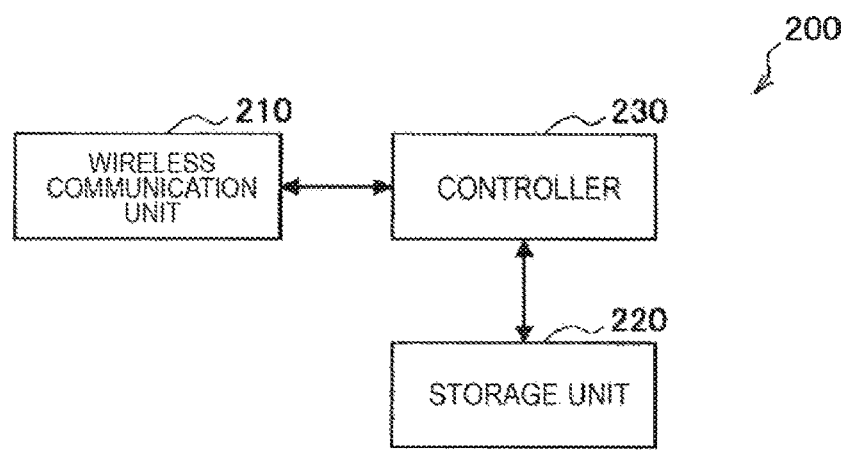
FIG. 7 is a block diagram illustrating an example of a logical configuration of a receiving station according to the present embodiment.

FIG. 7 is a block diagram illustrating an example of a logical configuration of the receiving station 200 according to the present embodiment. As illustrated in FIG. 7, the receiving station 200 includes a wireless communication unit 210, a storage unit 220 and a controller 230.

(1) Wireless Communication Unit 210

The wireless communication unit 210 performs transmission/reception of data to/from other wireless communication devices. The wireless communication unit 210 according to the present embodiment has a function of performing wireless communication with other wireless communication devices using IDMA. For example, the wireless communication unit 210 performs a deinterleave process corresponding to interleave setting allocated to the transmitting station 100 that is a transmission source on a wireless signal received from the transmitting station 100 to obtain data. The wireless communication unit 210 may perform transmission/reception of control information to/from the transmitting station 100 or the communication control device 300. The detailed functional configuration of the wireless communication unit 210 will be described below.

(2) Storage Unit 220

The storage unit 220 has a function of storing various types of information. For example, the storage unit 220 stores information announced by the communication control device 300.

(3) Controller 230

The controller 230 serves as an operation processing device and a control device and controls the overall operation in the receiving station 200 according to various programs. For example, the controller 230 has a function of controlling the wireless communication unit 210 to perform a deinterleave process depending on interleave setting used for an interleave process for IDMA by another wireless communication device. Specifically, the controller 230 controls deinterleave setting in response to at least one of an interleave pattern and an interleave length used for the interleave process by the transmitting station 100 that is a wireless signal transmission source. Further, deinterleave setting is setting related to at least one of a deinterleave length and a deinterleave pattern, for example. The detailed functional configuration of the controller 230 will be described below.

[2-3. Example of Configuration of Communication Control Device]

Figure 8:
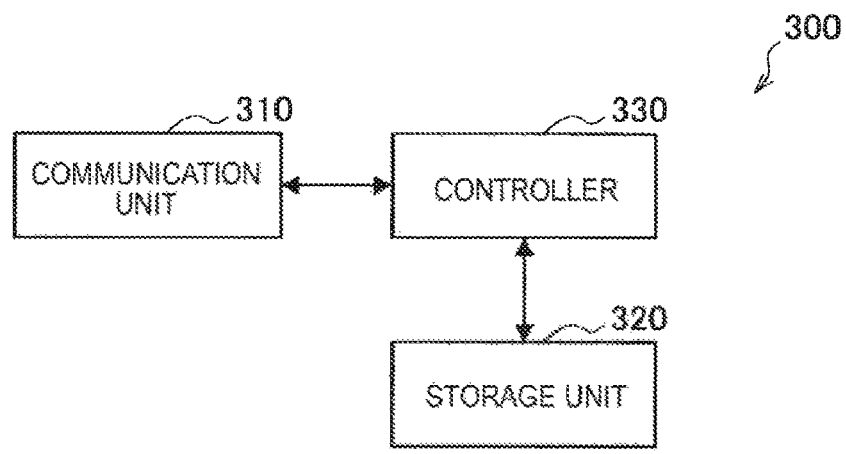
FIG. 8 is a sequence diagram illustrating an example of the flow of an allocation process executed in the communication system according to the embodiment.

FIG. 8 is a block diagram illustrating an example of a logical configuration of the communication control device 300 according to the present embodiment. As illustrated in FIG. 8, the communication control device 300 includes a communication unit 310, a storage unit 320 and a controller 330.

(1) Communication Unit 310

The communication unit 310 is a communication interface for relaying communication of the communication control device 300 with other devices. The communication unit 310 performs transmission/reception of data to/from other devices in a wireless or wired manner. For example, the communication unit 310 performs communication with the transmitting station 100 or the receiving station 200 directly or indirectly through any communication node.

Meanwhile, the communication control device 300 may be the same as or independent from the transmitting station 100 or the receiving station 200. Here, the sameness/independence includes sameness/independence in a logical sense in addition to sameness/independence in a physical sense. The communication unit 310 performs transmission and reception through a wired or wireless communication circuit for an independent device and performs transmission and reception inside of the device for the same device.

(2) Storage Unit 320

The storage unit 320 has a function of storing various types of information. For example, the storage unit 320 stores interleave setting allocated to each transmitting station 100.

(3) Controller 330

The controller 330 serves as an operation processing device and a control device and controls the overall operation in the communication control device 300 according to various programs. For example, the controller 330 allocates interleave setting to each transmitting station 100 such that interleave settings do not overlap between transmitting stations.

The examples of the basic configurations of the transmitting station 100, the receiving station 200 and the communication control device 300 according to the present embodiment have been described. Next, an example of an operation process of the wireless communication system 1 according to the present embodiment will be described with reference to FIG. 9.

<3. Example of Operation Process>

Figure 9:
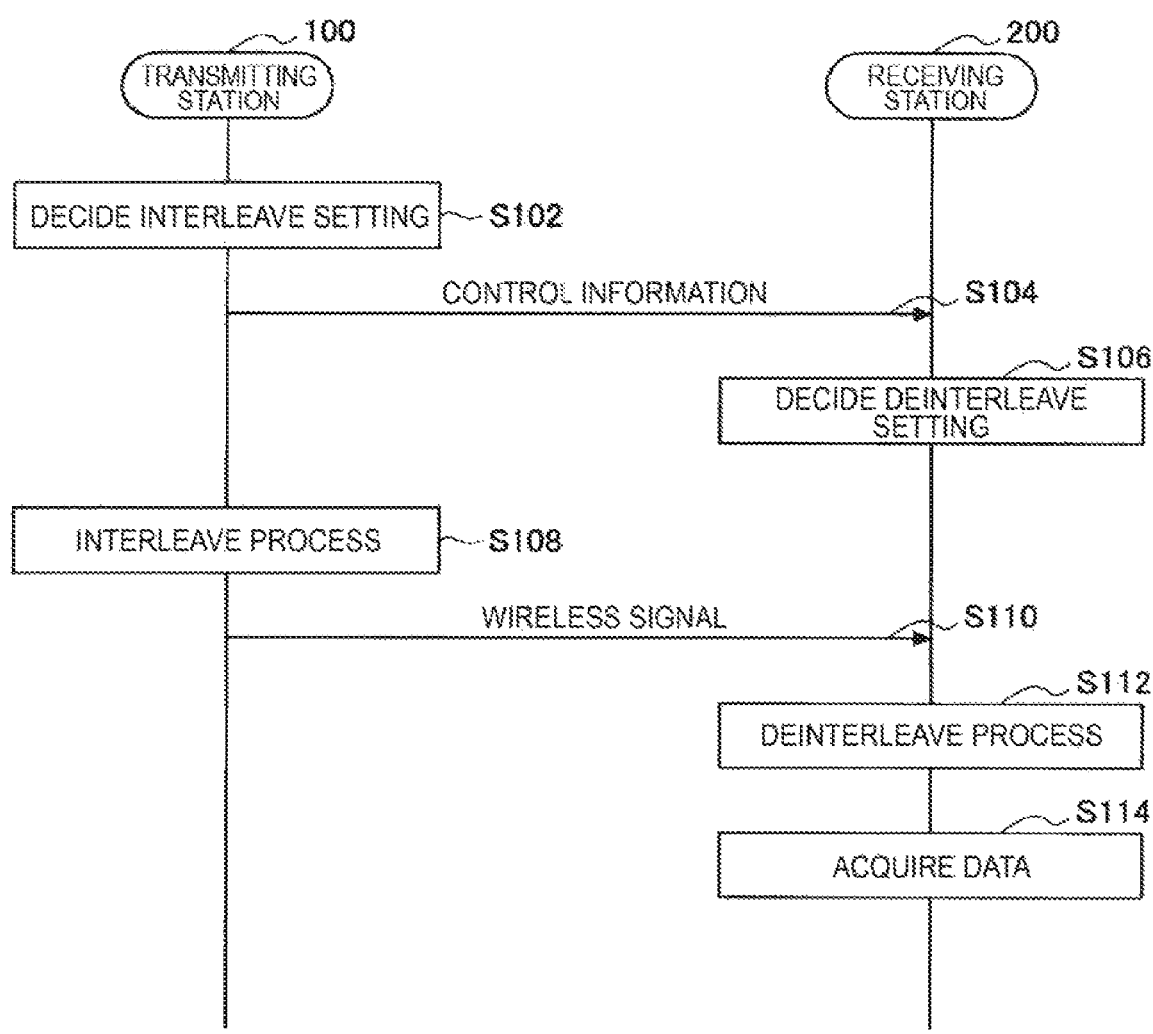
FIG. 9 is a sequence diagram illustrating an example of the flow of a wireless communication process executed in the wireless communication system according to the present embodiment.

FIG. 9 is a sequence diagram illustrating an example of the flow of a wireless communication process executed in the wireless communication system 1 according to the present embodiment. As illustrated in FIG. 9, the transmitting station 100 and the receiving station 200 are involved in the present sequence. In the present sequence, the transmitting station 100 is considered to function as the communication control device 300.

As illustrated in FIG. 9, first of all, the transmitting station 100 decides interleave setting in step S102. For example, the controller 130 decides an interleave length and an interleave pattern. The process in this step will be described in detail below.

Then, the transmitting station 100 transmits control information to the receiving station 200 in step S104. The control information may include information about the interleave setting. The content of the control information will be described in detail below.

Subsequently, the receiving station 200 decides deinterleave setting in step S106. For example, the controller 230 decides a deinterleave length and a deinterleave pattern corresponding to the interleave setting used in the transmitting station 100. The process in this step will be described in detail below. Incidentally, this process may be performed before the control information is transmitted (before step S104) or after a wireless signal corresponding to a decoding target is transmitted from the transmitting station 100 (after step S110).

Then, the transmitting station 100 performs an interleave process in step S108. The controller 130 controls the wireless communication unit 110 to perform the interleave process depending on the interleave setting decided in step S102.

Thereafter, the transmitting station 100 transmits the wireless signal in step S110.

In step S112, the receiving station 200 performs a deinterleave process on the received wireless signal. The controller 230 controls the wireless communication unit 210 to perform the deinterleave process depending on the deinterleave setting decided in step S106.

In step S114, the receiving station 200 acquires data transmitted from the transmitting station 100.

<4. Details of Functions>

[4-1. Processing of Physical Layer in Transmitting Station]

Figure 10:
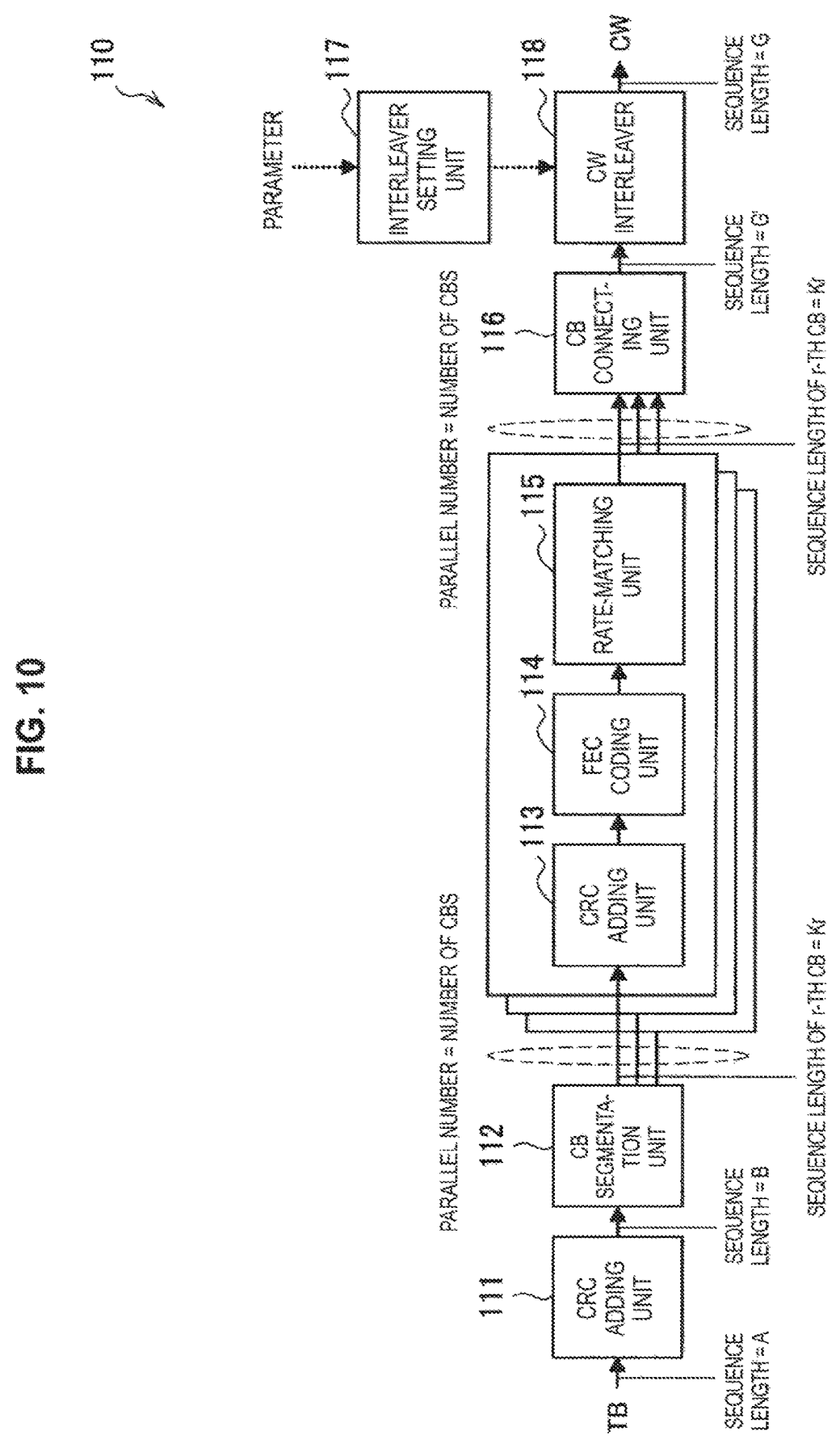

FIG. 10 is a block diagram illustrating an example of a logical configuration of the wireless communication unit 110 of the transmitting station 100 according to the present embodiment. FIG. 10 illustrates an example of a configuration of the part of the wireless communication unit 110 in which an interleave process for a transport block (TB) of a bit sequence corresponding to a transmission target is performed by the transmitting station 100. Although FIG. 10 shows a configuration example in which a turbo code is considered as an example of forward error correction (FEC), other FEC codes such as a convolutional code and a low-density parity-check (LDPC) code may be used in addition to the turbo code. As illustrated in FIG. 10, the wireless communication unit 110 includes a CRC adding unit 111, a CB segmentation unit 112, a CRC adding unit 113, an FEC coding unit 114, a rate-matching unit 115, a CB connecting unit 116, an interleaver setting unit 117 and a CW interleaver 118.

First, the CRC adding unit 111 adds a CRC to the TB. Then, the CB segmentation unit 112 segments the sequence to which CRC bits have been added into one or more error correction code sequence code blocks (CBs) depending on a code length of the turbo code. Processing of the segmented CBs may be performed through as many parallel processes as the number (C) of CBs. As processes for each CB, the CRC adding unit 113 adds a CRC to each CB, the FEC coding unit 114 performs FEC coding (e.g., turbo coding), and the rate-matching unit 115 performs rate matching to adjust a coding rate. Thereafter, the CB connecting unit 116 connects CBs output from the rate-matching unit 115 to generate a single bit sequence. The bit sequence is handled as a codeword (CW). The CW corresponds to the TB after coding. The interleaver setting unit 117 performs interleave setting of the CW interleaver 118 depending on an input parameter. Further, the controller 130 inputs, as a parameter, information acquired from control information announced by an eNB or the like, for example, using a control channel to the interleaver setting unit 117. Then, the CW interleaver 118 executes an interleave process for the CW generated by connecting the CBs.

Next, bit sequence lengths in the above process will be described. The sequence length of the bit sequence of the original TB is considered to be A. The sequence after CRC bit addition by the CRC adding unit 111 is B (>=A). In addition, the sequence length of an r-th CB is Kr in response to the code length of the turbo code. The sequence length of the CW generated by the CB connecting unit 116 is G'. The sequence length of the CW output from the CW interleaver 118 is G. G' and G may be identical. Furthermore. G' may differ from G because padding may be performed before and after the CW interleaver 118.

[4-2. Interleave Setting]

[4-2-1. Interleave Length]

The interleave length controlled by the controller 130 of the transmitting station 100 according to the present embodiment is the sequence length of the CW in FIG. 10, for example. The interleave length may be a sequence length of the sum of sequences output from a plurality of interleavers when the plurality of interleavers are used, instead of the length of a sequence output from a single interleaver (the CW interleaver 118 in the example shown in FIG. 10).

In a general IDMA system, the interleave length G may be determined on the basis of a transmitted bit sequence (TB in the example shown in FIG. 10) and an FEC coding rate. When application of IDMA to a cellular system is considered, it is desirable to determine the interleave length G on the basis of the quantity of radio resources allocated to a user (e.g., the number of subcarriers, the number of resource blocks, the number of spatial layers and the like) and a modulation scheme (e.g., QPSK, 16-QAM, 64-QAM, 256-QAM or the like).

Accordingly, the controller 130 of the transmitting station 100 according to the present embodiment controls the interleave length on the basis of the quantity of radio resources available for transmission by the wireless communication unit 110 and a modulation scheme used therefor. For example, the controller 130 determines the interleave length G such that the interleave length G satisfies the following formula.

[Math. 1]

$$G \leq N_{RE} Q_m \quad \text{Formula 1}$$

Here, $N_{RE}$ is the number of resource elements available for actual data transmission from among radio resources allocated to the user. In addition, $Q_m$ is a bit multiplex number per resource element (which usually depend on a modulation scheme). Meanwhile, when the transmitting station 100 employs transmission diversity, the controller 130 may adjust the number $N_{RE}$ of resource elements in response to the transmission diversity. For example, when the transmitting station 100 employs $N_{TD}$-order transmission diversity, the number $N_{RE}$ of resource elements available for actual data transmission may be controlled to be $1/N_{TD}$ for the number of physical resource elements.

The controller 130 may determine the value G such that the equality sign of Math. 1 is achieved in order to maximize resource utilization efficiency of the entire system.

When the wireless communication system 1 uses a multiplexing technology such as a spreading technology or a spatial multiplexing technology in addition to IDMA, the controller 130 may determine the interleave length G further based on a spreading factor. For example, the controller 130 determines the interleave length G such that the interleave length G satisfies the following formula.

[Math. 2]

$$G \leq \frac{N_M N_{RE} Q_m}{SF} \quad \text{Formula 2}$$

Here, SF is a spreading factor. In addition, $N_M$ is a multiplex number. The controller 130 may reflect the influence with respect to the spreading factor and spatial multiplexing in a method of counting $N_{RE}$.

(Padding Process)

The controller 130 may control the wireless communication unit 110 to perform padding when the length of an input sequence for an interleave process does not reach the interleave length. For example, if the sequence length G' input to the CW interleaver 118 in FIG. 10 does not reach the interleave length G, the controller 130 controls the wireless communication unit 110 to perform padding before or after the interleave process by the CW interleaver 118.

For example, the controller 130 may control the wireless communication unit 110 to perform padding on the input sequence for the interleave process. For example, the CW interleaver 118 adds padding bits corresponding to $N_p = G - G'$ bits to the input bit sequence input thereto before the interleave process is executed when G'<G.

For example, the input bit sequence input to the interleaver is

[Math. 3]

$$b'_{k'}, k'=0, \ldots, G'-1 \quad \text{Formula 3}$$

a target bit sequence corresponding to an object of the interleave process is

[Math. 4]

$$b_k, k=0, \ldots, G-1 \quad \text{Formula 4}$$

and a padding bit sequence is

[Math. 5]

$$p_{k''}, k''=0, \ldots, N_p-1 \quad \text{Formula 5}$$

The padding bit sequence may be all {0}, all {1}, any random number of {0, 1} or a predetermined sequence of {0, 1}. The padding process by the CW interleaver 188 in this case will be described with reference to FIG. 1.

Figure 11:
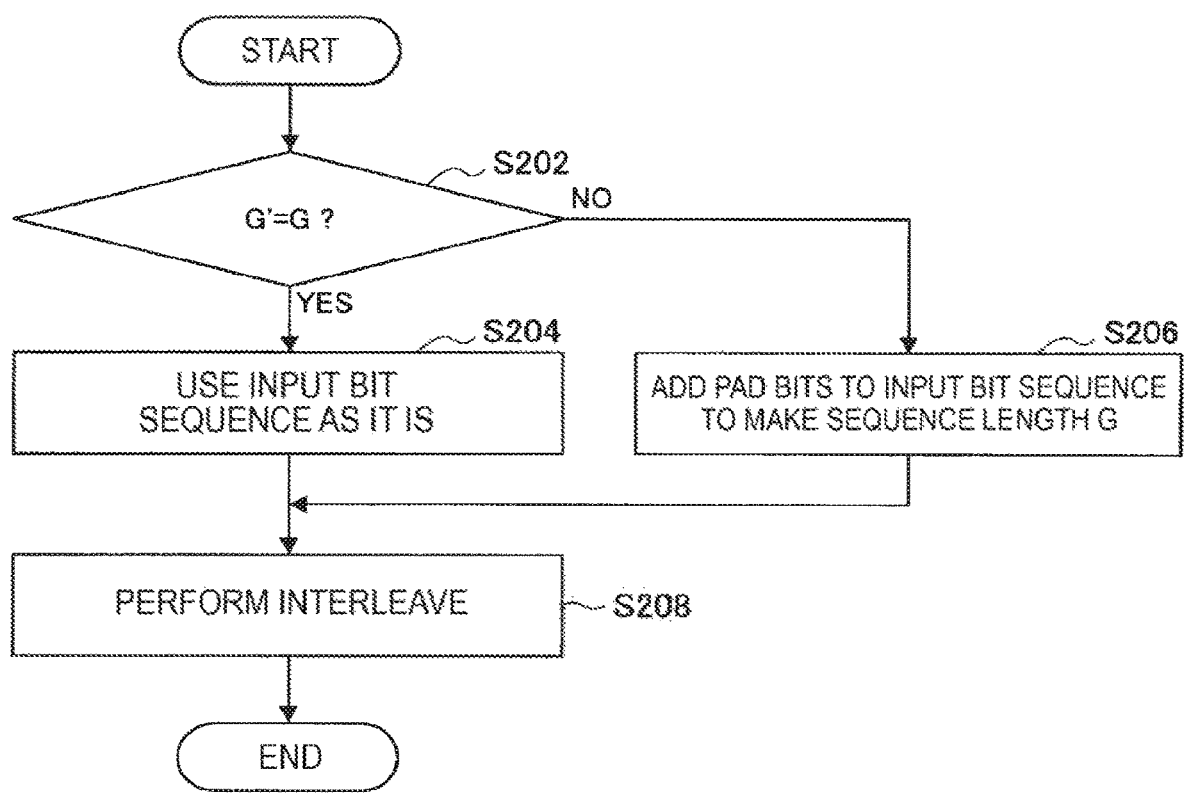
FIG. 11 is a flowchart illustrating an example of the flow of a padding process executed in the transmitting station according to the present embodiment.

FIG. 11 is a flowchart illustrating an example of the flow of the padding process executed in the transmitting station 100 according to the present embodiment. As illustrated in FIG. 11, first of all, the CW interleaver 118 determines whether G'=G in step S202.

When it is determined that G'=G (S202/YES), the CW interleaver 118 uses the input bit sequence as a target bit sequence as it is according to the following formula in step S204.

[Math. 6]

$$b_k = b'_k, k=0, \ldots, G-1 \quad \text{Formula 6}$$

On the other hand, when it is determined that G'<G (S202/NO), the CW interleaver 118 uses a sequence obtained by adding the padding bit sequence to the input bit sequence as a target bit sequence according to the following formula.

[Math. 7]

$$b_k = p_k, k=0, \ldots, N_p-1,$$

$$b_{N_p+k'} = b'_{k'}, k'=0, \ldots, G'-1 \quad \text{Formula 7}$$

Accordingly, the sequence length of the target bit sequence becomes the interleave length G and the sequence length of an output bit sequence output from the CW interleaver 118 becomes G.

Then, the CW interleaver 118 performs an interleave process in step S208.

In addition, the controller 130 may control the wireless communication unit 110 to perform padding on the output sequence of the interleave process. For example, when G'<G, the CW interleaver 118 adds padding bits corresponding to $N_p = G - G'$ bits to the output bit sequence after execution of the interleave process. The padding process by the CW interleaver 118 in this case will be described with reference to FIG. 12.

Figure 12:
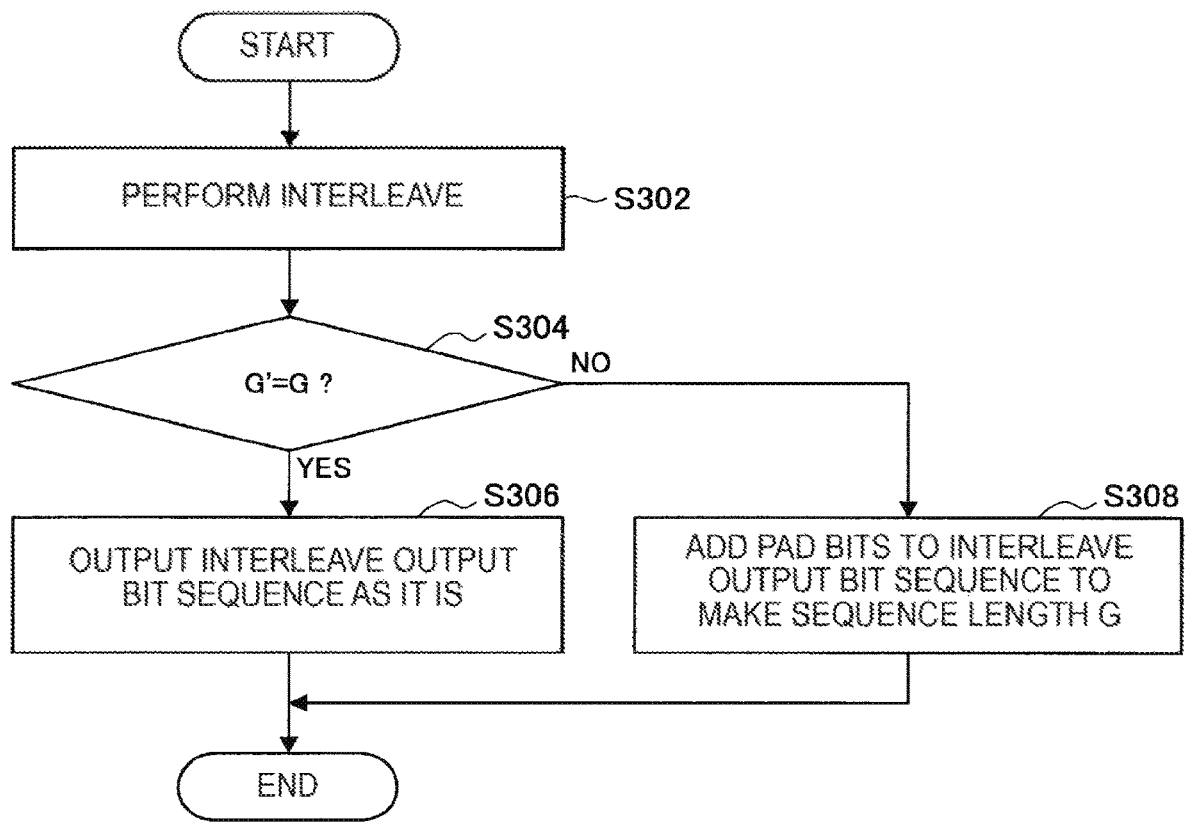
FIG. 12 is a flowchart illustrating an example of the flow of a padding process executed in the transmitting station according to the present embodiment.

FIG. 12 is a flowchart illustrating an example of the flow of the padding process executed in the transmitting station 100 according to the present embodiment. As illustrated in FIG. 12, first of all, the CW interleaver 118 performs an interleave process in step S302.

Then, the CW interleaver 118 determines whether G'=G in step S304.

When it is determined that G'=G (S304/YES), the CW interleaver 118 outputs an output bit sequence as it is in step S306.

On the other hand, when it is determined that G'<G (S304/NO), the CW interleaver 118 outputs a sequence obtained by adding a padding bit sequence to the output bit sequence in step S308. Accordingly, the sequence length of the output bit sequence becomes the interleave length G.

An example of the padding process has been described.

For example, the rate-matching unit 115 may adjust the sequence length of the output bit sequence as another method for making G'=G or G'≤G.

(Interleave Length Decision Process)

For example, the controller 130 decides the interleave length G using the number $N_{RE}$ of resource elements available for actual data transmission and the bit multiplex number $Q_m$ (bit number) per resource element. The procedure of this decision process may be changed depending on the type of the transmitting station 100. An example of the interleave length decision process depending on the type of the transmitting station 100 will be described below.

(A) Transmitting Station to which Radio Resources Used for Transmission are Allocated by Other Devices For example, the transmitting station 100 is a UE in a cellular system. A method of deciding the interleave length G will be described with reference to FIG. 13.

Figure 13:
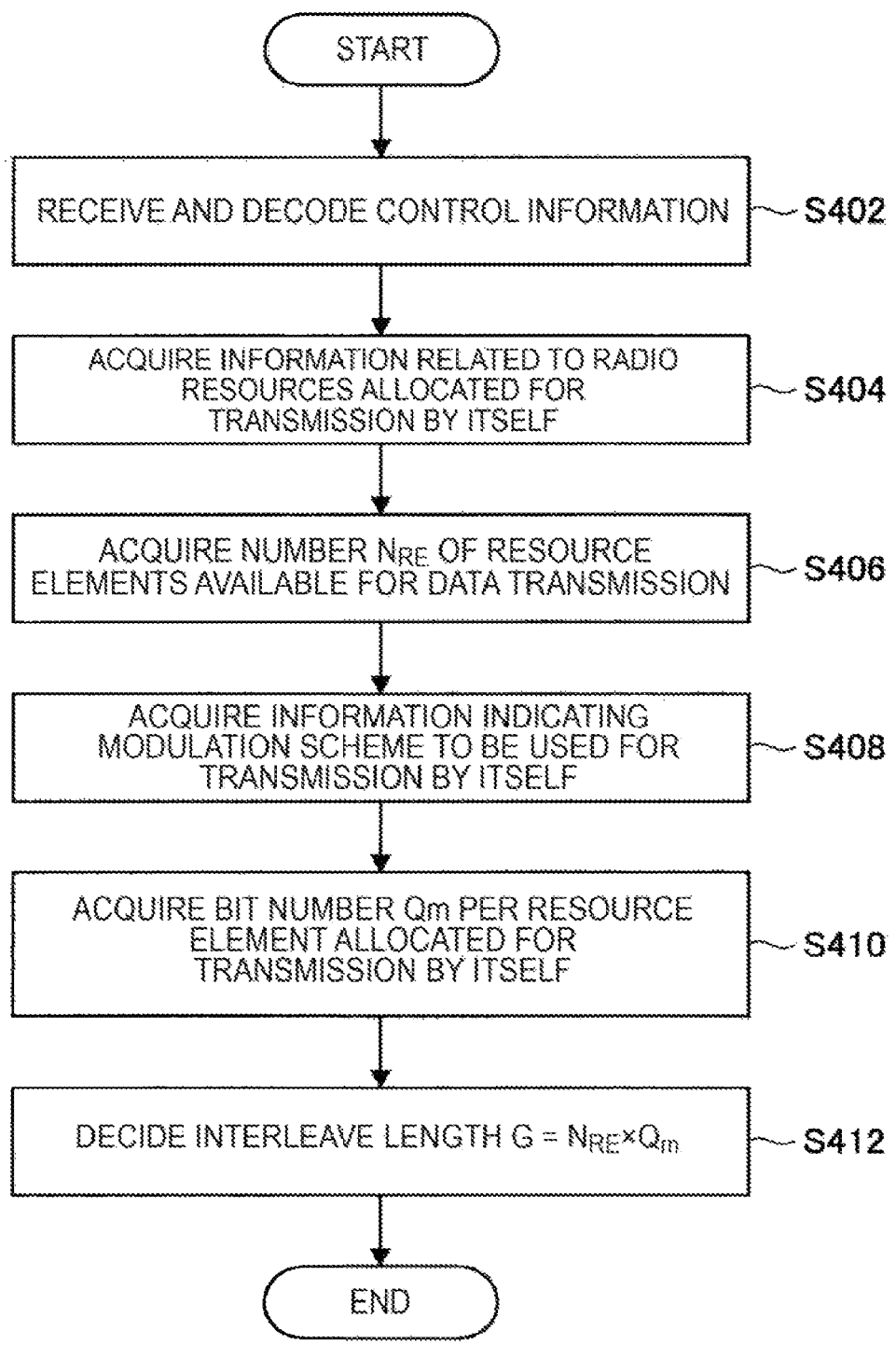
FIG. 13 is a flowchart illustrating an example of the flow of an interleave length decision process executed in the transmitting station according to the present embodiment.

FIG. 13 is a flowchart illustrating an example of the flow of an interleave length decision process executed in the transmitting station 100 according to the present embodiment.

First, the wireless communication unit 110 receives and decodes control information in step S402. For example, the wireless communication unit 110 receives and decodes control information transmitted from an eNB using a control channel. For example, the control information may include information about radio resources and a modulation scheme available for transmission of the transmitting station 100.

Subsequently, the controller 130 acquires information about radio resources allocated for transmission by the transmitting station 100 in step S404. For example, the information about the radio resources is information indicating the number of resource blocks allocated as resources in the frequency direction or information indicating which resource blocks have been allocated.

Thereafter, the controller 130 acquires the number $N_{RE}$ of resource elements available for actual data transmission in step S406. For example, the controller 130 acquires the number obtained by subtracting the number of resource elements that cannot be used for data transmission, such as a reference signal, a synchronization signal and a control signal, from the radio resources allocated to the transmitting station 100. Further, when the number of resources allocated in the frequency direction is previously determined such as a case in which the entire band is allocated to the transmitting station 100, for example, the processes in steps S404 and S406 may be omitted.

Next, the controller 130 acquires, from the control information received in step S402, information indicating a modulation scheme to be used for transmission by the transmitting station 100 in step S408. For example, the information indicating the modulation scheme may be information directly indicating the modulation scheme, such as a channel quality indicator (CQI) in LTE. In addition, the information indicating the modulation scheme may be information indirectly indicating the modulation scheme, such as a modulation and coding set (MCS) in LTE, for example. It is desirable that the information indicating the modulation scheme be specified in the wireless communication system 1 in advance.

Then, the controller 130 acquires a bit number $Q_m$ per resource element, allocated for transmission by the controller 130 in step S410. For example, the controller 130 acquires the bit number $Q_m$ per resource element from the modulation scheme indicated by the information acquired in step S408. When the control information includes information indicating the bit number $Q_m$ per resource element, the controller 130 may acquire the bit number $Q_m$ per resource element from the control information.

In addition, the controller 130 decides the interleave length G in step S412. For example, the controller 130 decides the interleave length G as $G=N_{RE} \times Q_m$.

(B) Transmitting Station Allocating (or Deciding) Radio Resources Used for Transmission by Itself.

For example, the transmitting station 100 is an eNB in a cellular system. In addition, the transmitting station 100 may be a device of the wireless communication system 1, to which no radio resources are allocated, for example. A method of deciding the interleave length G will be described with reference to FIG. 14.

Figure 14:
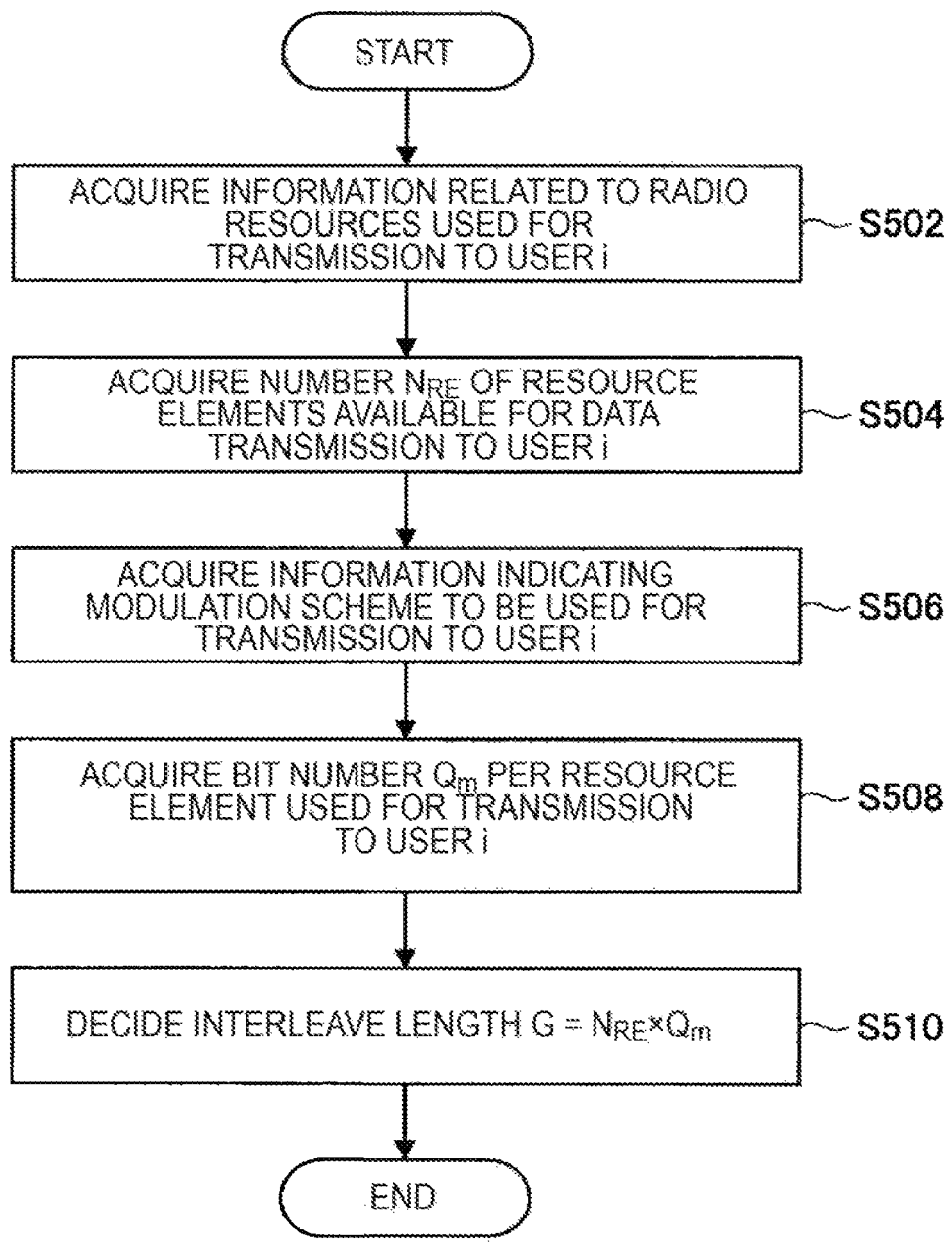
FIG. 14 is a flowchart illustrating an example of the flow of an interleave length decision process executed in the transmitting station according to the present embodiment.

FIG. 14 is a flowchart illustrating an example of the flow of the interleave length decision process executed in the transmitting station 100 according to the present embodiment. A processing example when transmission to a user i is performed on the assumption of one-to-one transmission is described in this flow. In the case of one-to-multiple transmission, there are a plurality of user indices i.

As illustrated in FIG. 14, first of all, the controller 130 acquires information about radio resources used by the transmitting station 100 for transmission to the user i in step S502. For example, the information about the radio resources is information indicating the number of resource blocks used as resources in the frequency direction or information indicating which resource blocks are used.

Then, the controller 130 acquires the number $N_{RE}$ of resource elements available for actual data transmission to the user i in step S504. For example, the controller 130 acquires the number obtained by subtracting the number of resource elements that cannot be used for data transmission, such as a reference signal, a synchronization signal and a control signal, from the radio resources used by the transmitting station 100. When the number of resources allocated in the frequency direction is previously determined, the processes in steps S502 and S504 may be omitted.

Subsequently, the controller 130 acquires information indicating a modulation scheme to be used for transmission to the user i in step S506. For example, the controller 130 acquires the information indicating the modulation scheme with reference to information stored in the storage unit 120.

Next, the controller 130 acquires a bit number $Q_m$ per resource element used for transmission to the user i in step S508. For example, the controller 130 acquires the bit number $Q_m$ per resource element from the modulation scheme indicated by the information acquired in step S408. The controller 130 may directly acquire information indicating the bit number $Q_m$ per resource element.

Then, the controller 130 decides the interleave length G in step SS 10. For example, the controller 130 decides the interleave length G as $G=N_{RE} \times Q_m$.

An example of the flow of the interleave length decision process has been described.

As described above, it is desirable to previously specify the information indicating a modulation scheme, such as a CQI or MCS, in the wireless communication system 1. An example of specification of the MCS is shown in table 1 below.

TABLE 1

| MCS Index $I_{MCS}$ | Modulation Order $Q_m$ | TBS Index $I_{TBS}$ | Redundancy Version $rv_{idx}$ |
|---|---|---|---|
| 0 | 2 | 0 | 0 |
| 1 | 2 | 1 | 0 |
| 2 | 2 | 2 | 0 |
| 3 | 2 | 3 | 0 |
| 4 | 2 | 4 | 0 |
| 5 | 2 | 5 | 0 |
| 6 | 2 | 6 | 0 |
| 7 | 2 | 7 | 0 |
| 8 | 2 | 8 | 0 |
| 9 | 2 | 9 | 0 |
| 10 | 2 | 10 | 0 |
| 11 | 4 | 10 | 0 |
| 12 | 4 | 11 | 0 |
| 13 | 4 | 12 | 0 |
| 14 | 4 | 13 | 0 |
| 15 | 4 | 14 | 0 |
| 16 | 4 | 15 | 0 |
| 17 | 4 | 16 | 0 |
| 18 | 4 | 17 | 0 |
| 19 | 4 | 18 | 0 |
| 20 | 4 | 19 | 0 |
| 21 | 6 | 19 | 0 |
| 22 | 6 | 20 | 0 |

TABLE 1-continued

| MCS Index $I_{MCS}$ | Modulation Order $Q_m$ | TBS Index $I_{TBS}$ | Redundancy Version $rv_{idx}$ |
|---|---|---|---|
| 23 | 6 | 21 | 0 |
| 24 | 6 | 22 | 0 |
| 25 | 6 | 23 | 0 |
| 26 | 6 | 24 | 0 |
| 27 | 6 | 25 | 0 |
| 28 | 6 | 26 | 0 |
| 29 | reserved | | 1 |
| 30 | | | 2 |
| 31 | | | 3 |

In the above table 1, the first column indicates an MCS index and the second column corresponds to a bit number $Q_m$ per resource element.

In addition, an example of specification of the CQI is shown in table 2 below.

TABLE 2

| CQI index | Modulation modulation | Order $Q_m$ | code rate × 1024 | efficiency |
|---|---|---|---|---|
| 0 | | out of range | | |
| 1 | QPSK | 2 | 78 | 0.1523 |
| 2 | QPSK | 2 | 120 | 0.2344 |
| 3 | QPSK | 2 | 193 | 0.3770 |
| 4 | QPSK | 2 | 308 | 0.6016 |
| 5 | QPSK | 2 | 449 | 0.8770 |
| 6 | QPSK | 2 | 602 | 1.1758 |
| 7 | 16QAM | 4 | 378 | 1.4766 |
| 8 | 16QAM | 4 | 490 | 1.9141 |
| 9 | 16QAM | 4 | 616 | 2.4063 |
| 10 | 64QAM | 6 | 466 | 2.7305 |
| 11 | 64QAM | 6 | 567 | 3.3223 |
| 12 | 64QAM | 6 | 666 | 3.9023 |
| 13 | 64QAM | 6 | 772 | 4.5234 |
| 14 | 64QAM | 6 | 873 | 5.1152 |
| 15 | 64QAM | 6 | 948 | 5.5547 |

In the above table 2, the first column indicates a CQI index, the second column indicates a modulation scheme and the third column corresponds to a bit number $Q_m$ per resource element.

[4-2-2. Interleave Pattern]

The controller 130 of the transmitting station 100 according to the present embodiment may control an interleave pattern in an interleave process by the wireless communication unit 110. In IDMA, it is possible to enable transmission signal multiplexing and signal separation in a receiving station by making interleave patterns different for transmitting stations. Accordingly, the controller 130 of the transmitting station 100 according to the present embodiment, for example, controls an interleave pattern depending on the number of retransmissions. For example, the controller 130 decides the interleave pattern by the following formula.

[Math. 8]

$$n(m, I_{User}, I_{Cell}, S_{Tbs}, P_{Harq}, N_{Retx}, SFN, O_{Int}, G) = \left(\frac{(2I_{User}+1)m(m+1)}{2} + I_{Cell} + S_{Tbs} + P_{Harq} + N_{Retx} + SFN + O_{Int}\right) \bmod G$$ Formula 8

Here, $I_{User}$ is a user identifier, for example, a user ID or a radio network temporary identifier (RNTI). G is an interleave length. $I_{Cell}$ is a cell ID such as a cell-RNTI. $S_{Tbs}$ is a bit number of a corresponding TB (transport block size). Furthermore, $S_{Tbs}$ may be $I_{TBS}$ in the specification of MCS. $P_{Harq}$ is a process ID of a hybrid automatic repeat request (HARQ). $N_{Retx}$ is the number of retransmissions of the corresponding TB, for example, 0 in the case of initial transmission and 1 in the case of the first retransmission. SFN is a system frame number of radio resources used for retransmission. $O_{Int}$ is an offset value considered in the interleave pattern. For example, this value may be designated by an eNB device or other devices in the wireless communication system 1. It is desirable that $O_{Int} < G$. This is because the offset value is canceled by a modulo operation when set to a value equal to or greater than G.

Figure 15:
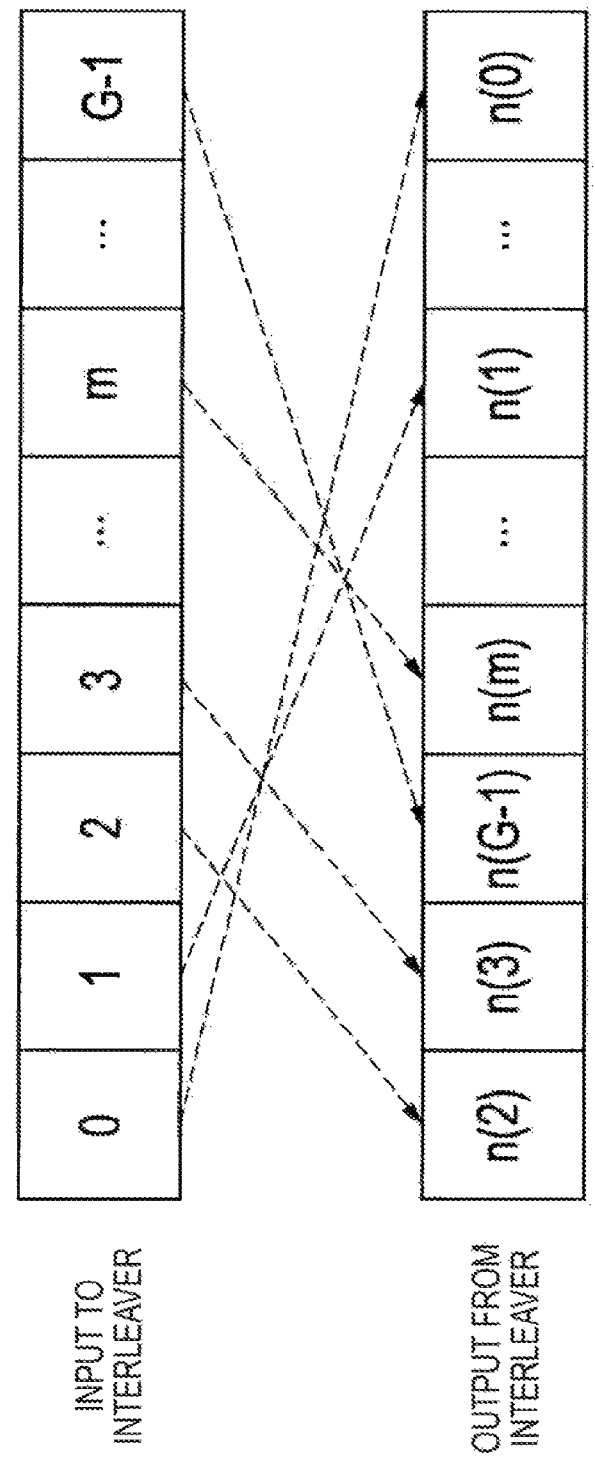
FIG. 15 is an explanatory diagram of an interleave pattern control method according to the present embodiment.

The above formula 8 represents that an m-th bit of the input bit sequence of the CW interleaver 118 becomes an n-th bit of the output bit sequence, as illustrated in FIG. 15. FIG. 15 illustrates an interleave pattern control method according to the present embodiment. According to the formula, an interleave pattern is qualitatively specified even in a system having a dynamically variable interleave length G. Since the interleave pattern is specified according to the formula, the transmitting station 100 may not store all interleave patterns related to a variable interleave length G and can reduce storage load in the storage unit 120.

Furthermore, the controller 130 may vary the interleave pattern for each retransmission depending on the number $N_{Retx}$ of retransmissions or the system frame number SFN, as represented by the above formula 8. The controller 130 may obtain a diversity effect and reduce interference by varying the interleave pattern for each retransmission to randomize the interleave pattern.

The controller 130 may decide the interleave pattern through different methods depending on transmission directions such as uplink, downlink and D2D communication. For example, the controller 130 may decide the interleave pattern using different formulas depending on transmission directions. In addition, the controller 130 may decide the interleave pattern using a formula, obtained by adding a parameter La indicating a transmission direction to the formula 8, as represented by the following formula.

[Math. 9]

$$n(m, I_{User}, I_{Cell}, S_{Tbs}, P_{Harq}, N_{Retx}, L_d, SFN, O_{Int}, G) = \left(\frac{(2I_{User}+1)m(m+1)}{2} + I_{Cell} + S_{Tbs} + P_{Harq} + N_{Retx} + L_d + SFN + O_{Int}\right) \bmod G$$ Formula 9

Ld is a parameter having a value depending on a relevant transmission direction. For example, the parameter may have a value such as 0 in the case of downlink, 10 in the case of uplink or 100 in the case of D2D communication.

The CW interleaver 118 may be configured as a single interleaver or include a plurality of interleavers. Hereinafter, a plurality of interleavers included in the CW interleaver 118 are called sub-interleavers. The controller 130 may control the interleave pattern by switching sub-interleavers performing interleave processes. Hereinafter, examples in which the CW interleaver 118 includes a plurality of sub-interleavers formed in multiple stages will be described with reference to FIGS. 16 to 18.

Figure 16:
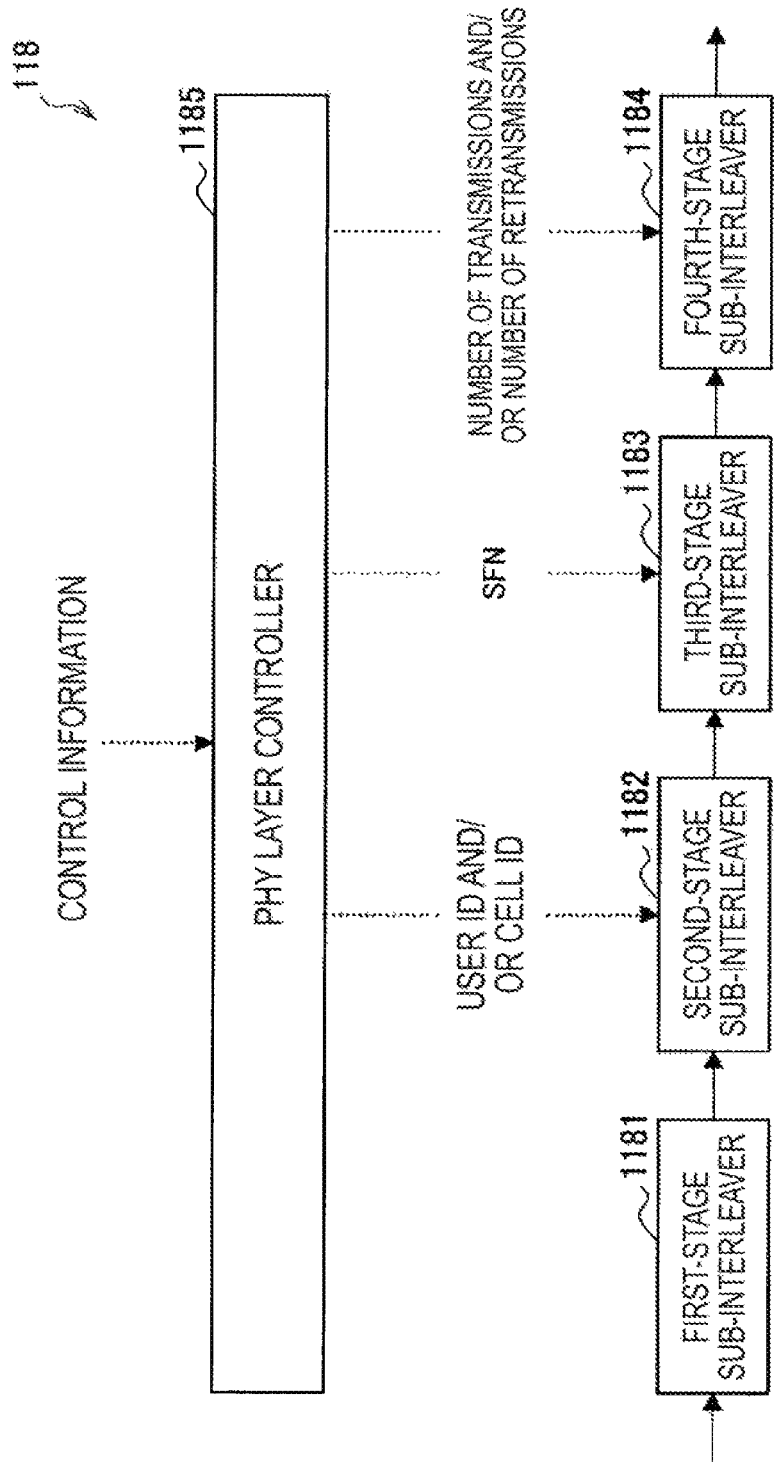
FIG. 16 is a block diagram illustrating an internal configuration of a CW interleaver according to the present embodiment.

FIG. 16 is a block diagram illustrating an internal configuration of the CW interleaver 118 according to the present embodiment. In the example illustrated in FIG. 16, the CW interleaver 118 includes a first-stage sub-interleaver 1181, a second-stage sub-interleaver 1182, a third-stage sub-interleaver 1183, a fourth-stage sub-interleaver 1184 and a PHY layer controller 1185. The first-stage sub-interleaver 1181 is a common interleaver. The second-stage sub-interleaver 1182 is an interleaver having a pattern that is variable according to user ID and/or cell ID. The third-stage sub-interleaver 1183 is an interleaver having a pattern that is variable according to SFN. The fourth-stage sub-interleaver 1184 is an interleaver having a pattern that is variable according to the number of transmissions and/or the number of retransmissions. The PHY layer controller 1185 inputs corresponding parameters to the sub-interleavers included in the CW interleaver 118 on the basis of control information acquired from a control channel, for example. For example, the PHY layer controller 1185 inputs the user ID and/or the cell ID to the second-stage sub-interleaver 1182. In addition, the PHY layer controller 1185 inputs the SFN to the third-stage sub-interleaver 1183. Furthermore, the PHY layer controller 1185 inputs the number of transmissions and/or the number of retransmissions to the fourth-stage sub-interleaver 1184.

As illustrated in the example of FIG. 16, it is desirable that the sub-interleavers included in the CW interleaver 118 perform different interleave processes using different parameters as inputs. Accordingly, the controller 130 may control use/non-use of each sub-interleaver more easily according to a situation. Meanwhile, the order of the sub-interleavers is optional and the number of sub-interleavers and input parameters are also optional. In addition, the sub-interleavers may have any interleave lengths and have the same interleave length or different interleave lengths. For example, the interleave lengths may be initially set to G' and changed to G in the middle of the process when a padding process is performed. Further, it is desirable that the sub-interleavers have the same interleave length.

Figure 17:
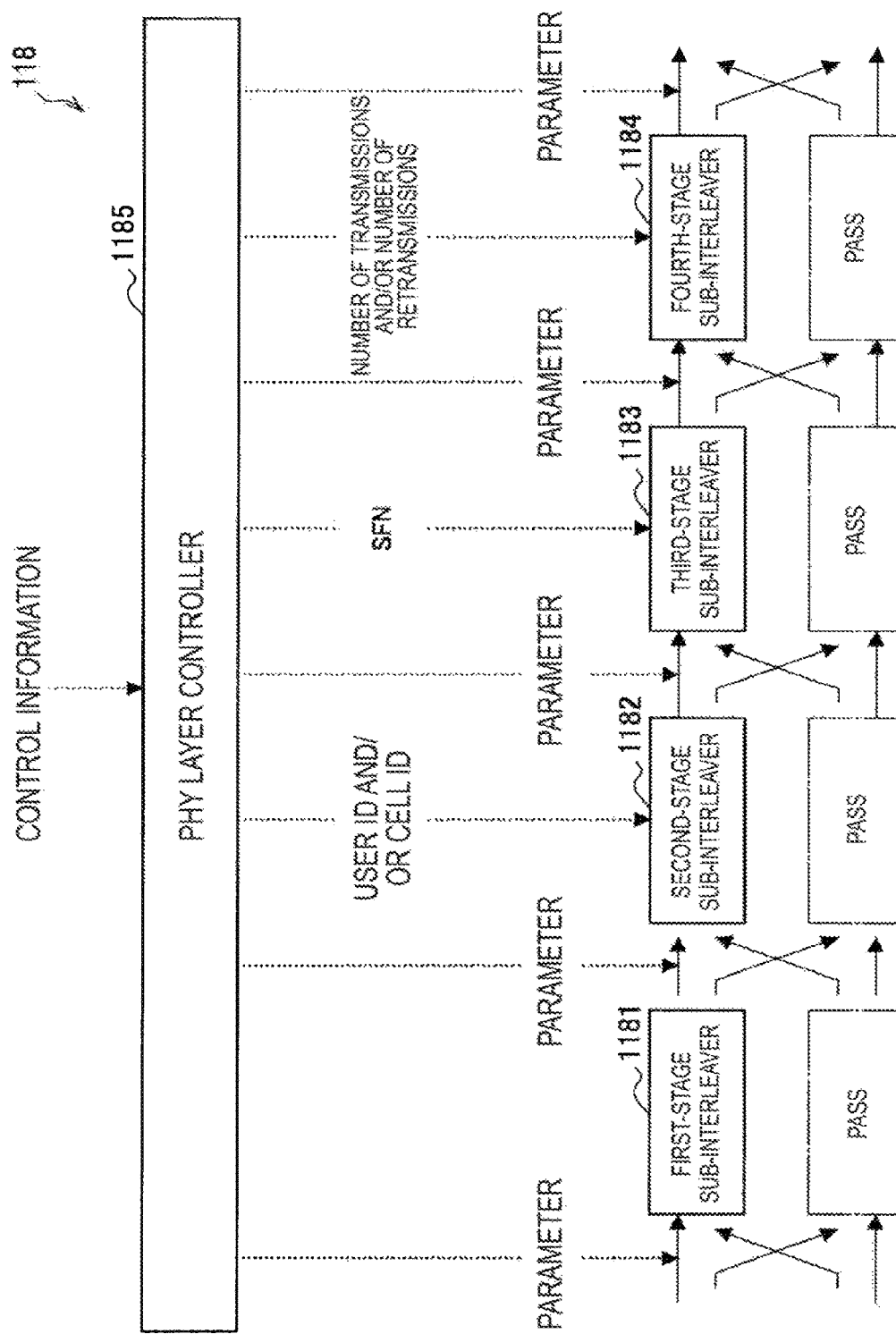
FIG. 17 is a block diagram illustrating an internal configuration of a CW interleaver according to the present embodiment.

FIG. 17 is a block diagram illustrating an internal configuration of the CW interleaver 118 according to the present embodiment. The CW interleaver 118 illustrated in FIG. 17 may switch between execution of an interleave process of each sub-interleaver process and non-execution of the interleave process by passing an input parameter depending on input parameters.

Figure 18:
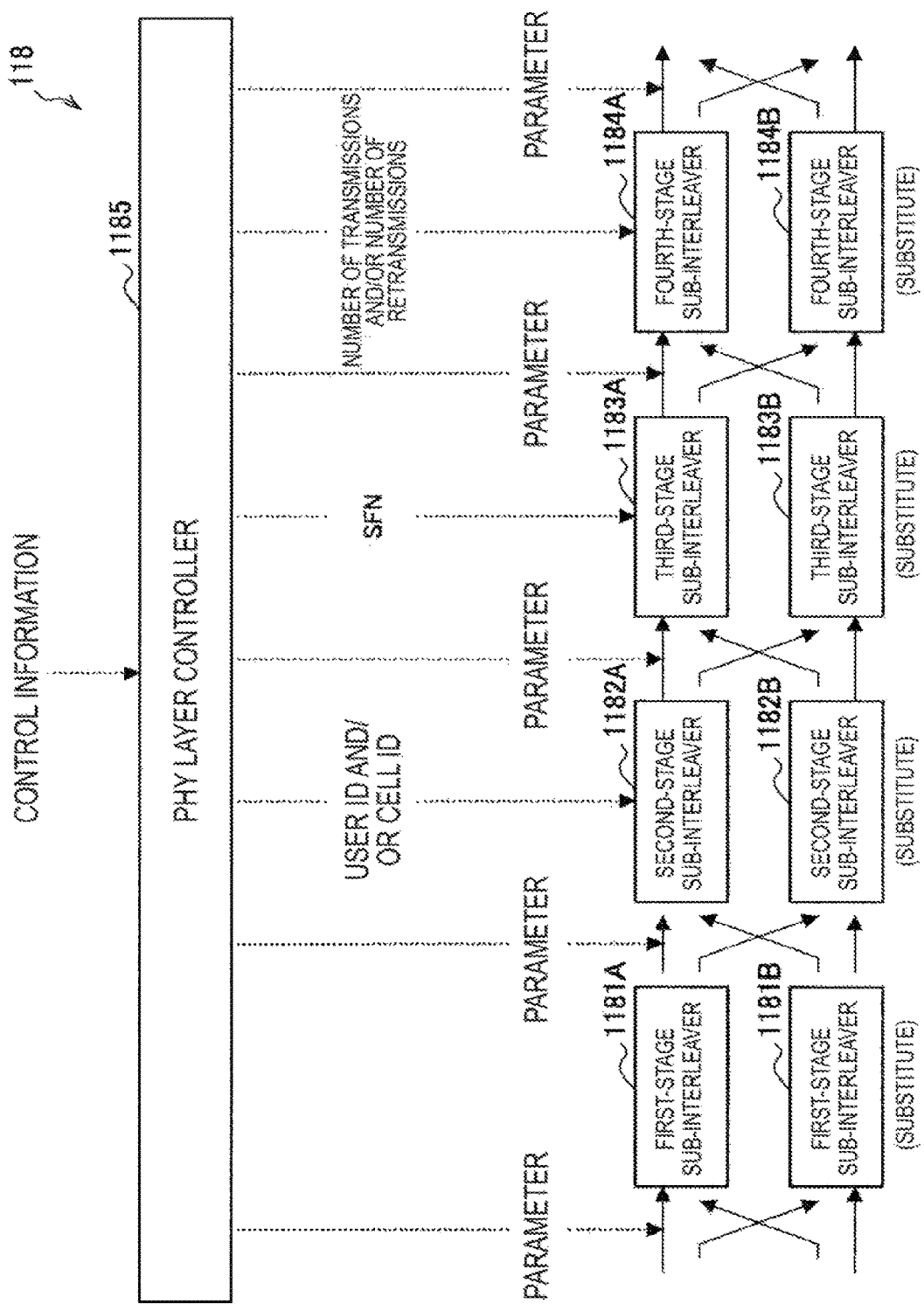
FIG. 18 is a block diagram illustrating an internal configuration of a CW interleaver according to the present embodiment.

FIG. 18 is a block diagram illustrating an internal configuration of the CW interleaver 118 according to the present embodiment. The CW interleaver 118 illustrated in FIG. 18 has a combination of a plurality of sub-interleavers in each stage. For example, the CW interleaver 118 has a combination of first-stage sub-interleavers 1181A and 1181B in the first stage. In addition, the CW interleaver 118 has a combination of second-stage sub-interleavers 1182A and 1182B in the second stage. Furthermore, the CW interleaver 118 has a combination of third-stage sub-interleavers 1183A and 1183B in the third stage. The CW interleaver 118 has a combination of fourth-stage sub-interleavers 1184A and 1184B in the fourth stage. The CW interleaver 118 may switch interleave processes using any sub-interleavers of the combinations of sub-interleavers in the respective stages.

When the CW interleaver 118 is formed in multiple stages, various input parameters are considered for each sub-interleaver. The following table 3 shows an example of parameters. Here, it is desirable that parameters having different update intervals be input to respective sub-interleavers. In this case, the CW interleaver 118 may appropriately change interleave patterns with time. Furthermore, the CW interleaver 118 may change a configuration of sub-interleavers with little additional information.

TABLE 3

| Parameter change period | Detailed example of parameters | Specific examples |
|---|---|---|
| Invariable (Permanent or Semipermanent) | Common carrier ID Node category type Link direction | PLMN (Public Land Mobile Network), PSTN (Public Switched Telephone Network), MCC (Mobile Country Code), MNC (Mobile Network Code) Category 1-10, MAC address Downlink, Uplink |
| Long period | User ID IP address | RNTI (Radio Network Temporary Identifier) IPv4, IPv6 |
| Middle period | Frame number | SFN (System Frame Number) |
| Short period | Subframe ID | Subframe ID |
| Irregular | Cell ID HARQ Info CSI (Channel State Information) Info MCS (Modulation and Coding Set) Info Retransmission/initial transmission | RNTI, SSID (Service Set Identifier), BSS (Basic Service Set) New Data Indicator Channel Quality Indicator, Precoding Matrix Indicator, Rank Indicator, Precoding Type Indicator MCS index, TBS index |

[4-3. Interleave Setting Related to Retransmission]

The controller 130 of the transmitting station 100 may control interleave setting depending on a retransmission process type. The controller 130 may control an interleave length or an interleave pattern depending on a retransmission process type. Hereinafter, interleave setting related to HARQ will be described first.

[4-3-1. Adaptive/Non-Adaptive]

First, two types of HARQ, adaptive HARQ and non-adaptive HARQ, are considered as an example of retransmission type. Adaptive HARQ is HARQ having a modulation scheme that is variable for each retransmission. When the transmitting station 100 employs adaptive HARQ, the transmitting station 100 can increase a degree of freedom of resource control. However, the transmitting station 100 performs signaling for designating a modulation scheme during retransmission. On the other hand, non-adaptive HARQ is HARQ having a fixed modulation scheme during retransmission. When the transmitting station 100 employs non-adaptive HARQ, the transmitting station 100 can omit signaling for designating a modulation scheme even if a degree of freedom of resource control decreases.

Incidentally, when the transmitting station 100 employs HARQ, it is desirable that a TB size (bit number per TB) be identical to the TB size during previous transmission of the TB that is a retransmission target because signal combining in the receiving station 200 becomes simple.

Hereinafter, an example of an interleave length decision process depending on an HARQ type will be described with reference to FIG. 19.

Figure 19:
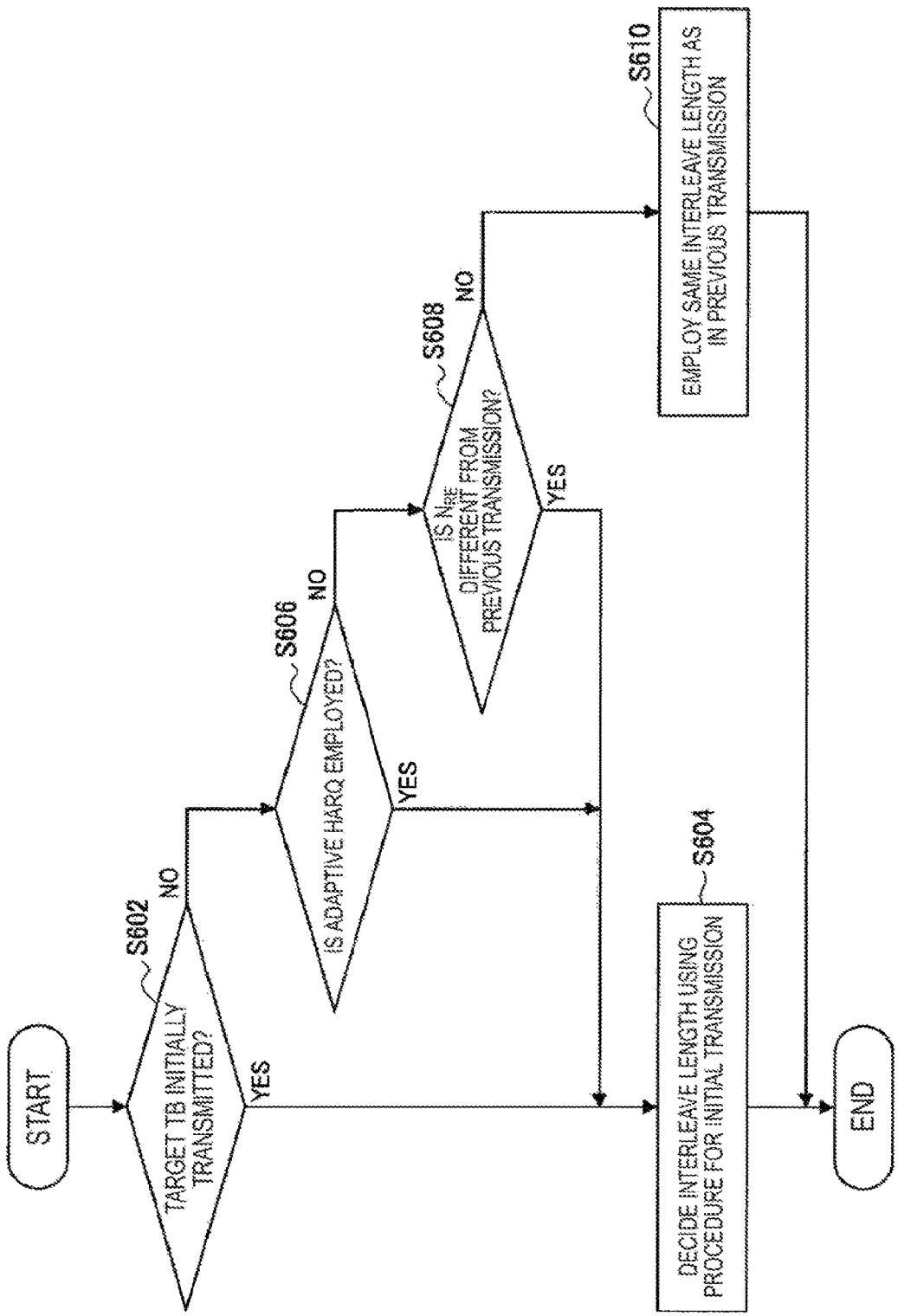
FIG. 19 is a flowchart illustrating an example of the flow of an interleave length decision process executed in the transmitting station according to the present embodiment.

FIG. 19 is a flowchart illustrating an example of the flow of an interleave length decision process executed in the transmitting station 100 according to the present embodiment.

As illustrated in FIG. 19, first of all, the controller 130 determines whether a TB of a transmission target is an initially transmitted TB in step S602.

When the TB is determined to be the initially transmitted TB (S602/YES), the controller 130 decides an interleave length through a procedure for initial transmission in step S604. Here, the procedure for initial transmission refers to the processes described as examples in FIGS. 13 and 14.

When the TB is determined to be a retransmitted TB (S602/NO), the controller 130 determines whether adaptive HARQ is employed in step S606. Criteria for the determination will be described below.

When it is determined that adaptive HARQ is employed (S606/YES), the process proceeds to step S604 and the controller 130 decides the interleave length through the procedure for initial transmission. This is because a modulation scheme or the number of resource elements may be changed in the case of adaptive HARQ.

On the other hand, when it is determined that non-adaptive HARQ is employed (S606/NO), the controller 130 determines whether the number $N_{RE}$ of available resource elements differs from that during the previous transmission in step S608. The determination is performed because the number of available resource elements may change even if the same number of resource blocks is available.

When it is determined that the number of available resource elements differs from that during the previous transmission (S608/YES), the process proceeds to step S604 and the controller 130 decides the interleave length through the procedure for initial transmission.

On the other hand, when it is determined that the number of available resource elements is identical to that during the previous transmission (S608/NO), the controller 130 employs the same interleave length as that during the previous transmission again in step S610.

Hereinafter, criteria for determining whether adaptive HARQ is employed in step S606 will be described with reference to FIG. 20. Here, the transmitting station 100 is regarded as a transmitting station to which radio resources used for transmission are allocated by other devices, such as a UE in a cellular system. When the transmitting station 100 is a transmitting station that allocates (or decides) radio resources used for transmission by itself, such as an eNB in a cellular system, whether adaptive HARQ is employed may be determined based on any determination criteria.

Figure 20:
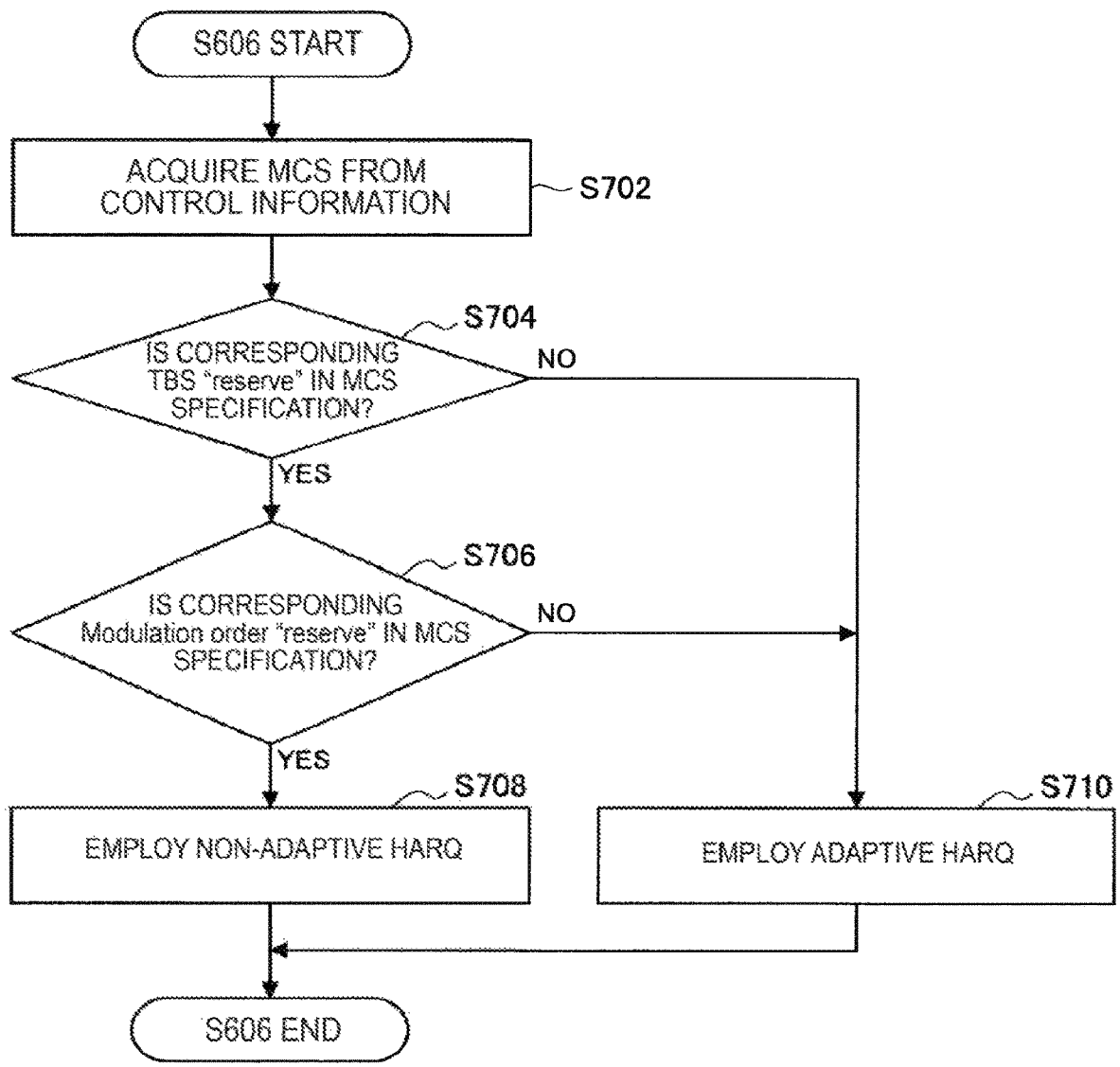
FIG. 20 is a flowchart illustrating an example of the flow of a HARQ type determination process executed in the transmitting station according to the present embodiment.

FIG. 20 is a flowchart illustrating an example of the flow of a HARQ type determination process executed in the transmitting station 100 according to the present embodiment.

As illustrated in FIG. 20, first of all, the controller 130 acquires an MCS from control information announced by an eNB or the like using a control channel, for example, in step S702. Here, the wireless communication system 1 may employ the specification of MCS shown in the above table 1.

Subsequently, the controller 130 determines whether a corresponding TBS is "reserve" in the specification of MCS shown in the table 1. The controller 130 may determine whether the corresponding TBS is a specific value instead of determining whether the corresponding TBS is "reserve."

When the corresponding TBS is not "reserve" (S704/NO), the controller 130 determines that adaptive HARQ is employed in step S710.

On the other hand, when the corresponding TBS is "reserve" (S704/YES), the controller 130 determines whether a corresponding modulation order is "reserve" in the specification of MCS shown in the table 1 in step S706. The controller 130 may determine whether the corresponding modulation order is a specific value instead of determining whether the corresponding modulation order is "reserve."

When the corresponding modulation order is not "reserve" (S706/NO), the controller 130 determines that adaptive HARQ is employed in step S710.

On the other hand, when the corresponding modulation order is "reserve" (S706/YES), the controller 130 determines that non-adaptive HARQ is employed in step S708.

In addition, when a flag indicating which one of adaptive HARQ and non-adaptive HARQ is to be employed is announced, the transmitting station 100 may determine which HARQ is employed on the basis of the announcement.

Adaptive HARQ and non-adaptive HARQ have been considered.

[4-3-2. CC/IR]

Next, chase combining (CC) and incremental redundancy (IR) are considered as another example of a retransmission type. Hereinafter, HARQ employing CC is called HARQ with CC and HARQ employing IR is called HARQ with IR.

For example, the controller 130 of the transmitting station 100 may control the wireless communication unit 110 to employ CC as a retransmission process type. In a non-orthogonal multi-access system such as IDMA, the receiving station 200 repeats a detection process and a decoding process in many cases. Accordingly, the receiving station 200 may use a bit log likelihood ratio (LLR) acquired from signals that have received until the previous transmission for interference cancelation and the like in a process of initially detecting retransmitted signals when the transmitting station 100 employs CC. Of course, the controller 130 may control the wireless communication unit 110 to employ IR as a retransmission process type. In IR, however, a coding bit sequence selected for retransmission may be different whenever retransmission is performed, even when the TBs are originally identical. Accordingly, when the transmitting station 100 employs IR, it is difficult for the receiving station 200 to use a result of decoding of signals received up to the previous transmission in a process of initially detecting retransmitted signals.

Hereinafter, an example of a retransmission type decision process will be described with reference to FIG. 21.

Figure 21:
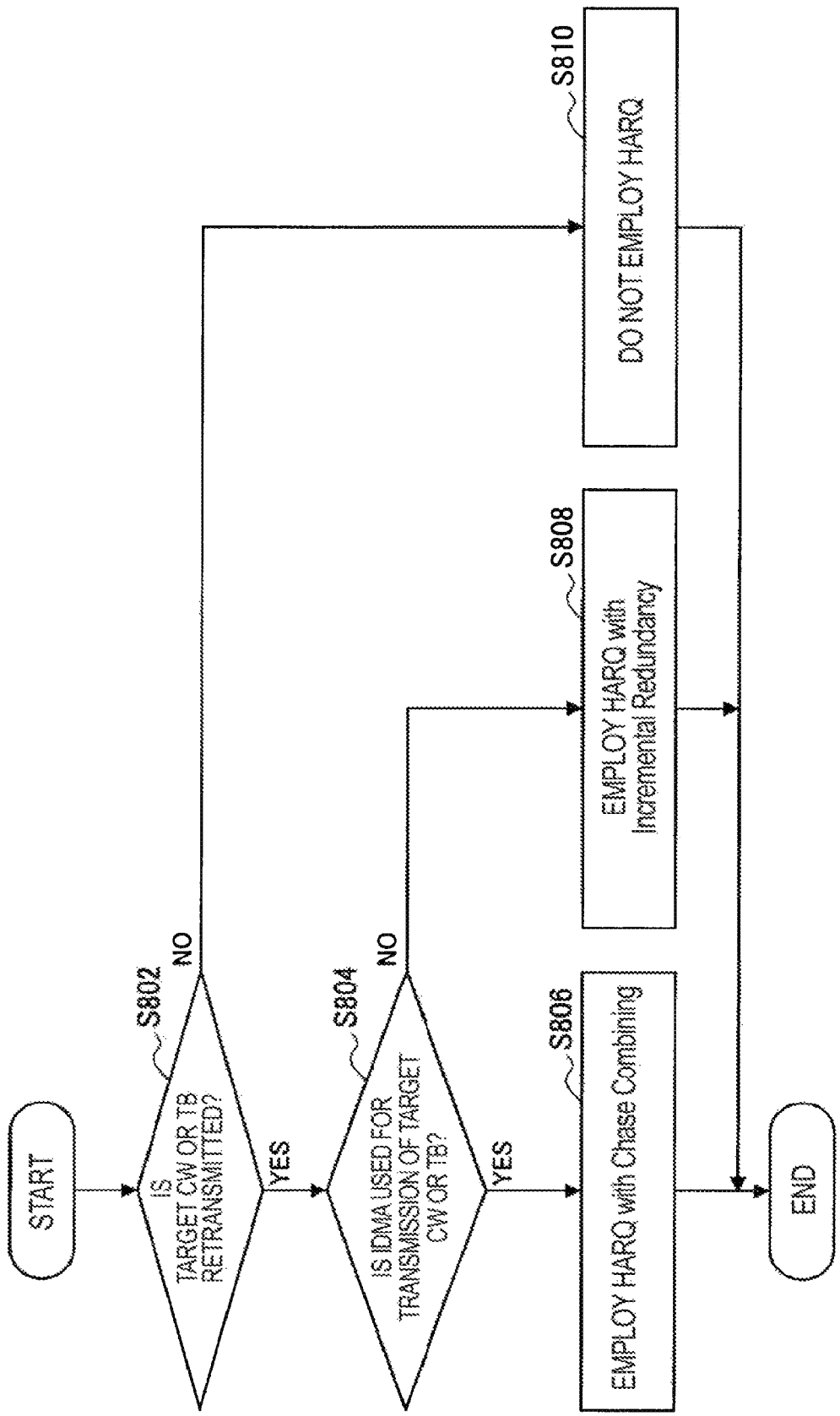
FIG. 21 is a flowchart illustrating an example of the flow of a retransmission type decision process executed in the transmitting station according to the present embodiment.

FIG. 21 is a flowchart illustrating an example of the flow of a retransmission type decision process executed in the transmitting station 100 according to the present embodiment.

As illustrated in FIG. 21, first of all, it is determined whether a CW or a TB that is a transmission target is a retransmitted CW or TB in step S802.

When it is determined that the CW or TB is a retransmitted CW or TB (S802/YES), the controller 130 determines whether to use IDMA to transmit the target CW or TB in step S804. For example, the controller 130 may determine that IDMA is used in the case of one-to-multiple communication and determine that IDMA is not used in the case of one-to-one communication.

When it is determined that IDMA is used (S804/YES), the controller 130 determines that HARQ with CC is employed in step S806.

On the other hand, when it is determined that IDMA is not used (S804/NO), the controller 130 determines that HARQ with IR is employed in step S808.

Furthermore, when it is determined that the target CW or TB is initially transmitted (S802/NO), the controller 130 determines that HARQ is not employed in step S810.

Although the controller 130 employs CC when IDMA is used for retransmission and employs IR when IDMA is not used in the above description, CC may be employed in both cases. Furthermore, the controller 130 may use other determination criteria for determination in step S804. For example, the controller 130 may employ CC when a non-orthogonal multi-access system is used for retransmission and employ IR in other cases. In addition, the controller 130 may employ CC when at least part of the retransmitted CW or TB is transmitted and received in the same resources as other CWs or TBs and employ IR when the CW or TB is transmitted and received in different resources.

[4-3-3. Execution/Non-Execution of Interleave]

The controller 130 of the transmitting station 100 may control whether to perform wireless communication using IDMA depending on whether a transmission sequence is a retransmitted sequence. Specifically, the controller 130 may switch between execution of an interleave process and non-execution of the interleave process in response to whether a CW is retransmitted or not. It is desirable that a relation between retransmission/initial transmission and execution/non-execution of interleave be previously shared between the transmitting station 100 and the receiving station 200. Non-execution of an interleave process may be execution of an interleave process using an interleaver having an input sequence and an output sequence which are identical to each other.

For example, when the transmitted sequence is a retransmitted sequence, the controller 130 may control the wireless communication unit 110 to perform wireless communication using IDMA. When the transmission sequence is an initially transmitted sequence, the controller 130 may control the wireless communication unit 110 to perform wireless communication without using IDMA. Here, the controller 130 may control whether to perform wireless communication using IDMA depending on the number of receiving stations 200 that are retransmission targets. For example, the controller 130 may control the wireless communication unit 110 to use IDMA when the number of receiving stations 200) that are retransmission targets is large and not to use IDMA when there is a single receiving station 200 that is a retransmission target. In this case, the transmitting station 100 may switch between use of IDMA and non-use of IDMA depending on possibility of interference in receiving stations 200.

As another control example, the controller 130 may control the wireless communication unit 110 to perform wireless communication without using IDMA when the transmission sequence is a retransmitted sequence and to perform wireless communication using IDMA when the transmission sequence is an initially transmitted sequence.

The transmitting station 100 announces information indicating whether the transmission sequence is a retransmitted sequence to the receiving station 200. For example, the transmitting station 100 may announce whether an interleave is executed to the receiving station 200 by setting a bit flag representing that the target CW is initially transmitted or retransmitted in a target control channel. For example, a new data indicator (NDI) in downlink control information (DCI) in a control channel may be an example of the bit flag. This is effective when the relation between retransmission/initial transmission and execution/non-execution of interleave is shared between the transmitting station 100 and the receiving station 200. In addition, the transmitting station 100 may set a bit flag directly indicating execution or non-execution of interleave instead of or in addition to the aforementioned bit flag.

Figure 22:
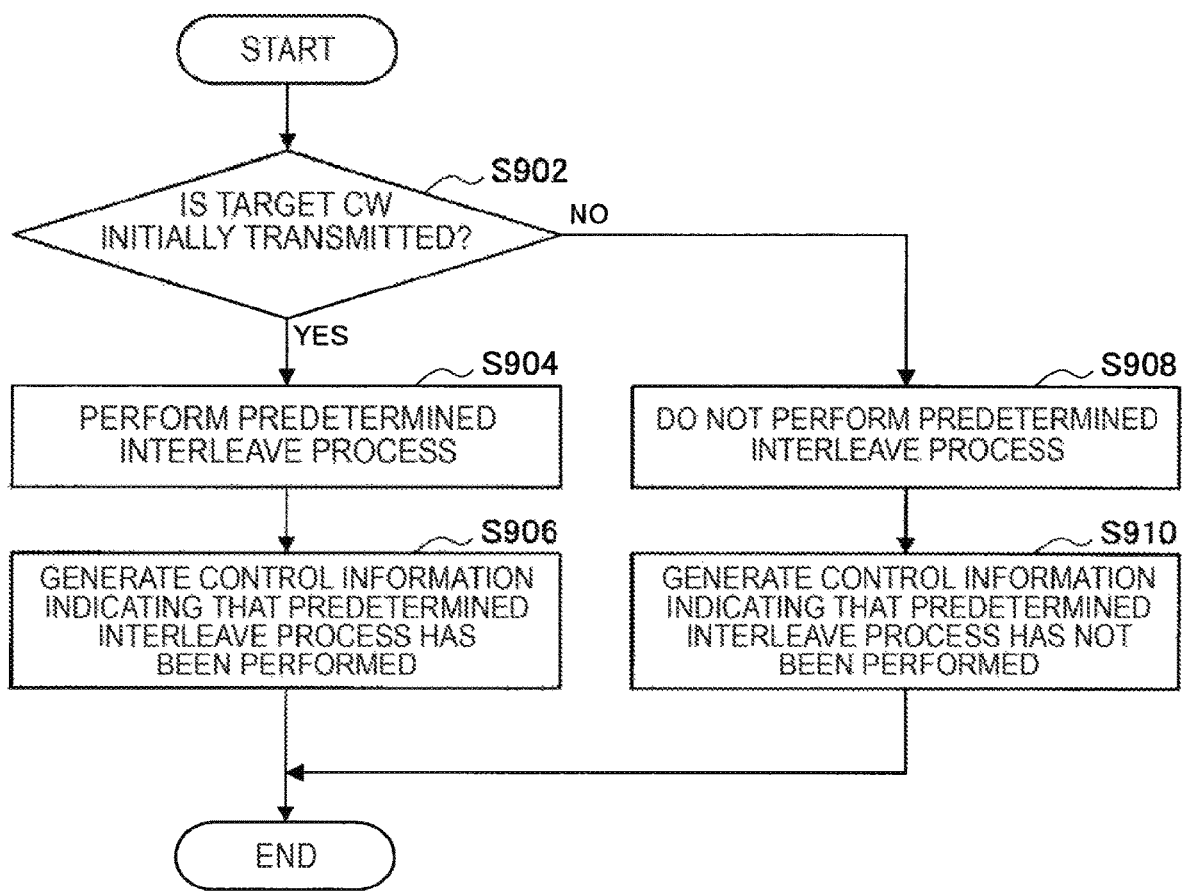
FIG. 22 is a flowchart illustrating an example of the flow of a process of switching between execution and non-execution of an interleave process performed in the transmitting station according to the present embodiment.

When the CW interleaver 118 of the wireless communication unit 110 is to formed in multiple stages as illustrated in FIG. 17, the controller 130 may switch between execution and non-execution of an interleave process through each sub-interleaver, as illustrated in FIG. 22.

FIG. 22 is a flowchart illustrating an example of the flow of a process of switching between execution and non-execution of an interleave process, executed in the transmitting station 100 according to the present embodiment.

As illustrated in FIG. 22, first of all, it is determined whether a CW that is a transmission target is an initially transmitted CW in step S902.

When it is determined that the CW is initially transmitted (S902/YES), the controller 130 determines that a predetermined interleave process is executed in step S904. For example, the controller 130 determines that an interleave process is performed by a target sub-interleaver (e.g., the first-stage sub-interleaver 1181 illustrated in FIG. 17) from among a plurality of sub-interleavers included in the CW interleaver 118.

Subsequently, the controller 130 generates control information indicating that the predetermined interleaver process has been executed in step S906. For example, the controller 130 sets a flag indicating that the target CW is initially transmitted or a flag indicating that the predetermined interleave process has been executed in a control channel corresponding to the target CW.

On the other hand, when it is determined that the CW is retransmitted (S902/NO), the controller 130 determines that the predetermined interleave process is not executed in step S908.

Then, the controller 130 generates control information indicating that the predetermined interleaver process has not been executed in step S910. For example, the controller 130 sets a flag indicating that the target CW is retransmitted or a flag indicating that the predetermined interleave process has not been executed in the control channel corresponding to the target CW.

The flow described above may be repeated for each of sub-interleavers formed in multiple stages. During repetition of the flow, a determination criterion 16 related to any parameter shown in the above table 3, for example, other than the criterion for determination of whether the CW is initially transmitted or not may be employed as the determination criterion in step S902. Furthermore, steps S904 and S906 may be switched with steps S908 and S910.

Figure 23:
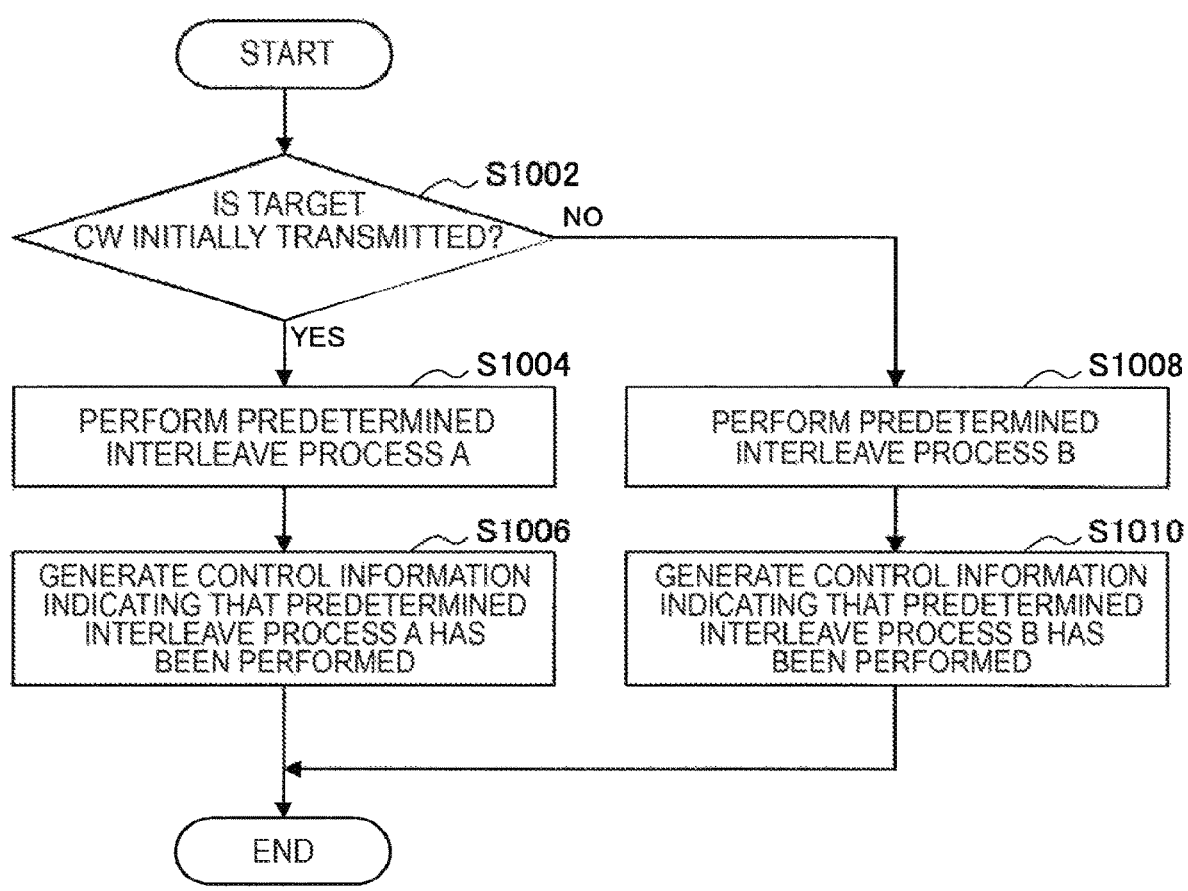
FIG. 23 is a flowchart illustrating an example of the flow of a process of switching between execution and non-execution of an interleave process performed in the transmitting station according to the present embodiment.

When the CW interleaver 118 of the wireless communication unit 110 is formed in multiple stages, as illustrated in FIG. 18, the controller 130 may switch interleave process by sub-interleavers, as illustrated in FIG. 23.

FIG. 23 is a flowchart illustrating an example of the flow of a process of switching between execution and non-execution of an interleave process, executed in the transmitting station 100 according to the present embodiment.

As illustrated in FIG. 23, first of all, it is determined whether a CW that is a transmission target is an initially transmitted CW in step S1002.

When it is determined that the CW is initially transmitted (S1002/YES), the controller 130 determines that a predetermined interleave process A is executed in step S1004. For example, the controller 130 determines that an interleave process is executed by any sub-interleaver (e.g., the first-stage sub-interleaver 1181A illustrated in FIG. 18) in a combination of a plurality of sub-interleavers included in each stage of the CW interleaver 118.

Subsequently, the controller 130 generates control information indicating that the predetermined interleaver process A has been executed in step S1006. For example, the controller 130 sets a flag indicating that the target CW is initially transmitted or a flag indicating that the predetermined interleave process A has been executed in a control channel corresponding to the target CW.

On the other hand, when it is determined that the CW is retransmitted (S1002/NO), the controller 130 determines that a predetermined interleave process B is executed in step S1008. For example, the controller 130 determines that an interleave process is executed by a sub-interleaver different from the sub-interleaver selected in step S1004 (e.g., the first-stage sub-interleaver 1181B illustrated in FIG. 18) in a combination of a plurality of sub-interleavers included in each stage of the CW interleaver 118.

Next, the controller 130 generates control information indicating that the predetermined interleaver process B has been executed in step S1010. For example, the controller 130 sets a flag indicating that the target CW is retransmitted or a flag indicating that the predetermined interleave process B has been executed in the control channel corresponding to the target CW.

The flow described above may be repeated for each of combinations of sub-interleavers formed in multiple stages. During repetition of the flow, a determination criterion related to any parameter other than the criterion for determination of whether the CW is initially transmitted or not may be employed as the determination criterion in step S1002. According to the flow, the transmitting station 100 can employ an appropriate interleave pattern according to retransmission, thereby further improving transmission quality and reception quality in retransmission.

The transmitting station 100 has been described. When execution and non-execution of an interleave process are switched in the transmitting station, as described above, the receiving station 200 employs deinterleave setting corresponding thereto. Hereinafter, a deinterleave setting control process in the receiving station 200 will be described with reference to FIG. 24.

Figure 24:
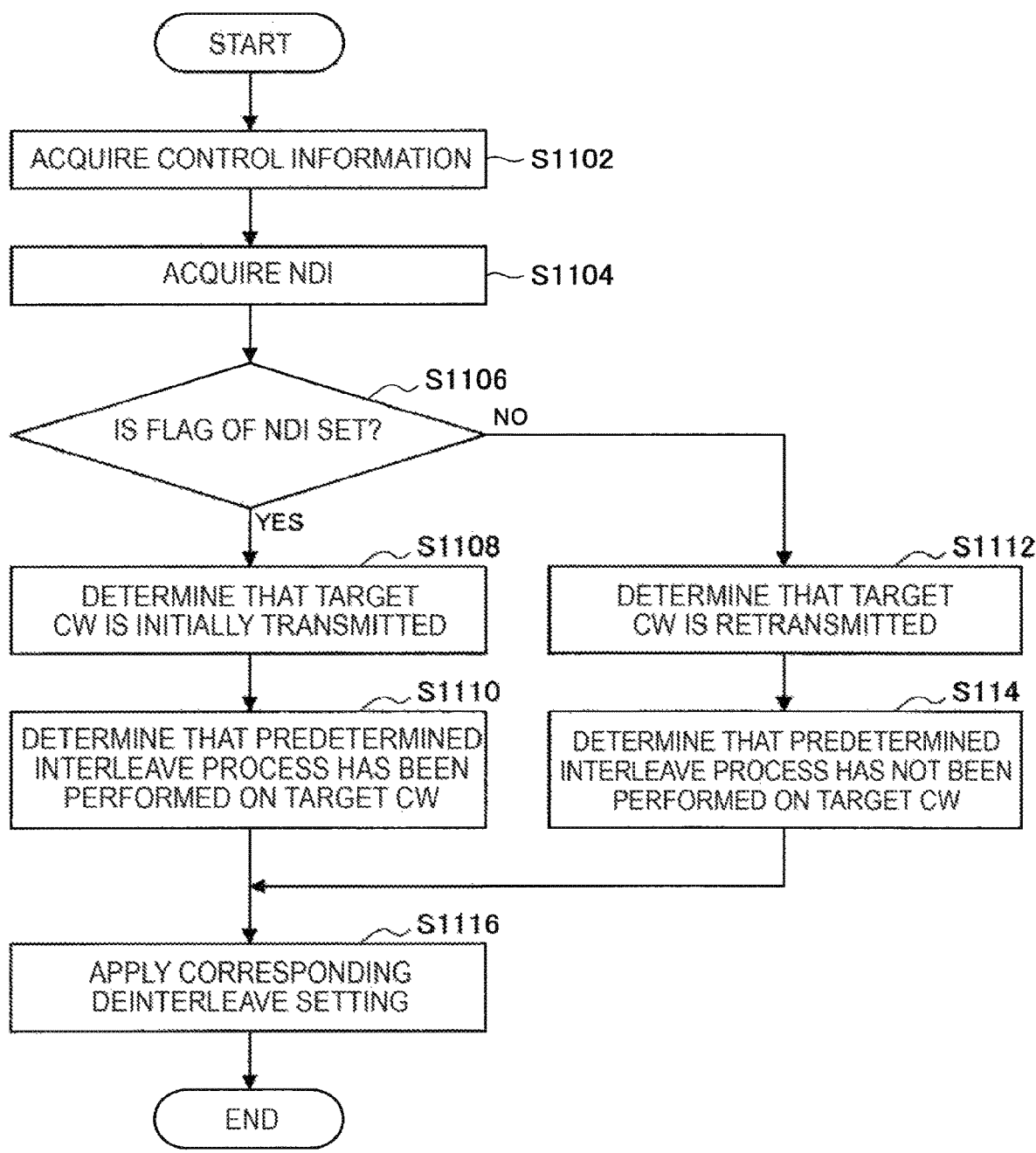
FIG. 24 is a flowchart illustrating an example of the flow of a deinterleave setting control process executed in the transmitting station according to the present embodiment.

FIG. 24 is a flowchart illustrating an example of the flow of a deinterleave setting control process executed in the receiving station 200 according to the present embodiment. This flow is based on the assumption that the transmitting station 100 switches between execution and non-execution of an interleave process by each sub-interleaver in response to whether the target CW is initially transmitted or not, as illustrated in FIG. 22.

As illustrated in FIG. 24, first of all, the controller 230 acquires control information in step S1102. For example, the wireless communication unit 110 receives control information transmitted from an eNB using a control channel, decodes the control information and outputs the control information to the controller 230.

Subsequently, the controller 230 acquires an NDI in step S1104. Then, the controller 230 determines whether a flag of the NDI is set in step S1106.

When it is determined that the flag of the NDI is set (S1106/YES), the controller 230 determines that the target CW is initially transmitted in step S1108. Thereafter, the controller 230 determines that a predetermined interleave process has been performed on the target CW in step S1110.

On the other hand, when it is determined that the flag of the NDI is not set (S1106/NO), the controller 230 determines that the target CW is retransmitted in step S1112. Subsequently, the controller 230 determines that a predetermined interleave process has not been performed on the target CW in step S1114.

Then, the controller 230 applies corresponding deinterleave setting in step S1116.

The flow described above may be repeated for each of sub-interleavers formed in multiple stages at the side of the transmitting station 100. In repetition of the flow, a determination criterion related to any parameter other than the criterion of determination of whether the flag of the NDI is set may be employed as the determination criterion in step S1106.

[4-4. Combination with Other Multiplexing Methods or Other Multiple Access Methods]

[4-4-1. Example of Configuration of Transmitting Station]

The wireless communication system 1 may combine IDMA with other multiplexing methods or other multiple access methods. Here, a configuration of the transmitting station 100 when IDMA is combined with other multiplexing methods or other multiple access methods will be described as an example with reference to FIGS. 25 and 26.

Figure 25:
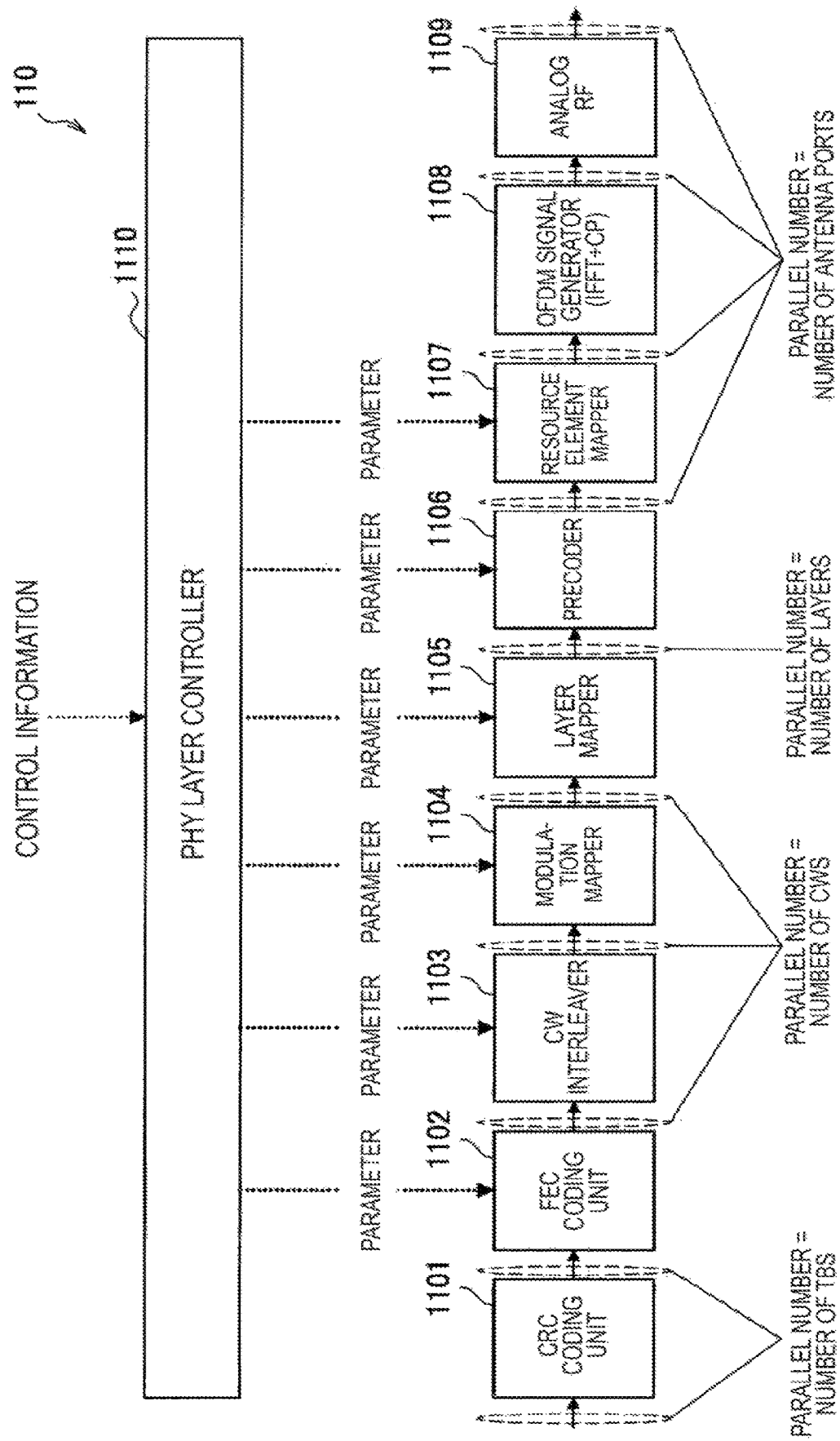
FIG. 25 is a block diagram illustrating an example of a logical configuration of a wireless communication unit of the transmitting station according to the present embodiment.

FIG. 25 is a block diagram illustrating an example of a logical configuration of the wireless communication unit 110 of the transmitting station 100 according to the present embodiment. FIG. 25 shows an example of a configuration when IDMA, OFDM and MIMO are combined.

As illustrated in FIG. 25, the wireless communication unit 110 includes a CRC coding unit 1101, an FEC coding unit 1102, a CW interleaver 1103, a modulation mapper 1104, a layer mapper 1105, a precoder 1106, a resource element mapper 1107, an OFDM signal generator 1108, an analog RF 1109 and a PHY layer controller 1110. The FEC coding unit 1102 may include the CB segmentation unit 112 to the CB connecting unit 116 illustrated in FIG. 10. The OFDM signal generator 1108 may have a function of performing an inverse fast Fourier transform (IFFT) and a function of adding a cyclic prefix (CP). A parallel number shown in the figure indicates the number of parallel processes that are performed. For example, the CRC coding unit 1101 performs a number of CRC coding processes corresponding to the number of TBs in parallel. The PHY layer controller 1110 inputs a corresponding parameter to each element of the wireless communication unit 110 on the basis of control information acquired from a control channel, for example. For example, the PHY layer controller 1110 inputs parameters for a coding rate and rate matching to the FEC coding unit 1102. In addition, the PHY layer controller 1110 inputs interleave setting to the CW interleaver 1103. Furthermore, the PHY layer controller 1110 inputs a parameter for modulation to the modulation mapper 1104. The PHY layer controller 1110 inputs a parameter for the number of layers to the layer mapper 1105. In addition, the PHY layer controller 1110 inputs a parameter for a codebook to the precoder 1106. Furthermore, the PHY layer controller 1110 inputs a parameter for resource scheduling to the resource element mapper 1107.

It is desirable that the CW interleaver 1103 perform an interleave process prior to execution of a digital modulation process such as PSK or QAM. Accordingly, the CW interleaver 1103 is installed before the modulation mapper 1104 that performs the digital modulation process, as illustrated in FIG. 25. The layer mapper 1105 maps a signal after digital modulation to one or more spatial layers for MIMO. Furthermore, the precoder 1106 maps the one or more spatial layer signals to a number of signals corresponding to the number of antennas or the number of antenna ports. In addition, the resource element mapper 1107 arranges signal points to resource blocks and subcarriers for each antenna signal. The resource element mapper 1107 corresponds to a scheduling function in OFDMA. Then, the OFDM signal generator 1108 performs IFFT to add a cyclic prefix (CP) for as a measure for an inter-symbol interference (ISI). The OFDM signal generator 1108 corresponds to modulation in OFDMA. In addition, the analog RF 1109 performs AD conversion, frequency conversion and the like to transmit a wireless signal.

Meanwhile, the controller 130 may control an FEC coding rate, an interleave length, an interleave pattern, a digital modulation method, the number of layers, a precoder, scheduling and the like on the basis of parameters designated through the control channel.

Figure 26:
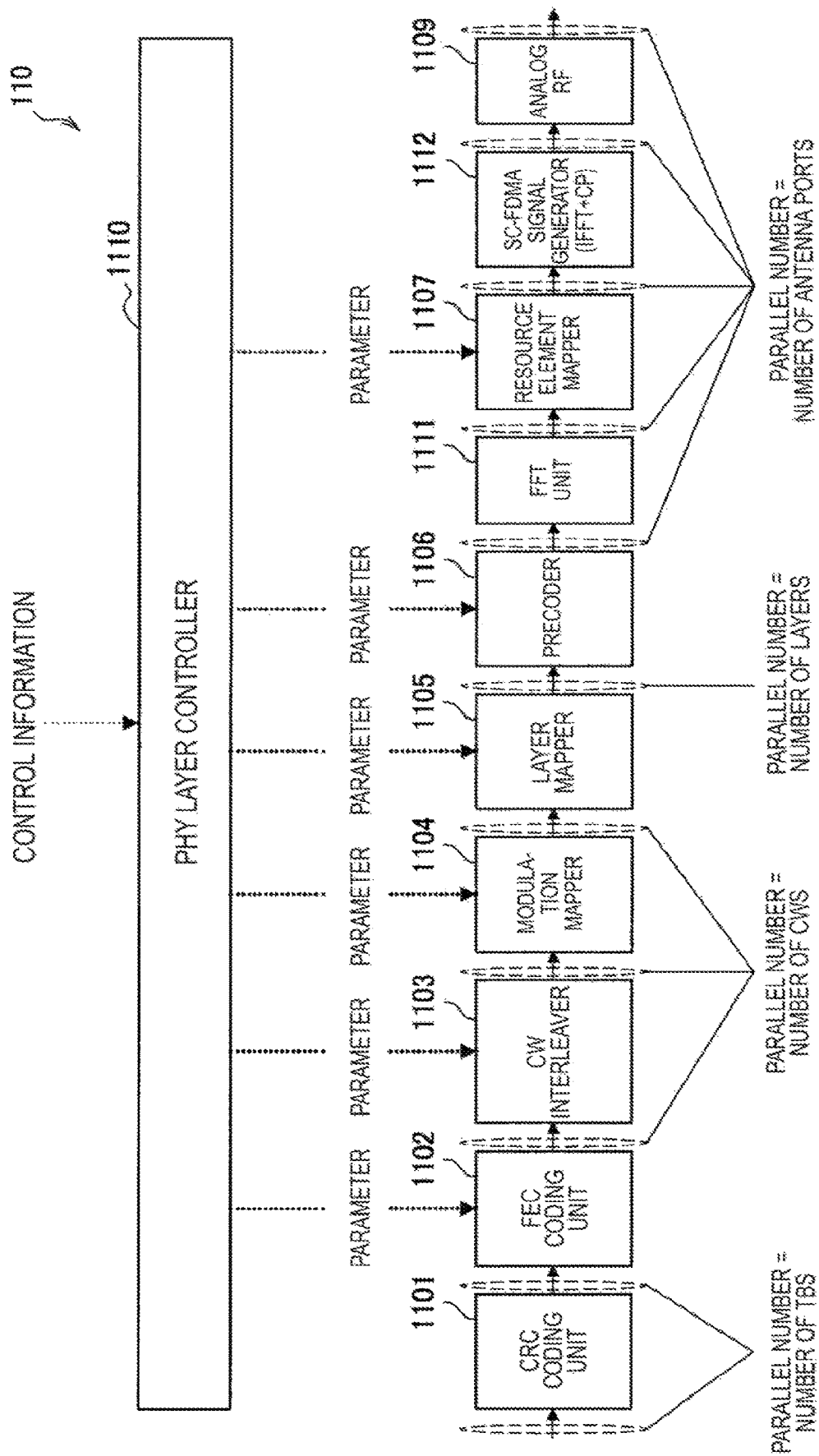
FIG. 26 is a block diagram illustrating an example of a logical configuration of a wireless communication unit of the transmitting station according to the present embodiment.

FIG. 26 is a block diagram illustrating an example of a logical configuration of the wireless communication unit 110 of the transmitting station 100 according to the present embodiment. FIG. 26 shows an example of a configuration when IDMA, SC-FDMA and MIMO are combined. The wireless communication unit 110 illustrated in FIG. 26 additionally includes an FFT unit 1111 performing an FFT in addition to the configuration example illustrated in FIG. 25 and has an SC-FDMA signal generator 1112 instead of the OFDM signal generator 1108.

[4-4-2. Radio Resources Available for Data Transmission]

The quantity of radio resources available for data transmission (e.g., the number $N_{RE}$ of resource elements) may vary according to a used multiplexing method or multiple access method. Accordingly, the interleave length may also vary according to a used multiplexing method or multiple access method. Therefore, the transmitting station 100 calculates the number $N_{RE}$ of resource element available for data transmission depending on the used multiplexing method or multiple access method.

Figure 27:
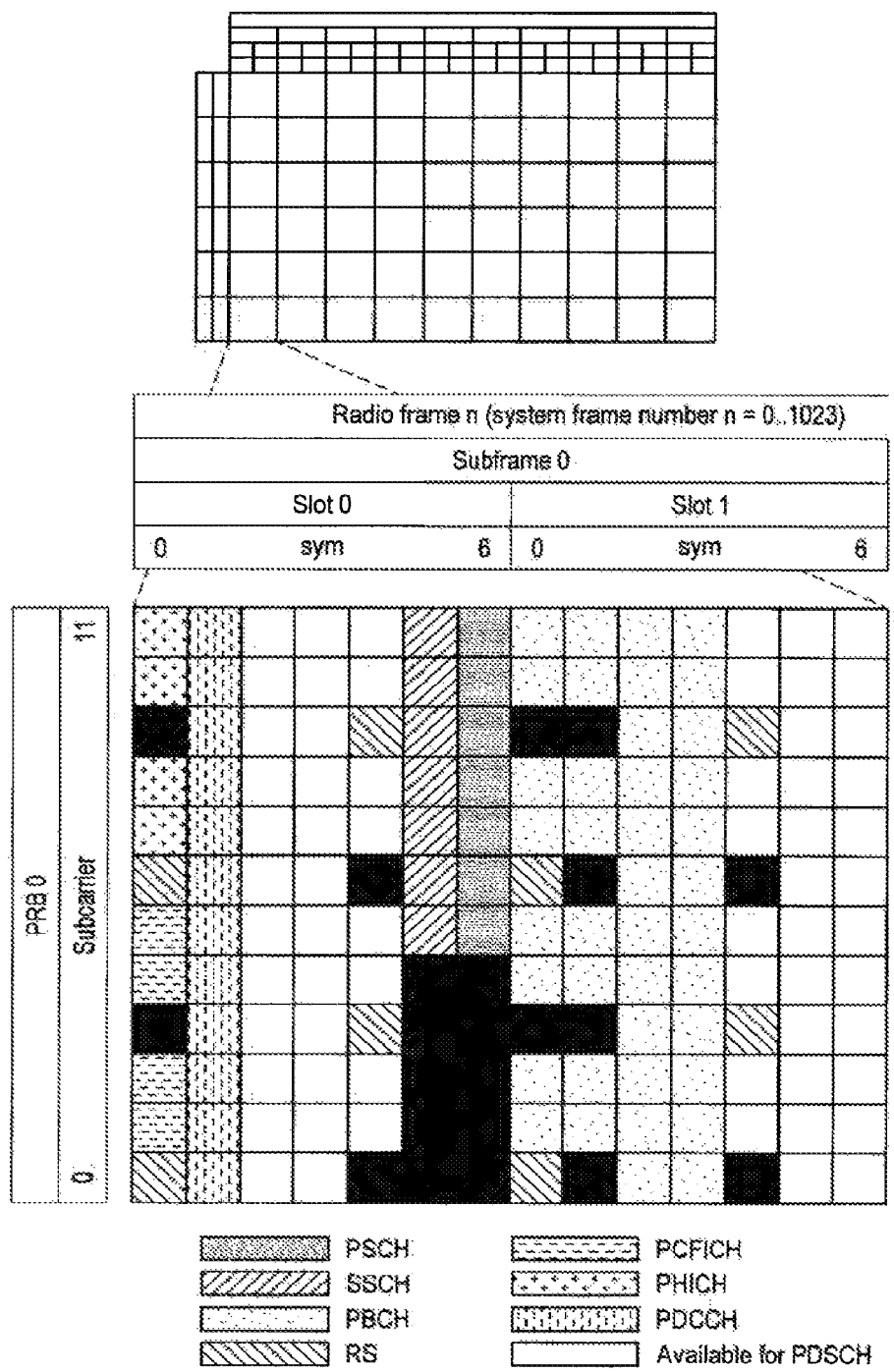
FIG. 27 is an explanatory diagram of a resource grid of OFDMA.

FIG. 27 is an explanatory diagram of a resource grid of OFDMA. FIG. 27 is an enlarged view of a part of a resource grid in which the vertical direction corresponds to a frequency direction (physical resource block (PRB)) and the horizontal direction corresponds to a time direction (subframe). As illustrated in FIG. 27, resource elements include elements for a reference signal, elements for a synchronization signal, elements for a notification signal, elements for a control signal and the like in addition to elements for data transmission (PDSCH). The number and arrangement of such resource elements may vary depending on allocation of radio resources and the like. Accordingly, the transmitting station 100 calculates the number $N_{RE}$ of resource elements available for data transmission on the basis of allocation information of radio resources.

For example, the controller 130 of the transmitting station 100 calculates the number $N_{RE}$ of resource elements available for data transmission using the following formula.

[Math. 10]

$$N_{RE} = \sum_{r \in R} (N_{RE,r} - N_{RS,r} - N_{CCH,r} - N_{BCH,r} - N_{SS,r}) \quad \text{Formula 10}$$

Here, R is a set of indices of resource blocks allocated to a certain user. $N_{RE,r}$ is the total number of resource elements in a resource block r. $N_{RS,r}$ is the total number of elements for a reference signal in the resource block r. $N_{CCH,r}$ is the total number of elements for a control channel in the resource block r. $N_{BCH,r}$ is the total number of elements for a broadcast channel in the resource block r. $N_{SS,r}$ is the total number of elements for a synchronization signal in the resource block r.

For example, when a plurality of layers are multiplexed to a user, the controller 130 may calculate the number $N_{RE}$ of resource elements available for data transmission using the following formula.

[Math. 11]

$$N_{RE} = N_M \sum_{r \in R} (N_{RE,r} - N_{RS,r} - N_{CCH,r} - N_{BCH,r} - N_{SS,r}) \quad \text{Formula 11}$$

Here, $N_M$ is the number of multiplexing layers.

For example, when a spreading technology is used, the controller 130 may calculate the number $N_{RE}$ of resource elements available for data transmission using the following formula.

[Math. 12]

$$N_{RE} = \frac{N_M}{SF} \sum_{r \in R} (N_{RE,r} - N_{RS,r} - N_{CCH,r} - N_{BCH,r} - N_{SS,r}) \quad \text{Formula 12}$$

Here, SF ($\geq 1$) is a spreading factor. When SF=1, the formula 12 is the same as in the case in which the spreading technology is not used (formula 11).

For example, when the number of resource elements available for data transmission is different for each layer, the controller 130 may calculate the number $N_{RE}$ of resource elements available for data transmission using the following formula.

[Math. 13]

$$N_{RE} = \sum_{l \in L} \left\{ \frac{1}{SF_l} \sum_{r \in R_l} \left( N_{RE,r,l} - N_{RS,r,l} - N_{CCH,r,l} - N_{BCH,r,l} - N_{SS,r,l} \right) \right\} \quad \text{Formula 13}$$

Here, L is a set of indices of multiple layers allocated to a certain user.

The layers described above may be spatial layers such as MIMO or spatial division multiplexing (SDM) layers. In addition, the layers described above may be spreading code layers of code division multiple access (CDMA) or sparse code multiple access (SCMA), codeword layers for non-orthogonal multiple access, superposition code layers or codeword layers after an interleave process in IDMA, for example.

[4-5. Processing of Physical Layer in Receiving Station]
(Basic Configuration of Wireless Communication Unit 210)

Figure 28:
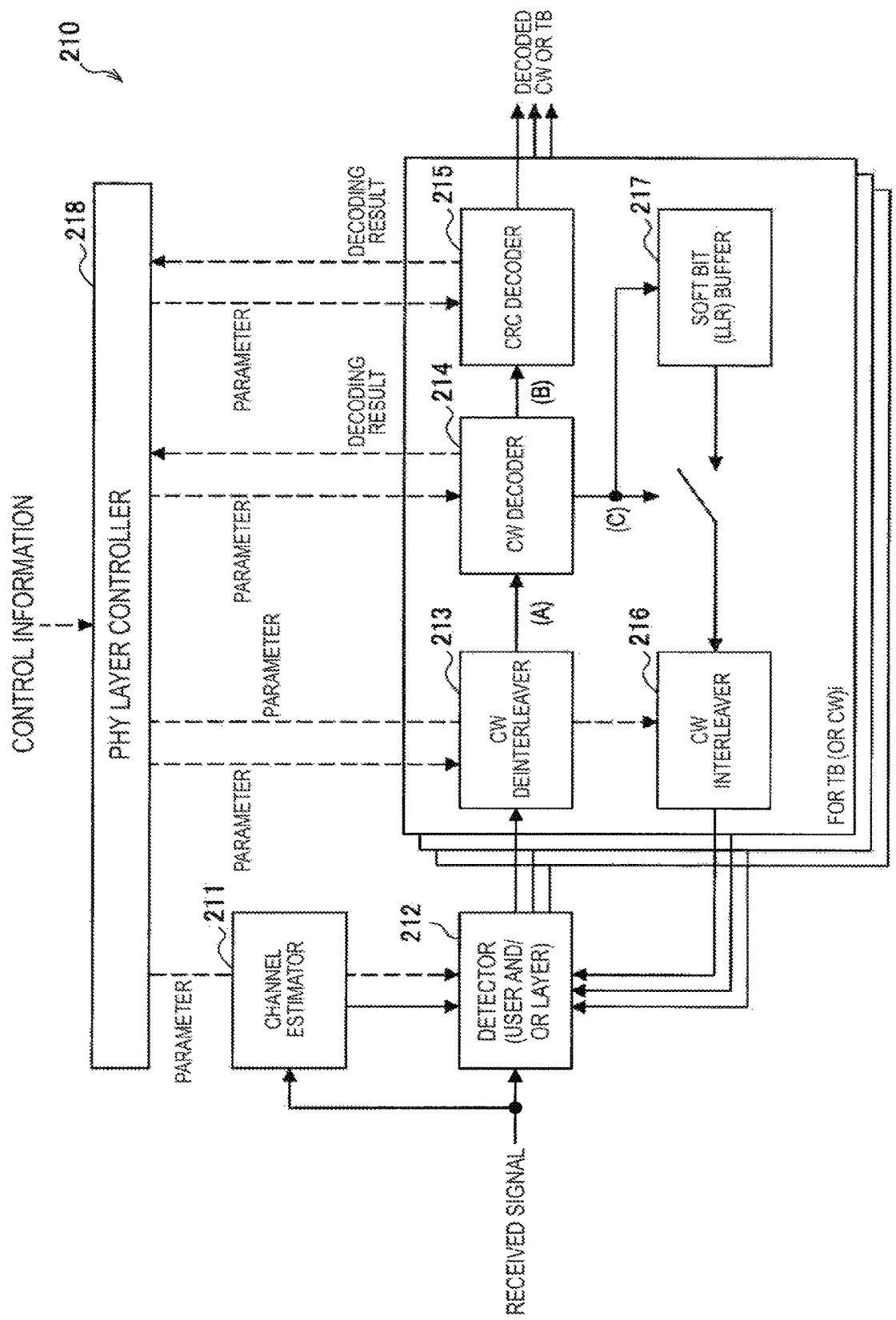
FIG. 28 is a block diagram illustrating an example of a logical configuration of a wireless communication unit of the receiving station according to the present embodiment.

FIG. 28 is a block diagram illustrating an example of a logical configuration of the wireless communication unit 210 of the receiving station 200 according to the present embodiment. FIG. 28 illustrates an example of a configuration of a part of the wireless communication unit 210 in which a signal received from the transmitting station 100 is decoded. As illustrated in FIG. 28, the wireless communication unit 210 includes a channel estimator 211, a detector 212, a CW deinterleaver 213, a CW decoder 214, a CRC decoder 215, a CW interleaver 216, a soft bit buffer 217 and a PHY layer controller 218.

The channel estimator 211 estimates a state of a radio wave propagation channel between the transmitting station 100 and the receiving station 200 from a reference signal included in the received signal. The channel estimator 211 outputs channel information indicating the estimated radio wave propagation channel state to the detector 212.

The detector 212 detects a data part included in the received signal using the channel information output from the channel estimator 211. Such a detection process corresponds to a process of separating user signals or layer signals multiplexed in the received signal or both the user signals and the layer signals. Hereinafter, the detector 212 is called a multiuser/multilayer detector 212. It is desirable that separated signals be output in the form of bit log likelihood ratios (LLR, e.g., values in the range of [−1 to +1]) of CWs corresponding thereto. In addition, the separated signals may be output in the form of hard decision bits (−1 or +1) of the corresponding CWs.

A decoding process corresponding to an interleave length and an interleave pattern used in the transmitting station 100 is performed per TB or CW for output bit values. Here, a decoding process for a TB or a CW having an index i will be described.

The CW deinterleaver 213 performs a deinterleave process using deinterleave setting (a deinterleave length and a deinterleave pattern) corresponding to interleave setting used in the transmitting station 100. Here, the deinterleave length refers to the length of a sequence input to the CW deinterleaver 213. The CW deinterleaver 213 outputs the deinterleaved CW as an input to the CW decoder 214 ((A) in the figure).

The CW decoder 214 performs an FEC decoding process on each deinterleaved CW. The CW decoder 214 outputs the decoded CW to the CRC decoder 215 ((B) in the figure). In addition, when a CRC error is detected by the CRC decoder 215, the CW decoder 214 feeds back the bit value of the corresponding CW ((C) in the figure). The feedback target is the CW interleaver 216 or the soft bit buffer 217. The internal configuration of the CW decoder 214 will be described in detail below.

The CRC decoder 215 performs a CRC detection process on the FEC-decoded CW or TB. When a CRC error is detected, the CRC decoder 215 outputs the decoded CW or TB.

The CW interleaver 216 performs an interleave process on the CW fed back from the CW decoder 214 or the soft bit buffer 217 and outputs the interleaved CW to the multiuser/multilayer detector 212. The CW interleaver 216 performs an interleave process using interleave setting used in the transmitting station 100 corresponding to a transmission source. Here, a series of signal processes through which the multiuser/multilayer detector 212 outputs the CW to the CW deinterleaver 213 and receives a feedback from the CW interleaver 216 may be repeated until decoding succeeds. For example, the decoding process may be repeated until a CRC error of the target CW or TB is not detected or the number of repetitions reaches a maximum number of times. Such a repeated decoding process is called turbo detection or a turbo decoding process.

The soft bit buffer 217 has a function of accumulating decoding results up to the previous reception and feeding the accumulated decoding results back to the multiuser/multilayer detector 212 when the transmitting station 100 performs retransmission. For example, the soft bit buffer 217 accumulates the bit LLR of the CW. In addition, the soft bit buffer 217 outputs decoding results up to the previous reception to the CW interleaver 216 in a process of decoding a retransmitted signal. Accordingly, the wireless communication unit 210 can perform a decoding process using decoding results up to the previous reception when the transmitting station 100 employs CC. When the transmitting station 100 employs IR, the soft bit buffer 217 may output no bit LLR or output a predetermined bit LLR such as a sequence in which all bits are 0, for example.

The PHY layer controller 218 adjusts parameters in response to control information acquired from a control channel. For example, the PHY layer controller 218 sets a parameter of each block of the wireless communication unit 210 according to transmission parameters (allocation resources, a modulation method, a coding method or a decoding rate, etc.) applied to the decoding target CW or TB, transmitted through the control channel. In addition, the PHY layer controller 218 acquires an FEC decoding result of the CW, TB or CB from the CW decoder 214 and a CRC detection result of the CB, TB or CB from the CRC decoder 215. The PHY layer controller 218 controls the repeated decoding process described above on the basis of the FEC decoding result and the CRC detection result.

The wireless communication unit 210 returns an ACK response to the transmitting station 100 corresponding to the transmission source when decoding of the target CW or TB succeeds. On the other hand, the wireless communication unit 210 returns a NACK response to the transmitting station 100 corresponding to the transmission source when decoding of the target CW or TB fails. The transmitting station 100 controls the retransmission process in response to the ACK response and the NACK response.

An example of the configuration of the wireless communication unit 210 has been described. Next, a basic operation process of the decoding process in the receiving station 200 will be described with reference to FIGS. 29 and 30.

(Basic Operation Process of Wireless Communication Unit 210)

Figure 29:
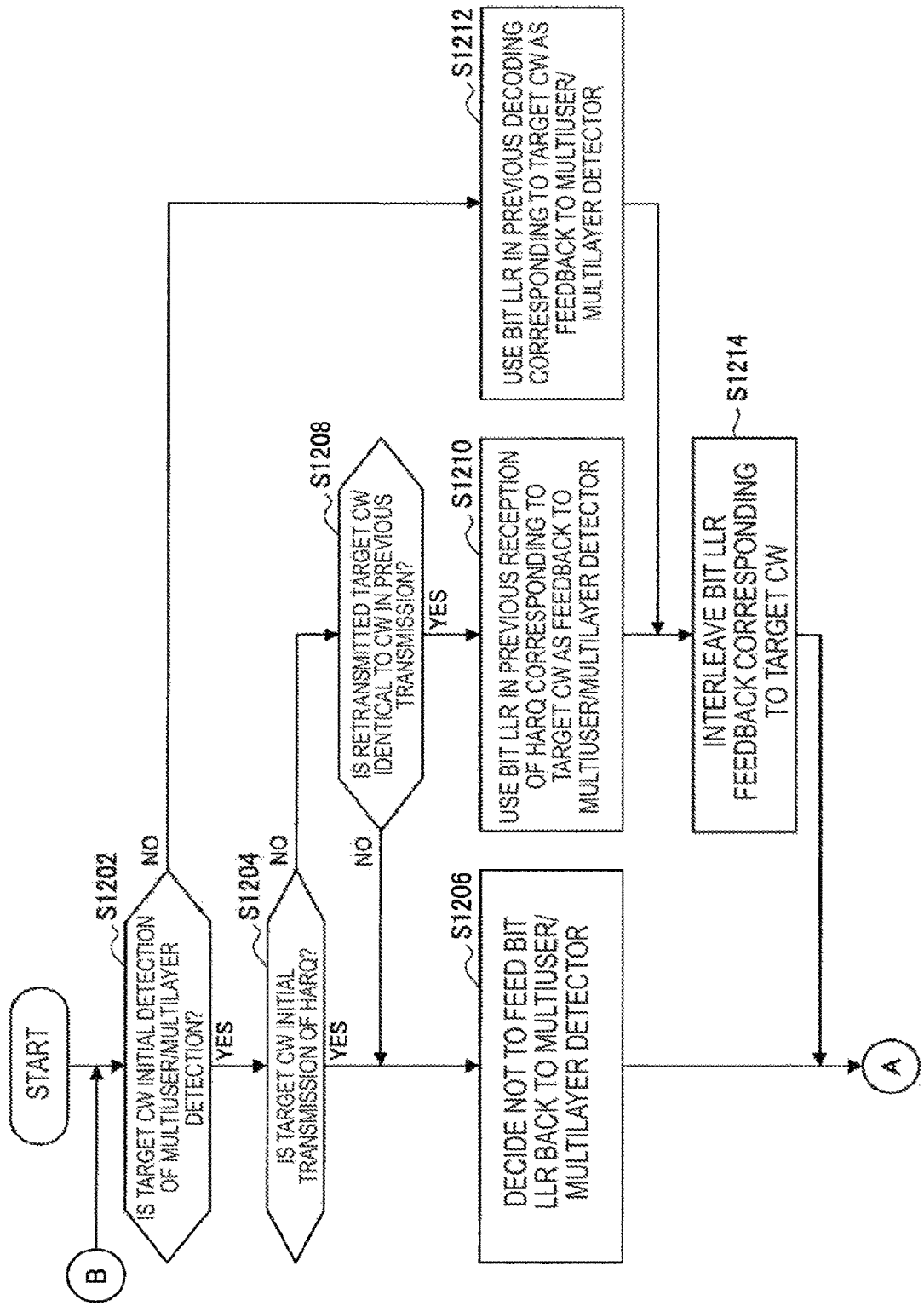
FIG. 29 is an explanatory diagram illustrating an example of the flow of a decoding process through the receiving station according to the present embodiment.
Figure 30:
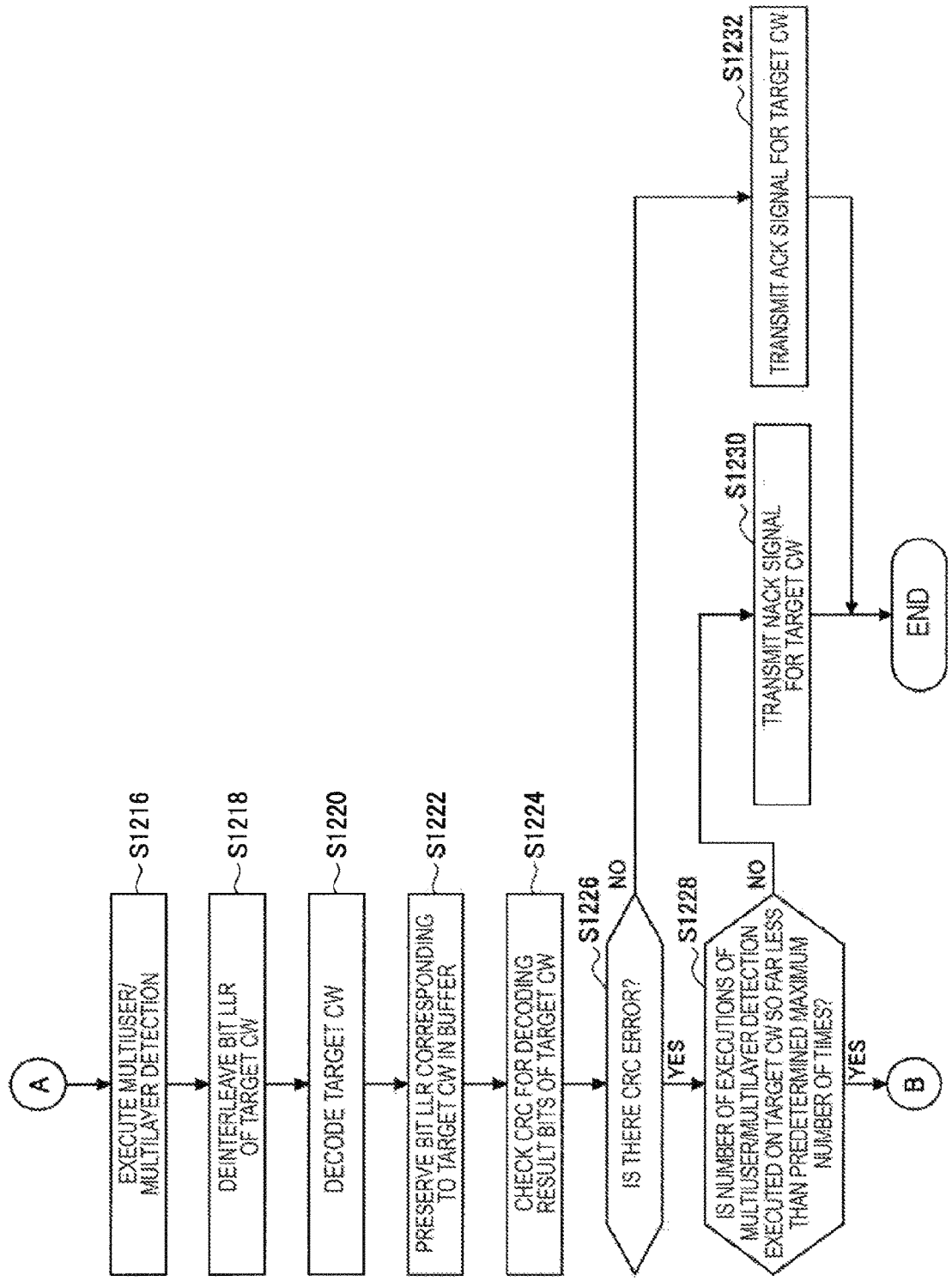
FIG. 30 is an explanatory diagram illustrating an example of the flow of a decoding process through the receiving station according to the present embodiment.

FIGS. 29 and 30 are explanatory diagrams illustrating an example of the flow of a decoding process in the receiving station 200 according to the present embodiment. The flows illustrated in FIGS. 29 and 30 are connected by symbols A and B shown in the figures.

As illustrated in FIG. 29, first of all, the PHY layer controller 218 determines whether the target CW is initially detected in multiuser/multilayer detection in step S1202. For example, the PHY layer controller 218 determines whether the detection process target of the multiuser/multilayer detector 212 is the received signal or an output sequence from the CW interleaver 216.

When it is determined that the target CW is initially detected (S1202/YES), the PHY layer controller 218 determines whether the target CW is initial transmission of an HARQ in step S1204.

When it is determined that the target CW is initial transmission (S1204/YES), the PHY layer controller 218 decides not to feed a bit LLR back to the multiuser/multilayer detector 212 in step S1206. The soft bit buffer 217 may output no bit LLR or output a predetermined bit LLR such as a sequence in which all bits are 0, for example.

When it is determined that the target CW is not initial transmission (S1204/NO), the PHY layer controller 218 determines whether a retransmitted target CW is identical to the previously transmitted CW in step S1208. For example, the PHY layer controller 218 determines that the retransmitted target CW is identical to the previously transmitted CW when the transmitting station 100 employs CC and determines that the retransmitted target CW is not identical to the previously transmitted CW when the transmitting station 100 employs IR.

When it is determined that the retransmitted target CW is identical to the previously transmitted CW (S1208/YES), the PHY layer controller 218 decides to use the bit LLR of HARQ corresponding to the target CW in the previous reception as feedback to the multi-user/multi-layer detector 212. Accordingly, the soft bit buffer 217 outputs the bit LLR of HARQ corresponding to the target CW in the previous reception to the CW interleaver 216. On the other hand, when it is determined that the retransmitted target CW is not identical to the previously transmitted CW (S1208/NO), the process proceeds to step S1206.

When it is determined that the target CW is not initially detected (S1202/NO), the PHY layer controller 218 decides to use the bit LLR corresponding to the target CW in the previous decoding as feedback to the multiuser/multilayer detector 212 in step S1212. Accordingly, the CW decoder 214 outputs the decoded CW to the CW interleaver 216.

Then, the CW interleaver 216 interleaves the feedback of the bit LLR corresponding to the target CW in step S1214.

Subsequently, the multiuser/multilayer detector 212 performs a multiuser/multilayer detection process in step S1216, as illustrated in FIG. 30.

Then, the CW deinterleaver 213 deinterleaves the bit LLR of the target CW in step S1218.

Thereafter, the CW decoder 214 decodes the target CW in step S1220.

Next, the soft bit buffer 217 preserves the bit LLR corresponding to the target CW output from the CW decoder 214 in step S1222.

Subsequently, the CRC decoder 215 performs a CRC check on decoding result bits output from the CW decoder 214 in step S1224.

When a CRC error is detected (S1226/YES), the PHY layer controller 218 determines whether the number of executions of the detection process by the multiuser/multilayer detector 212 performed for the target CW so far is less than a predetermined maximum number of times in step S1228.

When it is determined that the number of executions of the detection process is less than the predetermined maximum number of times (S1228/YES), the process is returned to step S1202 again and the repeated decoding process is performed.

On the other hand, when it is determined that the number of executions of the detection process reaches the predetermined maximum number of times (S1228/NO), the wireless communication unit 210 returns a NACK signal with respect to the target CW in step S1230.

When a CRC error is not detected (S1226/NO), the wireless communication unit 210 returns an ACK signal with respect to the target CW in step S1232.

The basic operation process of the decoding process in the receiving station 200 has been described. The CW in the figure may be changed to a TB.

(Internal Configuration of CW Decoder 214)

Hereinafter, the internal configuration of the CW decoder 214 will be described with reference to FIG. 31.

Figure 31:
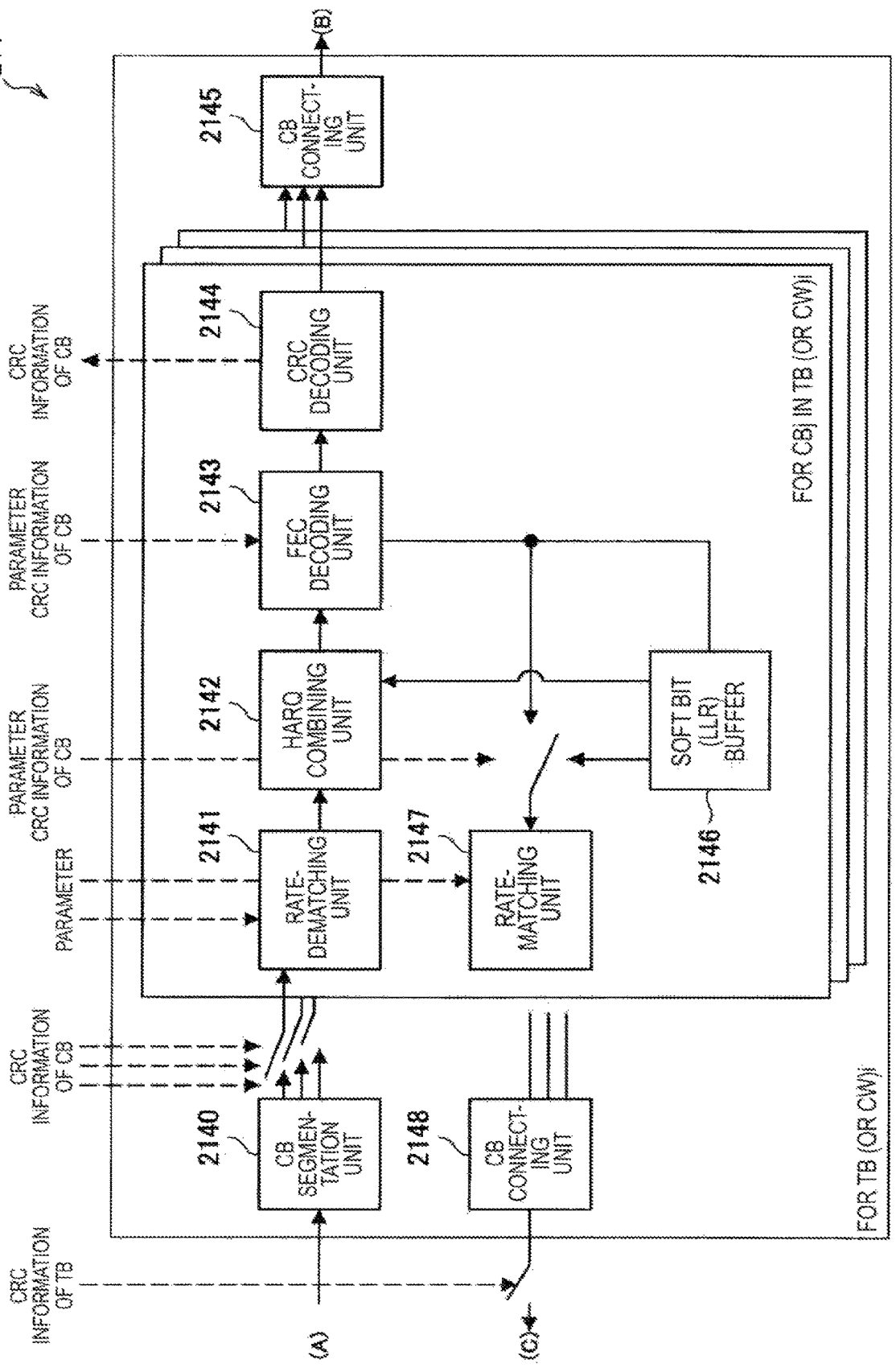
FIG. 31 is a block diagram illustrating an example of a logical configuration of a CW decoder according to the present embodiment.

FIG. 31 is a block diagram illustrating an example of a logical configuration of the CW decoder 214 according to the present embodiment. As illustrated in FIG. 31, the CW decoder 214 includes a CB segmentation unit 2140, a rate-dematching unit 2141, a HARQ combining unit 2142, an FEC decoding unit 2143, a CRC decoding unit 2144, a CB connecting unit 2145, a soft bit buffer 2146, a rate-matching unit 2147 and a CB connecting unit 2148. As illustrated in FIG. 28, the CW decoder 214 may be a block with one input and two outputs. (A), (B) and (C) in FIG. 31 respectively correspond to (A), (B) and (C) in FIG. 28. (B) of FIG. 31 is an output of a CRC detection process of a decoded CW or TB and (C) of FIG. 31 is an output for preservation by the soft bit buffer 217 and feedback to the multiuser/multilayer detector 212.

The CB segmentation unit 2140 segments each CW separated in the multiuser/multilayer detector 212 into one or more corresponding CBs. Accordingly, the following process is a process in units of CB.

The rate-dematching unit 2141 compensates for bits punctured in the transmitting station 100 according to a rate-dematching process.

When a processing target CB is a retransmitted CB according to HARQ, the HARQ combining unit 2142 performs a process of combining bit values (e.g., LLR) preserved up to the previous decoding process with currently received bits. The bit values are preserved in the soft bit buffer 2146. In the case of initial transmission, the HARQ combining unit 2142 does not perform the combining process.

The FEC decoding unit 2143 reproduces transmission bits from the received bits using a decoding method corresponding to FEC coding used in the transmitting station 100. For example, the FEC decoding unit 2143 uses turbo decoding when the FEC coding is turbo coding, Viterbi decoding when the FEC coding is convolutional coding, and sum-product message passing or belief propagation when the FEC coding is LDPC coding.

The CRC decoding unit 2144 performs a CRC detection process for each CB. The FEC decoding unit 2143 may repeat the FEC decoding process until a CRC error is not detected or a predetermined maximum number of times is reached.

The CB connecting unit 2145 combines one or more CBs output from the CRC decoding unit 2144 and outputs the combined CBs ((B) in the figure).

The soft bit buffer 2146 stores a bit sequence (soft bit or bit LLR) decoded by the FEC decoding unit 2143 and outputs the bit sequence to the HARQ combining unit 2142 or the rate-matching unit 2147. In addition, the soft bit buffer 2146 for output to the HARQ combining unit 2142 and the soft bit buffer 2146 for output to the rate-matching unit 2147 may be provided separately.

The rate-matching unit 2147 performs rate matching on the CB (bit LLR) output from the FEC decoding unit 2143 or the soft bit buffer 2146.

The CB connecting unit 2148 combines one or more CBs output from the rate-matching unit 2147 and outputs the combined CBs ((C) in the figure).

(Operation Process of CW Decoder 214)

Figure 32:
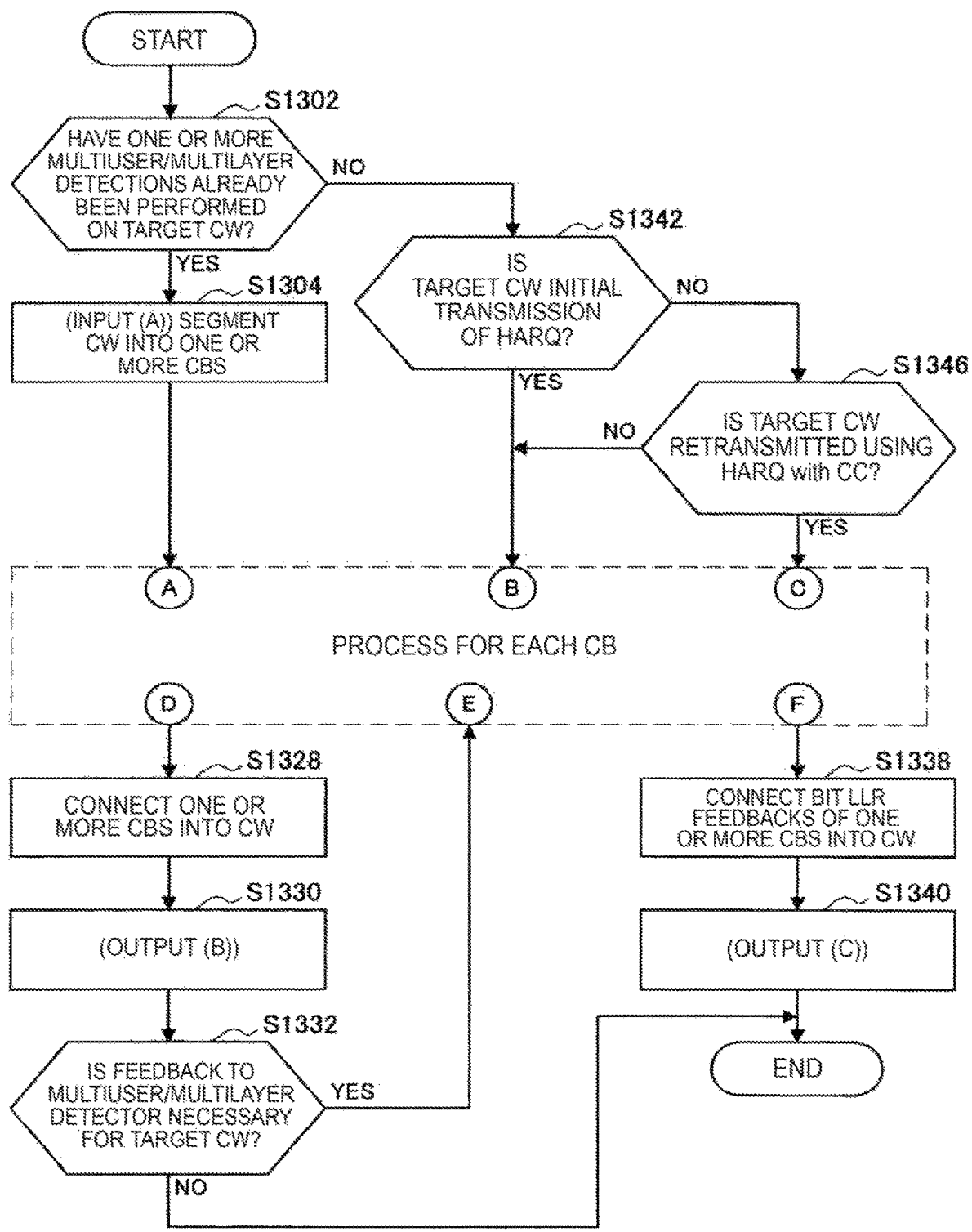
FIG. 32 is an explanatory diagram illustrating an example of the flow of a decoding process through the receiving station according to the present embodiment.
Figure 33:
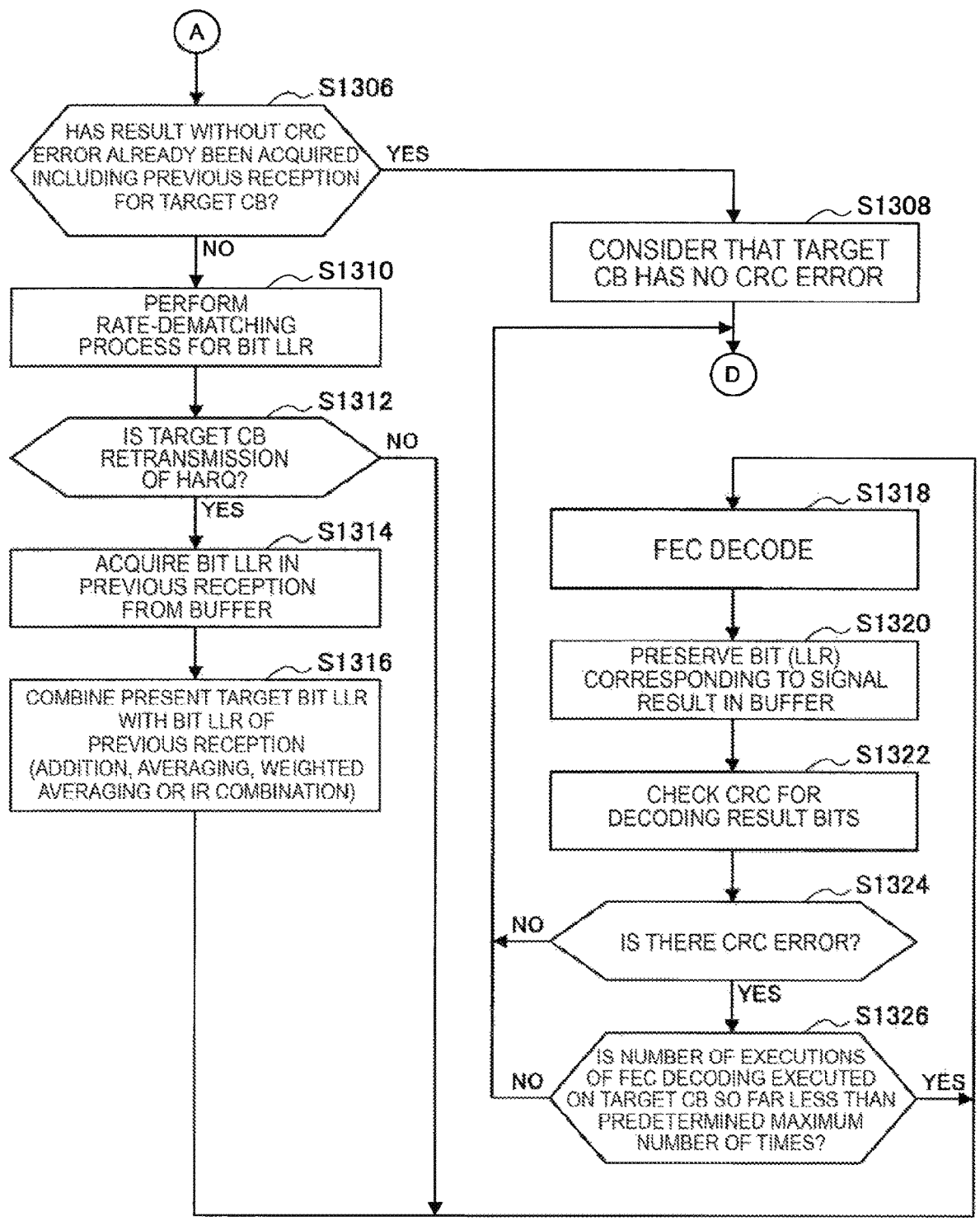
FIG. 33 is an explanatory diagram illustrating an example of the flow of a decoding process through the receiving station according to the present embodiment.
Figure 34:
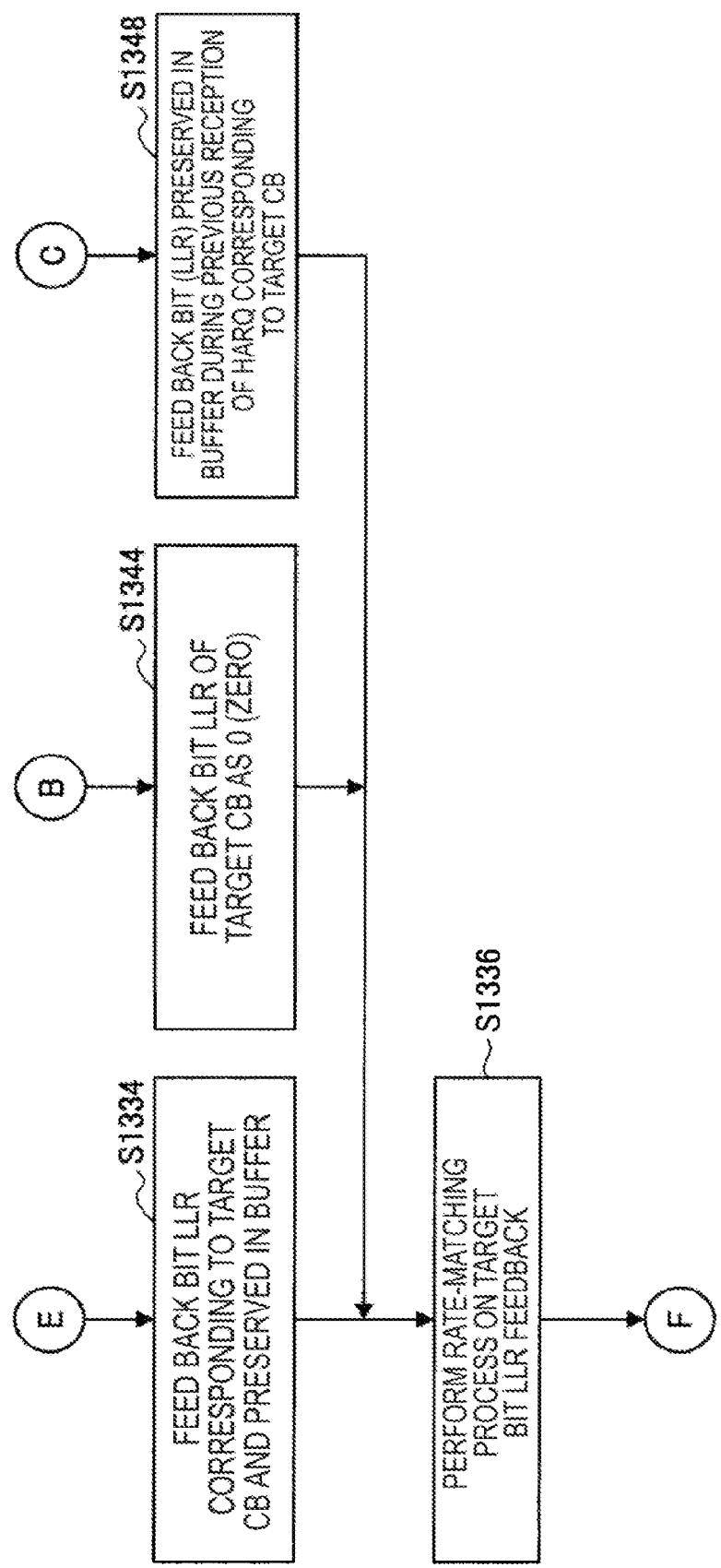
FIG. 34 is an explanatory diagram illustrating an example of the flow of a decoding process through the receiving station according to the present embodiment.

FIGS. 32 to 35 are explanatory diagrams illustrating an example of the flow of a decoding process in the receiving station 200 according to the present embodiment. The flows illustrated in FIGS. 32 to 34 are connected by symbols A to F shown in the figures.

As illustrated in FIG. 32, first of all, the PHY layer controller 218 determines whether one or more multiuser/multilayer detection processes have been performed on a target CW in step S1302.

When it is determined that one or more multiuser/multilayer detection processes have been performed (S1302/YES), the CB segmentation unit 2140 segments the CW into one or more CBs in step S1304. This process corresponds to the input (A) illustrated in FIG. 31. As illustrated in FIG. 32, the following process is performed for each CB.

Subsequently, the PHY layer controller 218 determines whether a result without a CRC error has been acquired in reception including the previous reception for a target CB in step S1306.

When it is determined that a result without a CRC error has been acquired (S1306/YES), the PHY layer controller 218 considers that the target CB has no CRC error in step S1308.

On the other hand, when it is determined that no result without a CRC error has been acquired (S1306/NO), the rate-dematching unit 2141 performs a rate-dematching process for the bit LLR in step S1310.

Then, the PHY layer controller 218 determines whether the target CB is a CB according to retransmission of HARQ in step S1312.

When it is determined that the target CB is a retransmitted CB (S1312/YES), the HARQ combining unit 2142 acquires the bit LLR in the previous reception from the soft bit buffer 2146 in step S1314. When it is determined that the target CB is an initially transmitted CB (S1312/NO), the process proceeds to step S1318 which will be described below.

Subsequently, the HARQ combining unit 2142 combines the current target bit LLR with the bit LLR of the previous reception in step S1316. For example, the HARQ combining unit 2142 may perform addition, averaging, weighted averaging or IR combination.

Thereafter, the FEC decoding unit 2143 performs FEC decoding in step S1318.

Then, the soft bit buffer 2146 preserves soft bits (bit LLR) corresponding to a decoding result from the FEC decoding unit 2143 in step S1320.

Subsequently, the CRC decoding unit 2144 performs a CRC check for decoding result bits from the FEC decoding unit 2143 in step S1322.

When there is a CRC error (S1324/YES), the PHY layer controller 218 determines whether the number of executions of FEC decoding performed for the target CB so far is less than a predetermined maximum number of times in step S1326.

When it is determined that the number of executions of FEC decoding performed so far is less than the predetermined maximum number of times (S1326/YES), the process returns to step S1318 again and FEC decoding is repeated.

When there is no CRC error (S1324/NO) or when it is determined that the number of executions of FEC decoding performed so far reaches the predetermined maximum number of times (S1326/NO), the CB connecting unit 2145 connects the one or more CBs into a CW in step S1328.

In addition, the CB connecting unit 2145 outputs the connected CW in step S1330. This corresponds to the output (B) in FIG. 31.

Next, the PHY layer controller 218 determines whether it is necessary to feed the target CW back to the multiuser/multilayer detector 212 in step S1332. Determination criteria in this case will be described in detail below with reference to FIG. 35.

When it is determined that the feedback is not necessary (S1332/NO), the process is ended.

When it is determined that the feedback is necessary (S1332/YES), the soft bit buffer 2146 feeds back the bit LLR corresponding to the target CB in step S1334. Specifically, the soft bit buffer 2146 outputs the bit LLR corresponding to the target CB to the rate-matching unit 2147.

Then, the rate-matching unit 2147 performs a rate matching process for the target bit LLR feedback in step S1336.

Subsequently, the CB connecting unit 2148 connects bit LLR feedbacks of the one or more CBs into a CW in step S1338.

In addition, the CB connecting unit 2148 outputs the obtained CW in step S1340. This corresponds to the output (C) in FIG. 31.

Meanwhile, when it is determined that multiuser/multilayer detection has not yet been performed on the target CW in step S1302 (S1302/NO), the PHY layer controller 218 determines whether the target CW is a CW according to initial transmission of HARQ in step S1342.

When it is determined that the target CW is an initially transmitted CW (S1342/YES), the soft hit buffer 2146 sets the bit LLR of the target CB to 0 and feeds back the bit LLR in step S344. Then, the process proceeds to step S1336.

On the other hand, when it is determined that the target CW is a retransmitted CW (S1342/NO), the PHY layer controller 218 determines whether the target CW is retransmitted using HARQ with CC in step S1346.

When it is determined that the target CW is retransmitted using HARQ with CC (S1346/YES), the soft bit buffer 2146 feeds back soft bits or a bit LLR preserved during the previous reception of HARQ corresponding to the target CB in step S1348. Then, the process proceeds to step S1336.

On the other hand, when it is determined that the target CW is not retransmitted using HARQ with CC (S1346/NO), the process proceeds to step S1344.

Next, the determination process in step S1332 will be described with reference to FIG. 35.

Figure 35:
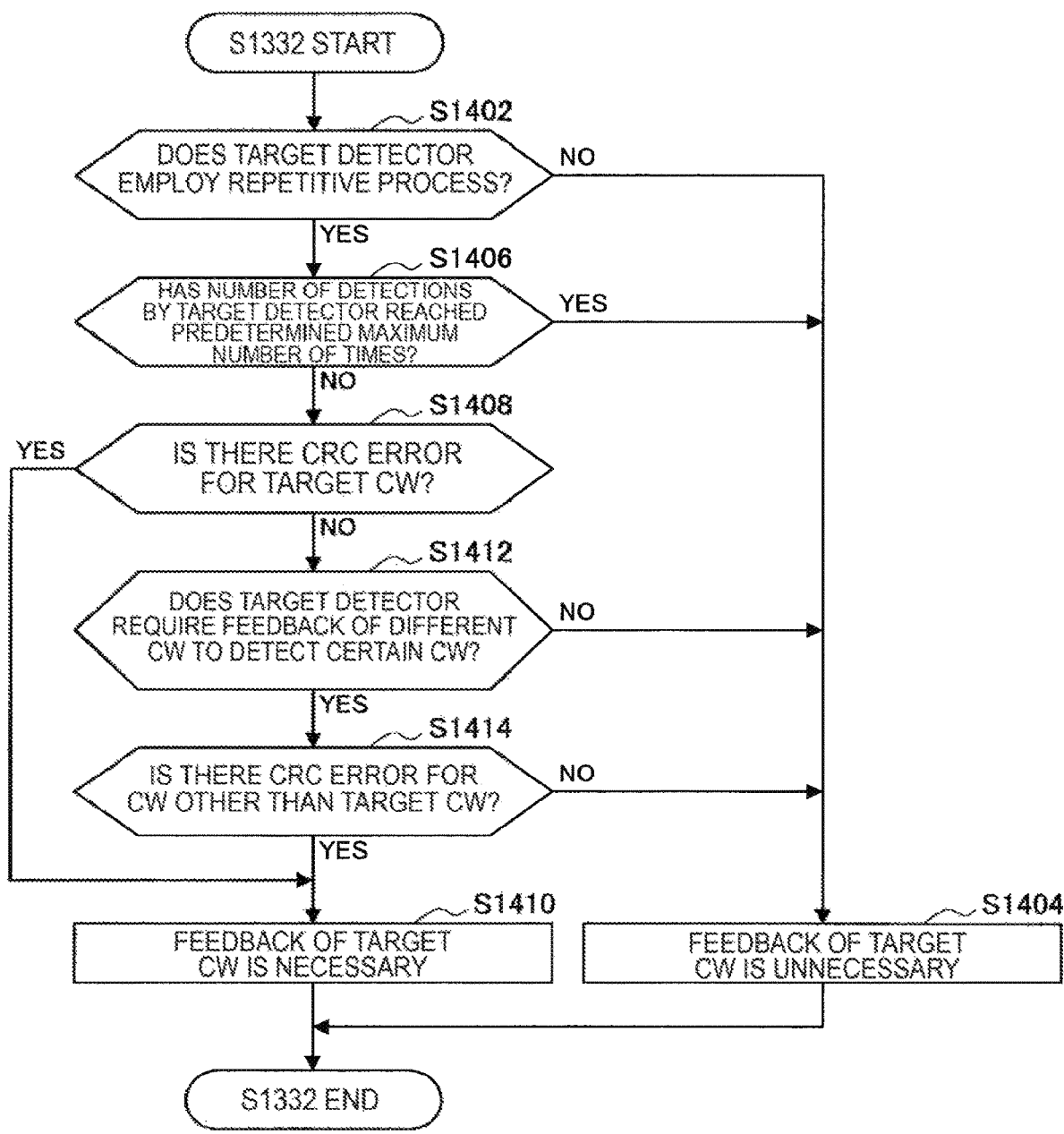
FIG. 35 is an explanatory diagram illustrating an example of the flow of a decoding process through the receiving station according to the present embodiment.

As illustrated in FIG. 35, first of all, the PHY layer controller 218 determines ti whether the target multiuser/multilayer detector 212 employs a repeated process in step S1402.

When it is determined that the target multiuser/multilayer detector 212 does not employ a repeated process (S1402/NO), the PHY layer controller 218 determines that feedback of the target CW is not necessary in step S1404.

When it is determined that the target multiuser/multilayer detector 212 employs a repeated process (S1402/YES), the PHY layer controller 218 determines whether the number of detections by the target multiuser/multilayer detector 212 reaches a predetermined maximum number of times in step S1406.

When it is determined that the number of detections reaches the predetermined maximum number of times (S1406/YES), the process proceeds to step S1404.

On the other hand, when it is determined that the number of detections does not reach the predetermined maximum number of times (S1406/NO), the PHY layer controller 218 determines whether there is a CRC error with respect to the target CW in step S1408.

When it is determined that there is a CRC error (S1408/YES), the PHY layer controller 218 determines that feedback of the target CW is necessary in step S1410.

On the other hand, when it is determined that there is no CRC error (S1408/NO), it is determined whether the target multiuser/multilayer detector 212 requires feedback of another CW for detection of a certain CW in step S1412.

When it is determined that feedback of another CW is required (S1412/YES), it is determined whether there is a CRC error with respect to a CW other than the target CW in step S1414.

When it is determined that there is a CRC error with respect to a CW other than the target CW (S1414/YES), the process proceeds to step S1410.

On the other hand, when it is determined that feedback of another CW is not required (S1412/NO) or when it is determined that there is no CRC error with respect to a CW other than the target CW (S1414/NO), the process proceeds to step S1404.

The decoding process in the CW decoder 214 has been described. Incidentally, the CW in the figure may be changed to a TB.

[4-6. Deinterleave Setting]

The receiving station 200 according to the present embodiment performs a deinterleave process using deinterleave setting corresponding to the interleave setting used by the transmitting station 100. Accordingly, the controller 230 of the receiving station 200 decides deinterleave setting corresponding to the interleave length used by the transmitting station 100. Therefore, the receiving station 200 can correctly detect and decode a received signal.

The controller 230 decides a deinterleave length through a process corresponding to the interleave length decision process in the transmitting station 100. For example, the controller 230 decides a deinterleave length G on the basis of the number $N_{RE}$ of resource elements and the bit multiplex number $Q_m$ per resource element used for data transmission by the transmitting station 100. The sequence of this decision process may be changed depending on the type of the receiving station 200. Hereinafter, an example of the deinterleave length decision process depending on the type of the receiving station 200 will be described.

(Relation with Receiving Station Type)

(A) Receiving Station to which Radio Resources to be Received are Allocated by Other Devices For example, the receiving station 200 is a UE in a cellular system. Hereinafter, a method of deciding the deinterleave length G will be described with reference to FIG. 36.

Figure 36:
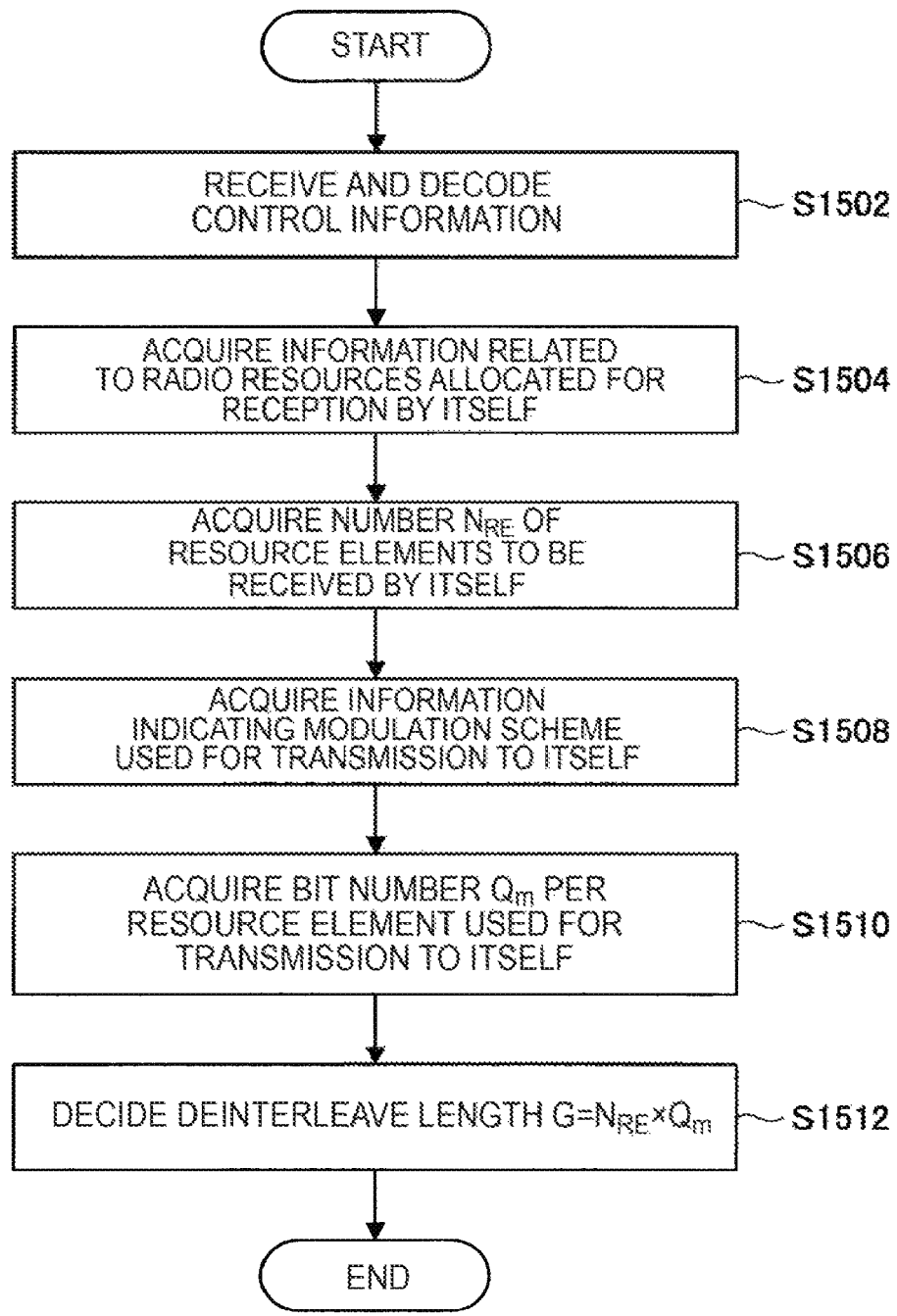
FIG. 36 is a flowchart illustrating an example of the flow of a deinterleave length decision process executed in the receiving station according to the present embodiment.

FIG. 36 is a flowchart illustrating an example of the flow of a deinterleave length decision process executed in the receiving station 200 according to the present embodiment.

First of all, the wireless communication unit 210 receives and decodes control information in step S1502. For example, the wireless communication unit 210 receives and decodes control information transmitted from an eNB using a control channel.

Then, the controller 230 acquires information about radio resources allocated for reception of the receiving station 200 in step S1504. This information may be included in the control information, for example.

Thereafter, the controller 230 acquires the number $N_{RE}$ of resource elements to be received thereby in step S1506. For example, the controller 230 acquires information indicating the number $N_{RE}$ of resource elements used for data transmission by the transmitting station 100 from the control information. For example, when the number of allocations of resources in the frequency direction is previously determined such as a case in which the entire band is allocated to the transmitting station 100, the processes in steps S1504 and S1506 may be omitted.

Subsequently, in step S1508, the controller 230 acquires information indicating a modulation scheme used for transmission to the receiving station 200 from the control information, received in step S1502. The information indicating the modulation scheme may be information that directly designates the modulation scheme, such as a CQI in LTE. In addition, the information indicating the modulation scheme may be information that indirectly designates the modulation scheme, such as an MCS in LTE. It is desirable that the information indicating the modulation scheme be previously specified in the wireless communication system 1.

Then, the controller 230 acquires the bit number $Q_m$ per resource element, used for transmission to the receiving station 200 in step S1510. For example, the controller 230 acquires the bit number $Q_m$ per resource element from the modulation scheme indicated by the information acquired in step S1508. When the control information includes information indicating the bit number $Q_m$ per resource element, the controller 230 may acquire the bit number $Q_m$ per resource element from the control information.

Thereafter, the controller 230 decides the deinterleave length G in step S1512 For example, the controller 230 decides the deinterleave length G as $G=N_{RE} \times Q_m$.

(B) Receiving Station Allocating (or Deciding) Radio Resources to be Received by Itself For example, the receiving station 200 is an eNB in a cellular system. In addition, the receiving station 200 is a device of the wireless communication system 1 having no radio resource allocation, for example. Hereinafter, a method of deciding the deinterleave length G will be described with reference to FIG. 37.

Figure 37:
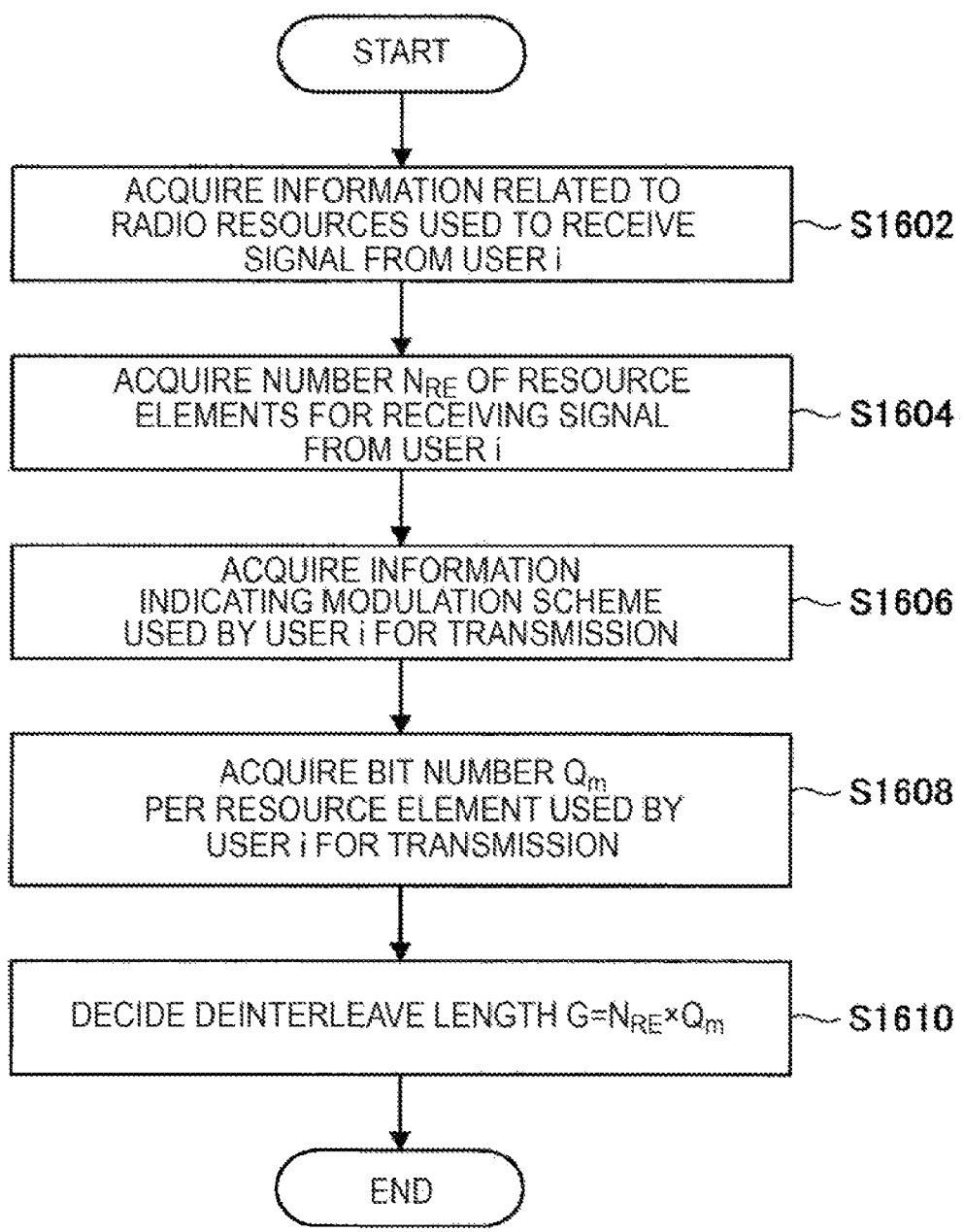
FIG. 37 is a flowchart illustrating an example of the flow of a deinterleave length decision process executed in the receiving station according to the present embodiment.

FIG. 37 is a flowchart illustrating an example of the flow of a deinterleave length decision process executed in the receiving station 200 according to the present embodiment. In this flow, a processing example when reception from a user i is performed will be described on the assumption of one-to-on reception. In the case of multiple-to-one reception, there are multiple user indices i.

As illustrated in FIG. 37, first of all, the controller 230 acquires information related to radio resources used for the receiving station 200 to receive signals from the user i in step S1602.

Subsequently, the controller 230 acquires the number $N_{RE}$ of resource elements for receiving signals from the user i in step S1604. When the number of resources allocated in the frequency direction is previously decided, the processes in steps S1602 and S1604 may be omitted.

Then, the controller 230 acquires information indicating a modulation scheme used by the user i for transmission in step S1606.

Thereafter, the controller 230 acquires the bit number $Q_m$ per resource elements used by the user i for transmission in step S1608.

Then, the controller 230 decides the deinterleave length G in step S1610. For example, the controller 130 decides the deinterleave length G as $G=N_{RE} \times Q_m$.

An example of the flow the deinterleave length decision process has been described.

(Relation with HARQ Type)

Next, an example of a deinterleave length decision process depending on an HARQ type used in the transmitting station 100 will be described with reference to FIG. 38.

Figure 38:
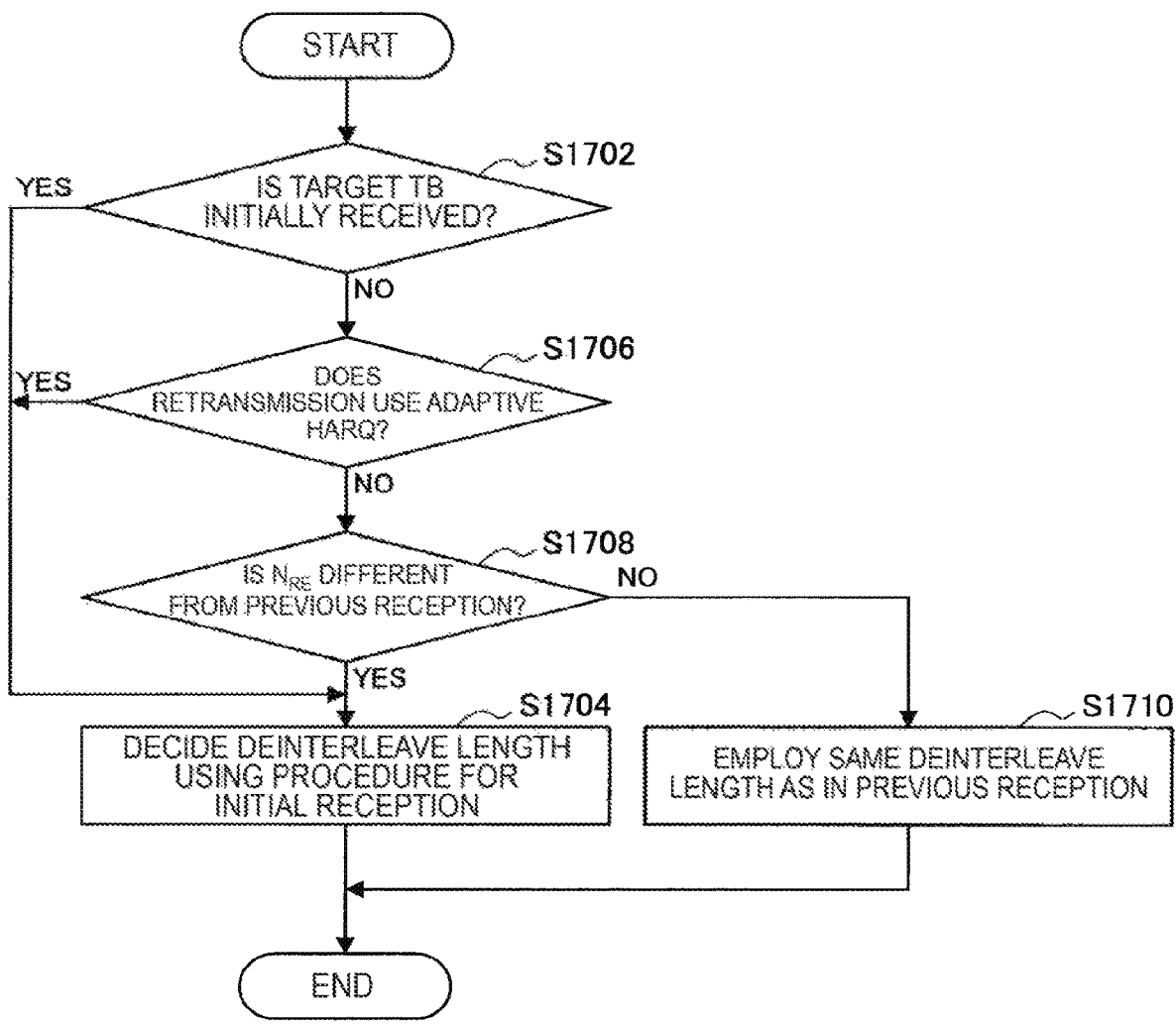
FIG. 38 is a flowchart illustrating an example of the flow of a deinterleave length decision process executed in the receiving station according to the present embodiment.

FIG. 38 is a flowchart illustrating an example of the flow of a deinterleave length decision process executed in the receiving station 200 according to the present embodiment.

As illustrated in FIG. 38, first of all, the controller 230 determines whether a target TB is an initially received TB in step S1702.

When it is determined that the target TB is an initially received TB (S1702/YES), the controller 230 decides a deinterleave length through a procedure for initial reception in step S1704. Here, the procedure for initial reception refers to the sequences described as examples in FIGS. 36 and 37.

When it is determined that the target TB is not an initially received TB (S1702/NO), the controller 230 determines whether retransmission using adaptive HARQ has been performed in step S1706.

When it is determined that retransmission using adaptive HARQ has been performed (S1706/YES), the process proceeds to step S1704 and the controller 230 decides the deinterleave length through the procedure for initial reception.

On the other hand, when it is determined that retransmission using non-adaptive HARQ has been performed (S1706/NO), the controller 230 determines whether the number $N_{RE}$ of resource elements used for data transmission by the transmitting station 100 differs from that in the previous reception in step S1708.

When it is determined that the number $N_{RE}$ of resource elements differs from that in the previous reception (S1708/YES), the process proceeds to step S1704 and the controller 230 decides the deinterleave length through the procedure for initial transmission.

On the other hand, when it is determined that the number $N_{RE}$ of resource elements is identical to that in the previous reception (S1708/NO), the controller 230 employs the same deinterleave length as in the previous reception again in step S1710.

[4-7. Control Information]

Hereinafter, specific examples of control information (information element) transmitted and received between devices included in the wireless communication system 1 will be described.

As an example, control information announced by an eNB to other devices is shown in the following table 4. The control information shown in Table 4 may be announced by the eNB to a UE, may be announced using a control channel such as a PDCCH and may be announced to any other devices. Here, the eNB has a scheduling function of allocating a resource block, a modulation method, a coding method and the like, and the operation of the UE is controlled by an eNB corresponding to an access target. In addition, the eNB may perform control related to an interleave process and a deinterleave process like scheduling. "Target communication" in Table 4 may be any of downlink, uplink and D2D communication.

TABLE 4

| Information Element | Description |
| --- | --- |
| Control Information Format | Represents format of control information. |
| Link Format | Represents downlink/uplink/D2D, etc. |
| Duplex Format | Represents FDD/TDD. |
| Frame Configuration Format | Represents TDD frame configuration format. |
| Resource Block Allocation | Represents positions of resource blocks allocated to target communication (and TB or CW). |
| Modulation and Coding Set | Represents modulation and coding schemes to be used in target communication (and TB or CW). |
| HARQ Process Number | Represents HARQ process number of target communication (and TB or CW). |
| New Data Indicator | Represents whether target communication (and TB or CW) is new (initial transmission). |
| Redundancy Version | Represents redundancy version of target communication (and TB or CW)(related to HARQ with IR). |
| Scrambler/Interleaver Format | Represents format (pattern) of frequency band converter/interleaver to be used in target communication (and TB or CW). |
| Interleaver Offset Indicator | Represents offset value of interleaver to be used in target communication (and TB or CW). |
| ACK/NACK Flag | Fundamentally represents success/failure of communication (and TB or CW) prior to transmission of this information. |

As another example, control information announced by a UE to other devices is shown in the following table 5. The control information shown in Table 5 may be announced by a UE controlled by an eNB to the eNB or announced to any other devices.

TABLE 5

| Information Element | Description |
| --- | --- |
| Control Information Format | Represents format of control information. |
| HARQ Process Number | Represents HARQ process number of target communication (and TB or CW). |
| New Data Indicator | Represents whether target communication (and TB or CW) is new (initial transmission). |
| Redundancy Version | Represents redundancy version of target communication (and TB or CW)(related to HARQ with IR). |

TABLE 5-continued

| Information Element | Description |
| --- | --- |
| Scrambler/Interleaver Format | Represents format (pattern) of frequency band converter/interleaver to be used in target communication (and TB or CW). |
| Interleaver Offset Indicator | Represents offset value of interleaver to be used in target communication (and TB or CW). |
| ACK/NACK Flag | Fundamentally represents success/failure of communication (and TB or CW) prior to transmission of this information. |
| Interleaver Capability Flag | Represents possibility of supporting IDMA. |

The control information shown in Table 5 does not include the information related to scheduling, included in the control information shown in Table 4, and includes information indicating possibility of supporting IDMA. An eNB that has received the control information shown in Table 5 can perform more efficient scheduling in consideration of both a UE capable of supporting IDMA and a UE incapable of supporting IDMA using the information indicating possibility of supporting IDMA.

<5. Application Examples>

The technology of the present disclosure is applicable to various products. For example, the communication control device 300 may be realized as any type of server such as a tower server, a rack server, and a blade server. The communication control device 300 may be a control module (such as an integrated circuit module including a single die, and a card or a blade that is inserted into a slot of a blade server) mounted on a server.

For example, a transmitting station 100 or a receiving station 200 may be realized as any type of evolved Node B (eNB) such as a macro eNB, and a small eNB. A small eNB may be an eNB that covers a cell smaller than a macro cell, such as a pico eNB, micro eNB, or home (femto) eNB. Instead, the transmitting station 100 or the receiving station 200 may be realized as any other types of base stations such as a NodeB and a base transceiver station (BTS). The transmitting station 100 or the receiving station 200 may include a main body (that is also referred to as a base station device) configured to control wireless communication, and one or more remote radio heads (RRH) disposed in a different place from the main body. Additionally, various types of terminals to be discussed later may also operate as the transmitting station 100 or the receiving station 200 by temporarily or semi-permanently executing a base station function.

For example, the transmitting station 100 or the receiving station 200 may be realized as a mobile terminal such as a smartphone, a tablet personal computer (PC), a notebook PC, a portable game terminal, a portable/dongle type mobile router, and a digital camera, or an in-vehicle terminal such as a car navigation device. The transmitting station 100 or the receiving station 200 may also be realized as a terminal (that is also referred to as a machine type communication (MTC) terminal) that performs machine-to-machine (M2M) communication. Furthermore, the transmitting station 100 or the receiving station 200 may be a communication module (such as an integrated circuit module including a single die) mounted on each of the terminals.

[5.1. Application Example Regarding a Communication Control Device]

Figure 39:
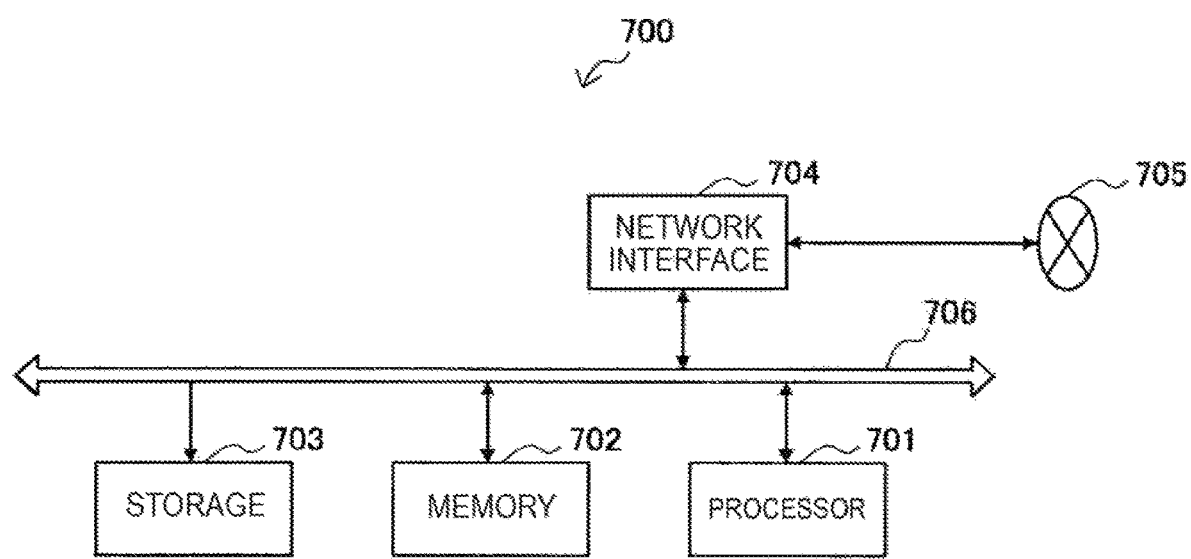
FIG. 39 is a block diagram illustrating an example of a schematic configuration of a server.

FIG. 39 is a block diagram illustrating an example of a schematic configuration of a server 700 to which the technology of the present disclosure may be applied. The server 700 includes a processor 701, a memory 702, a storage 703, a network interface 704, and a bus 706.

The processor 701 may be, for example, a central processing unit (CPU) or a digital signal processor (DSP), and controls functions of the server 700. The memory 702 includes random access memory (RAM) and read only memory (ROM), and stores a program that is executed by the processor 701 and data. The storage 703 may include a storage medium such as a semiconductor memory and a hard disk.

The network interface 704 is a wired communication interface for connecting the server 700 to a wired communication network 705. The wired communication network 705 may be a core network such as an Evolved Packet Core (EPC), or a packet data network (PDN) such as the Internet.

The bus 706 connects the processor 701, the memory 702, the storage 703, and the network interface 704 to each other. The bus 706 may include two or more buses (such as a high speed bus and a low speed bus) each of which has different speed.

The server 700 shown in FIG. 39 may include functions as the communication control device 300. In the server 700, the communication unit 310, the storage unit 320, and the controller 330 described with reference to FIG. 8 may be implemented by the processor 701.

[5-2. Application Examples Regarding Base Stations]

First Application Example

Figure 40:
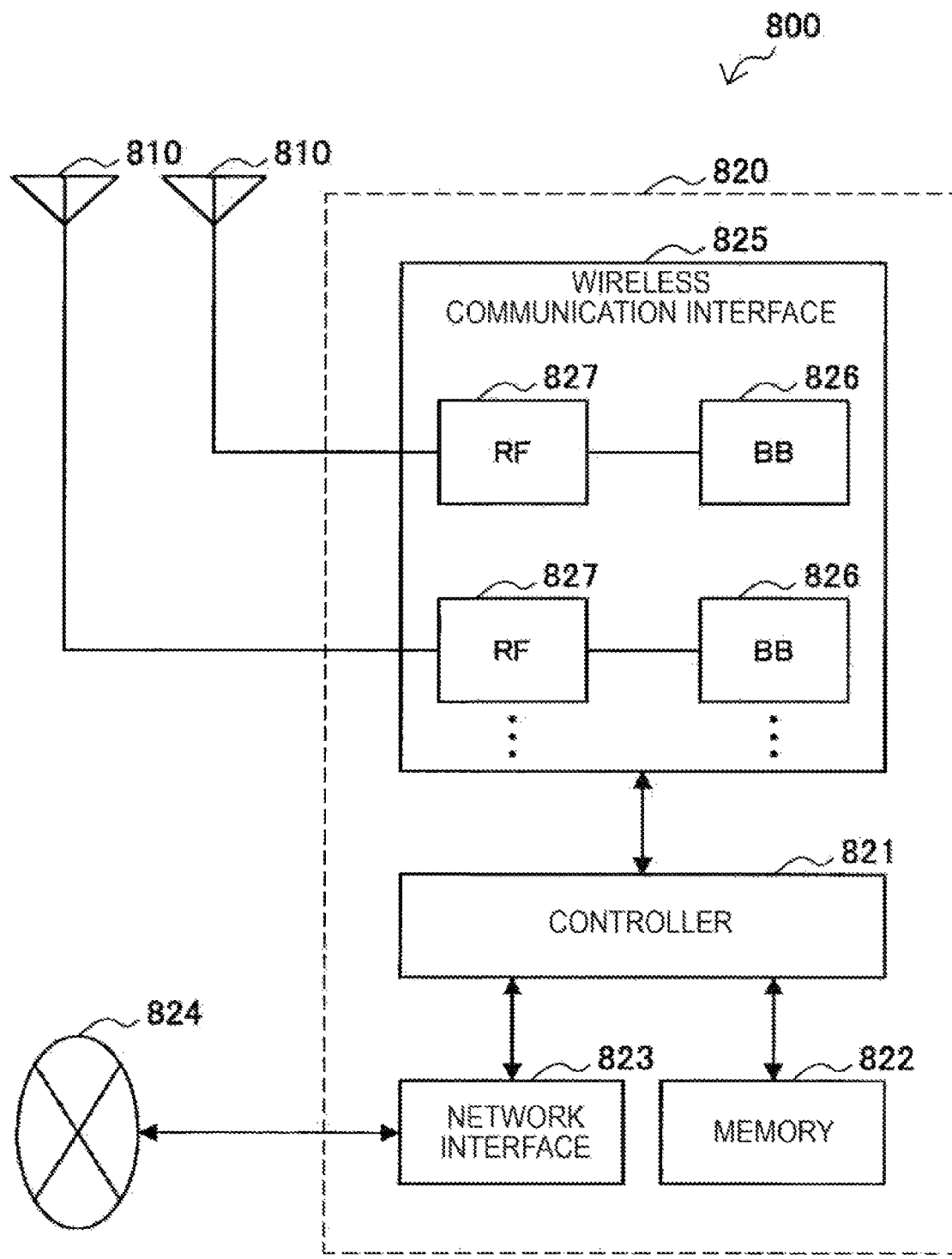
FIG. 40 is a block diagram illustrating a first example of a schematic configuration of an eNB.

FIG. 40 is a block diagram illustrating a first example of a schematic configuration of an eNB to which the technology of the present disclosure may be applied. An eNB 800 includes one or more antennas 810 and a base station device 820. Each antenna 810 and the base station device 820 may be connected to each other via an RF cable.

Each of the antennas 810 includes a single or multiple antenna elements (such as multiple antenna elements included in an MIMO antenna), and is used for the base station device 820 to transmit and receive wireless signals. The eNB 800 may include the multiple antennas 810, as illustrated in FIG. 40. For example, the multiple antennas 810 may be compatible with multiple frequency bands used by the eNB 800. Although FIG. 40 illustrates the example in which the eNB 800 includes the multiple antennas 810, the eNB 800 may also include a single antenna 810.

The base station device 820 includes a controller 821, a memory 822, a network interface 823, and a wireless communication interface 825.

The controller 821 may be, for example, a CPU or a DSP, and operates various functions of a higher layer of the base station device 820. For example, the controller 821 generates a data packet from data in signals processed by the wireless communication interface 825, and transfers the generated packet via the network interface 823. The controller 821 may bundle data from multiple base band processors to generate the bundled packet, and transfer the generated bundled packet. The controller 821 may have logical functions of performing control such as radio resource control, radio bearer control, mobility management, admission control, and scheduling. The control may be performed in corporation with an eNB or a core network node in the vicinity. The memory 822 includes RAM and ROM, and stores a program that is executed by the controller 821, and various types of control data (such as a terminal list transmission power data, and scheduling data).

The network interface 823 is a communication interface for connecting the base station device 820 to a core network 824. The controller 821 may communicate with a core network node or another eNB via the network interface 823. In that case, the eNB 800, and the core network node or the other eNB may be connected to each other through a logical interface (such as an SI interface and an X2 interface). The network interface 823 may also be a wired communication interface or a wireless communication interface for radio backhaul. If the network interface 823 is a wireless communication interface, the network interface 823 may use a higher frequency band for wireless communication than a frequency band used by the wireless communication interface 825.

The wireless communication interface 825 supports any cellular communication scheme such as Long Term Evolution (LTE) and LTE-Advanced, and provides radio connection to a terminal positioned in a cell of the eNB 800 via the antenna 810. The wireless communication interface 825 may typically include, for example, a baseband (BB) processor 826 and an RF circuit 827. The BB processor 826 may perform, for example, encoding/decoding, modulating/demodulating, and multiplexing/demultiplexing, and performs various types of signal processing of layers (such as L1, medium access control (MAC), radio link control (RLC), and a packet data convergence protocol (PDCP)). The BB processor 826 may have a part or all of the above-described logical functions instead of the controller 821. The BB processor 826 may be a memory that stores a communication control program, or a module that includes a processor and a related circuit configured to execute the program. Updating the program may allow the functions of the BB processor 826 to be changed. The module may be a card or a blade that is inserted into a slot of the base station device 820. Alternatively, the module may also be a chip that is mounted on the card or the blade. Meanwhile, the RF circuit 827 may include, for example, a mixer, a filter, and an amplifier, and transmits and receives wireless signals via the antenna 810.

The wireless communication interface 825 may include the multiple BB processors 826, as illustrated in FIG. 40. For example, the multiple BB processors 826 may be compatible with multiple frequency bands used by the eNB 800. The wireless communication interface 825 may include the multiple RF circuits 827, as illustrated in FIG. 40. For example, the multiple RF circuits 827 may be compatible with multiple antenna elements. Although FIG. 40 illustrates the example in which the wireless communication interface 825 includes the multiple BB processors 826 and the multiple RF circuits 827, the wireless communication interface 825 may also include a single BB processor 826 or a single RF circuit 827.

Second Application Example

Figure 41:
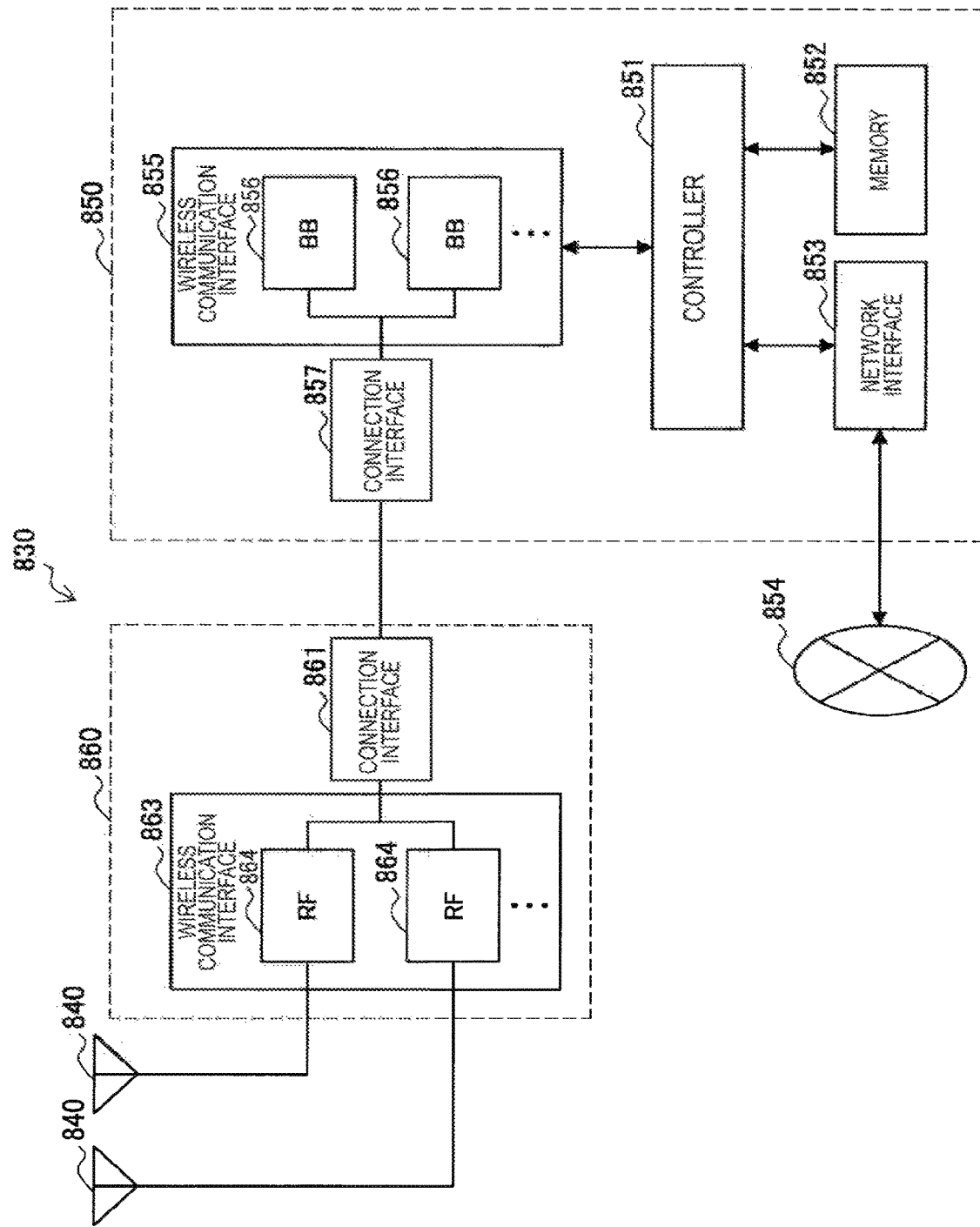
FIG. 41 is a block diagram illustrating a second example of the schematic configuration of the eNB.

FIG. 41 is a block diagram illustrating a second example of a schematic configuration of an eNB to which the technology of the present disclosure may be applied. An eNB 830 includes one or more antennas 840, a base station device 850, and an RRH 860. Each antenna 840 and the RRH 860 may be connected to each other via an RF cable. The base station device 850 and the RRH 860 may be connected to each other via a high speed line such as an optical fiber cable.

Each of the antennas 840 includes a single or multiple antenna elements (such as multiple antenna elements included in an MIMO antenna), and is used for the RRH 860 to transmit and receive wireless signals. The eNB 830 may include the multiple antennas 840, as illustrated in FIG. 41. For example, the multiple antennas 840 may be compatible with multiple frequency bands used by the eNB 830. Although FIG. 41 illustrates the example in which the eNB 830 includes the multiple antennas 840, the eNB 830 may also include a single antenna 840.

The base station device 850 includes a controller 851, a memory 852, a network interface 853, a wireless communication interface 855, and a connection interface 857. The controller 851, the memory 852, and the network interface 853 are the same as the controller 821, the memory 822, and the network interface 823 described with reference to FIG. 40.

The wireless communication interface 855 supports any cellular communication scheme such as LTE and LTE-Advanced, and provides wireless communication to a terminal positioned in a sector corresponding to the RRH 860 via the RRH 860 and the antenna 840. The wireless communication interface 855 may typically include, for example, a BB processor 856. The BB processor 856 is the same as the BB processor 826 described with reference to FIG. 40, except the BB processor 856 is connected to the RF circuit 864 of the RRH 860 via the connection interface 857. The wireless communication interface 855 may include the multiple BB processors 856, as illustrated in FIG. 41. For example, the multiple BB processors 856 may be compatible with multiple frequency bands used by the eNB 830. Although FIG. 41 illustrates the example in which the wireless communication interface 855 includes the multiple BB processors 856, the wireless communication interface 855 may also include a single BB processor 856.

The connection interface 857 is an interface for connecting the base station device 850 (wireless communication interface 855) to the RRH 860. The connection interface 857 may also be a communication module for communication in the above-described high speed line that connects the base station device 850 (wireless communication interface 855) to the RRH 860.

The RRH 860 includes a connection interface 861 and a wireless communication interface 863.

The connection interface 861 is an interface for connecting the RRH 860 (wireless communication interface 863) to the base station device 850. The connection interface 861 may also be a communication module for communication in the above-described high speed line.

The wireless communication interface 863 transmits and receives wireless signals via the antenna 840. The wireless communication interface 863 may typically include, for example, the RF circuit 864. The RF circuit 864 may include, for example, a mixer, a filter, and an amplifier, and transmits and receives wireless signals via the antenna 840. The wireless communication interface 863 may include multiple RF circuits 864, as illustrated in FIG. 41. For example, the multiple RF circuits 864 may support multiple antenna elements. Although FIG. 41 illustrates the example in which the wireless communication interface 863 includes the multiple RF circuits 864, the wireless communication interface 863 may also include a single RF circuit 864.

The eNB 800 and the eNB 830 shown in FIGS. 40 and 41 may include functions as the transmitting station 100. For example, in the eNB 800 and the eNB 830, the wireless communication unit 110, the storage unit 120, and the controller 130 described with reference to FIG. 6 may be implemented by the wireless communication interface 855 and the wireless communication interface 855 and/or the wireless communication interface 863. Alternatively, at least some of these constituent elements may be implemented by the controller 821 and the controller 851.

Further, the eNB 800 and the eNB 830 shown in FIGS. 40 and 41 may include functions as the receiving station 200. For example, in the eNB 800 and the eNB 830, the wireless communication unit 210, the storage unit 220, and the controller 230 described with reference to FIG. 7 may be implemented by the wireless communication interface 855 and the wireless communication interface 855 and/or the wireless communication interface 863. Alternatively, at least some of these constituent elements may be implemented by the controller 821 and the controller 851.

The eNB 800 and the eNB 830 shown in FIGS. 40 and 41 may include functions as the communication control device 300. For example, in the eNB 800 and the eNB 830, the wireless communication unit 310, the storage unit 320, and the controller 330 described with reference to FIG. 8 may be implemented by the wireless communication interface 855 and the wireless communication interface 855 and/or the wireless communication interface 863. Alternatively, at least some of these constituent elements may be implemented by the controller 821 and the controller 851.

[5-3. Application Examples Regarding Terminal Devices]

First Application Example

Figure 42:
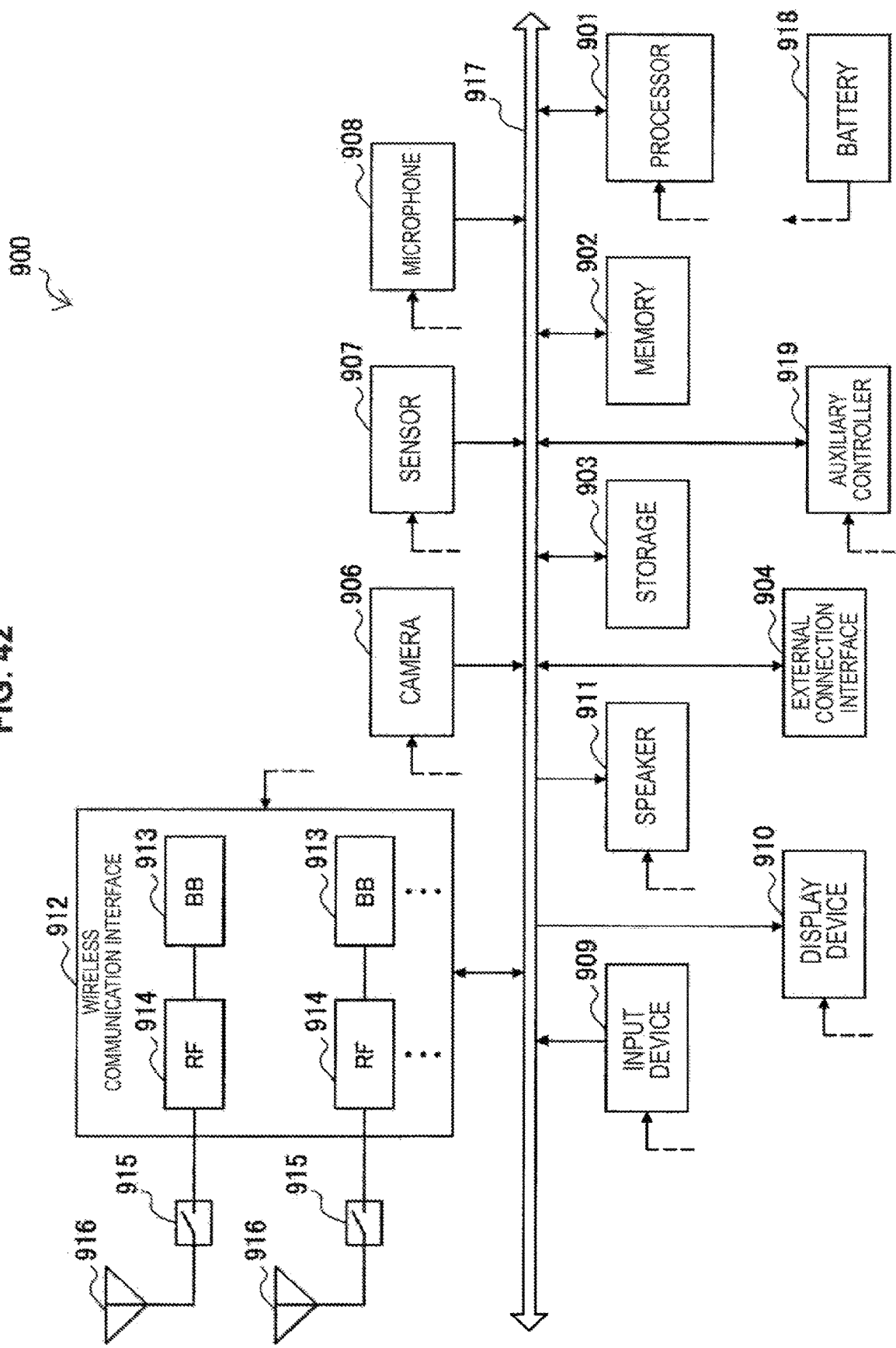
FIG. 42 is a block diagram illustrating an example of a schematic configuration of a smartphone.

FIG. 42 is a block diagram illustrating an example of a schematic configuration of a smartphone 900 to which the technology of the present disclosure may be applied. The smartphone 900 includes a processor 901, a memory 902, a storage 903, an external connection interface 904, a camera 906, a sensor 907, a microphone 908, an input device 909, a display device 910, a speaker 911, a wireless communication interface 912, one or more antenna switches 915, one or more antennas 916, a bus 917, a battery 918, and an auxiliary controller 919.

The processor 901 may be, for example, a CPU or a system on a chip (SoC), and controls functions of an application layer and another layer of the smartphone 900. The memory 902 includes RAM and ROM, and stores a program that is executed by the processor 901, and data. The storage 903 may include a storage medium such as a semiconductor memory and a hard disk. The external connection interface 904 is an interface for connecting an external device such as a memory card and a universal serial bus (USB) device to the smartphone 900.

The camera 906 includes an image sensor such as a charge coupled device (CCD) and a complementary metal oxide semiconductor (CMOS), and generates a captured image. The sensor 907 may include a group of sensors such as a measurement sensor, a gyro sensor, a geomagnetic sensor, and an acceleration sensor. The microphone 908 converts sounds that are input to the smartphone 900 to audio signals. The input device 909 includes, for example, a touch sensor configured to detect touch onto a screen of the display device 910, a keypad, a keyboard, a button, or a switch, and receives an operation or an information input from a user.

The display device 910 includes a screen such as a liquid crystal display (LCD) and an organic light-emitting diode (OLED) display, and displays an output image of the smartphone 900. The speaker 911 converts audio signals that are output from the smartphone 900 to sounds.

The wireless communication interface 912 supports any cellular communication scheme such as LTE and LTE-Advanced, and performs wireless communication. The wireless communication interface 912 may typically include, for example, a BB processor 913 and an RF circuit 914. The BB processor 913 may perform, for example, encoding/decoding, modulating/demodulating, and multiplexing/demultiplexing, and performs various types of signal processing for wireless communication. Meanwhile, the RF circuit 914 may include, for example, a mixer, a filter, and an amplifier, and transmits and receives wireless signals via the antenna 916. The wireless communication interface 913 may also be a one chip module that has the BB processor 913 and the RF circuit 914 integrated thereon. The wireless communication interface 912 may include the multiple BB processors 913 and the multiple RF circuits 914, as illustrated in FIG. 42. Although FIG. 42 illustrates the example in which the wireless communication interface 913 includes the multiple BB processors 913 and the multiple RF circuits 914, the wireless communication interface 912 may also include a single BB processor 913 or a single RF circuit 914.

Furthermore, in addition to a cellular communication scheme, the wireless communication interface 912 may support another type of wireless communication scheme such as a short-distance wireless communication scheme, a near field communication scheme, and a wireless local area network (LAN) scheme. In that case, the wireless communication interface 912 may include the BB processor 913 and the RF circuit 914 for each wireless communication scheme.

Each of the antenna switches 915 switches connection destinations of the antennas 916 among multiple circuits (such as circuits for different wireless communication schemes) included in the wireless communication interface 912.

Each of the antennas 916 includes a single or multiple antenna elements (such as multiple antenna elements included in an MIMO antenna), and is used for the wireless communication interface 912 to transmit and receive wireless signals. The smartphone 900 may include the multiple antennas 916, as illustrated in FIG. 42. Although FIG. 42 illustrates the example in which the smartphone 900 includes the multiple antennas 916, the smartphone 900 may also include a single antenna 916.

Furthermore, the smartphone 900 may include the antenna 916 for each wireless communication scheme. In that case, the antenna switches 915 may be omitted from the configuration of the smartphone 900.

The bus 917 connects the processor 901, the memory 902, the storage 903, the external connection interface 904, the camera 906, the sensor 907, the microphone 908, the input device 909, the display device 910, the speaker 911, the wireless communication interface 912, and the auxiliary controller 919 to each other. The battery 918 supplies power to blocks of the smartphone 900 illustrated in FIG. 42 via feeder lines, which are partially shown as dashed lines in the figure. The auxiliary controller 919 operates a minimum necessary function of the smartphone 900, for example, in a sleep mode.

The smartphone 900 shown in FIG. 42 may include functions as the transmitting station 100. For example, in the smartphone 900, the wireless communication unit 110, the storage unit 120, and the controller 130 described with reference to FIG. 6 may be implemented by the wireless communication interface 912. Alternatively, at least some of these constituent elements may be implemented by the processor 901 or the auxiliary controller 919.

Further, the smartphone 900 shown in FIG. 42 may include functions as the receiving station 200. For example, in the smartphone 900, the wireless communication unit 210, the storage unit 220, and the controller 230 described with reference to FIG. 7 may be implemented by the wireless communication interface 912. Alternatively, at least some of these constituent elements may be implemented by the processor 901 or the auxiliary controller 919.

Further, the smartphone 900 shown in FIG. 42 may include functions as the communication control device 300. For example, in the smartphone 900, the wireless communication unit 310, the storage unit 320, and the controller 330 described with reference to FIG. 8 may be implemented by the wireless communication interface 912. Alternatively, at least some of these constituent elements may be implemented by the processor 901 or the auxiliary controller 919.

Second Application Example

Figure 43:
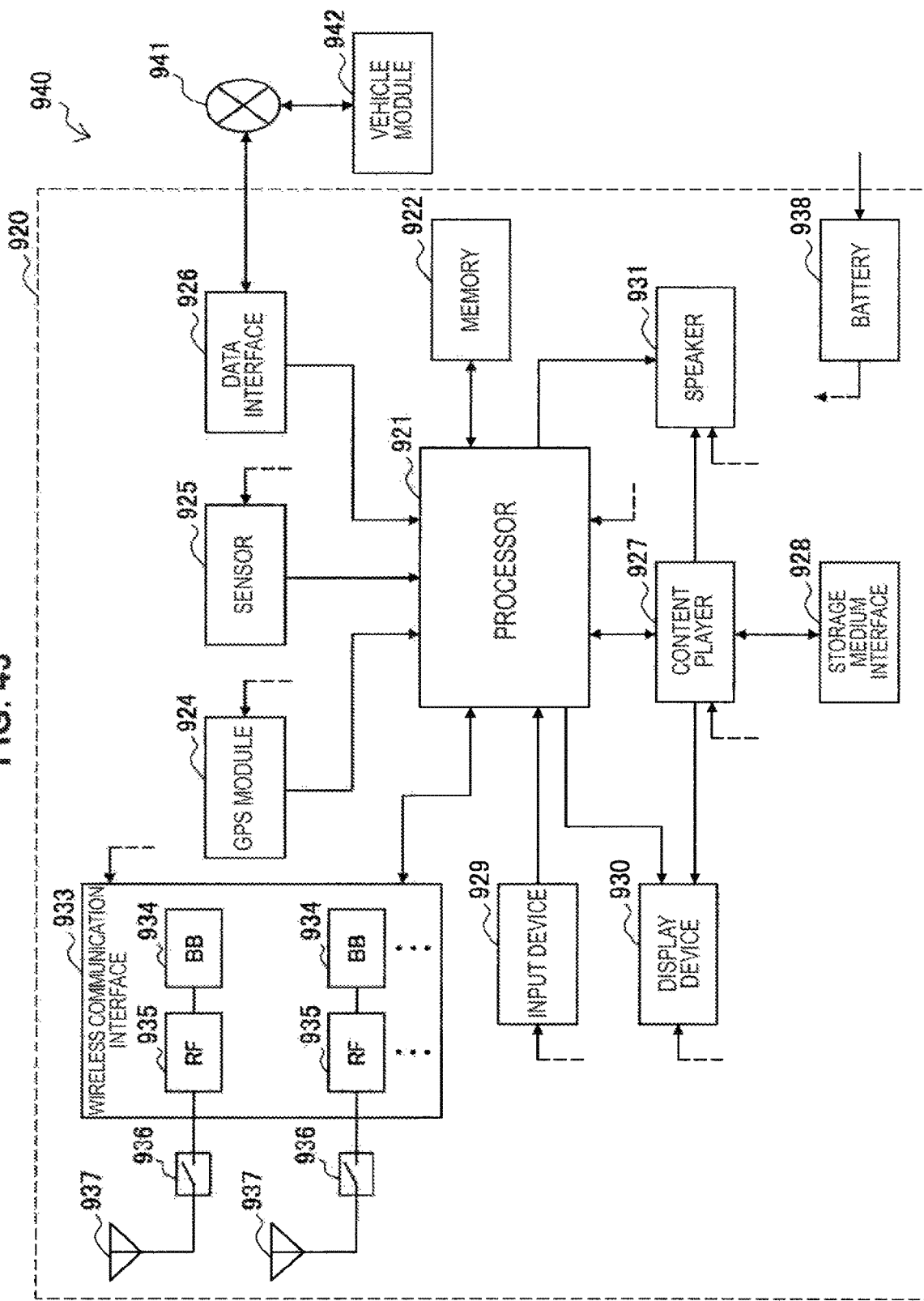
FIG. 43 is a block diagram illustrating an example of a schematic configuration of a car navigation device.

FIG. 43 is a block diagram illustrating an example of a schematic configuration of a car navigation device 920 to which the technology of the present disclosure may be applied. The car navigation device 920 includes a processor 921, a memory 922, a global positioning system (GPS) module 924, a sensor 925, a data interface 926, a content player 927, a storage medium interface 928, an input device 929, a display device 930, a speaker 931, a wireless communication interface 933, one or more antenna switches 936, one or more antennas 937, and a battery 938.

The processor 921 may be, for example, a CPU or a SoC, and controls a navigation function and another function of the car navigation device 920. The memory 922 includes RAM and ROM, and stores a program that is executed by the processor 921, and data.

The GPS module 924 uses GPS signals received from a GPS satellite to measure a position (such as latitude, longitude, and altitude) of the car navigation device 920. The sensor 925 may include a group of sensors such as a gyro sensor, a geomagnetic sensor, and a barometric sensor. The data interface 926 is connected to, for example, an in-vehicle network 941 via a terminal that is not shown, and acquires data generated by the vehicle, such as vehicle speed data.

The content player 927 reproduces content stored in a storage medium (such as a CD and a DVD) that is inserted into the storage medium interface 928. The input device 929 includes, for example, a touch sensor configured to detect touch onto a screen of the display device 930, a button, or a switch, and receives an operation or an information input from a user. The display device 930 includes a screen such as a LCD or an OLED display, and displays an image of the navigation function or content that is reproduced. The speaker 931 outputs sounds of the navigation function or the content that is reproduced.

The wireless communication interface 933 supports any cellular communication scheme such as LET and LTE-Advanced, and performs wireless communication. The wireless communication interface 933 may typically include, for example, a BB processor 934 and an RF circuit 935. The BB processor 934 may perform, for example, encoding/decoding, modulating/demodulating, and multiplexing/demultiplexing, and performs various types of signal processing for wireless communication. Meanwhile, the RF circuit 935 may include, for example, a mixer, a filter, and an amplifier, and transmits and receives wireless signals via the antenna 937. The wireless communication interface 933 may be a one chip module having the BB processor 934 and the RF circuit 935 integrated thereon. The wireless communication interface 933 may include the multiple BB processors 934 and the multiple RF circuits 935, as illustrated in FIG. 436. Although FIG. 43 illustrates the example in which the wireless communication interface 933 includes the multiple BB processors 934 and the multiple RF circuits 935, the wireless communication interface 933 may also include a single BB processor 934 or a single RF circuit 935.

Furthermore, in addition to a cellular communication scheme, the wireless communication interface 933 may support another type of wireless communication scheme such as a short-distance wireless communication scheme, a near field communication scheme, and a wireless LAN scheme. In that case, the wireless communication interface 933 may include the BB processor 934 and the RF circuit 935 for each wireless communication scheme.

Each of the antenna switches 936 switches connection destinations of the antennas 937 among multiple circuits (such as circuits for different wireless communication schemes) included in the wireless communication interface 933.

Each of the antennas 937 includes a single or multiple antenna elements (such as multiple antenna elements included in an MIMO antenna), and is used for the wireless communication interface 933 to transmit and receive wireless signals. The car navigation device 920 may include the multiple antennas 937, as illustrated in FIG. 43. Although FIG. 43 illustrates the example in which the car navigation device 920 includes the multiple antennas 937, the car navigation device 920 may also include a single antenna 937.

Furthermore, the car navigation device 920 may include the antenna 937 for each wireless communication scheme. In that case, the antenna switches 936 may be omitted from the configuration of the car navigation device 920.

The battery 938 supplies power to blocks of the car navigation device 920 illustrated in FIG. 43 via feeder lines that are partially shown as dashed lines in the figure. The battery 938 accumulates power supplied form the vehicle.

The car navigation device 920 shown in FIG. 43 may include functions as the transmitting station 100. In the car navigation device 920, the wireless communication unit 110, the storage unit 120, and the controller 130 described with reference to FIG. 6 may be implemented by the wireless communication interface 933. Alternatively, at least some of these constituent elements may be implemented by the processor 921.

Further, the car navigation device 920 shown in FIG. 43 may include functions as the receiving station 200. In the car navigation device 920, the wireless communication unit 210, the storage unit 220, and the controller 230 described with reference to FIG. 7 may be implemented by the wireless communication interface 933. Alternatively, at least some of these constituent elements may be implemented by the processor 921.

The car navigation device 920 shown in FIG. 43 may include functions as the communication control device 300. In the car navigation device 920, the wireless communication unit 310, the storage unit 320, and the controller 330 described with reference to FIG. 8 may be implemented by the wireless communication interface 933. Alternatively, at least some of these constituent elements may be implemented by the processor 921.

The technology of the present disclosure may also be realized as an in-vehicle system (or a vehicle) 940 including one or more blocks of the car navigation device 920, the in-vehicle network 941, and a vehicle module 942. The vehicle module 942 generates vehicle data such as vehicle speed, engine speed, and trouble information, and outputs the generated data to the in-vehicle network 941.

<6. Conlusion>

Embodiments of the present disclosure have been described in detail with reference to FIGS. 1 to 43. As described above, the transmitting station 100 that performs wireless communication with the receiving station 200 using IDMA controls an interleave length in an interleave process for IDMA. Accordingly, the transmitting station 100 can perform the interleave process with various interleave lengths to thereby facilitate a decoding process at a receiving side and improve decoding performance.

In addition, the transmitting station 100 according to the present embodiment controls whether to perform wireless communication using IDMA on the basis of whether a transmission sequence is a retransmitted sequence or not. Furthermore, the transmitting station 100 controls at least one of an interleave pattern and an interleave length depending on the number of retransmissions or a retransmission process type (adaptive or non-adaptive HARQ, CC or IR) when wireless communication using IDMA is performed. Accordingly, the transmitting station 100 can perform various interleave processes depending on a retransmission state to thereby facilitate a decoding process at a receiving side and improve decoding performance.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

The series of control processes carried out by each device described in the present specification may be realized by software, hardware, or a combination of software and hardware. Programs that compose such software may be stored in advance for example on a storage medium (non-transitory medium) provided inside or outside each of the device. As one example, during execution, such programs are written into RAM (Random Access Memory) and executed by a processor such as a CPU.

Note that it is not necessary for the processing described in this specification with reference to the flowchart to be executed in the order shown in the flowchart. Some processing steps may be performed in parallel. Further, some of additional steps can be adopted, or some processing steps can be omitted.

Further, the effects described in this specification are merely illustrative or exemplified effects, and are not limitative. That is, with or in the place of the above effects, the technology according to the present disclosure may achieve other effects that are clear to those skilled in the art based on the description of this specification.

Additionally, the present technology may also be configured as below.

(1)

A wireless communication device including:

a wireless communication unit that performs wireless communication using interleave division multiple access (IDMA) with another wireless communication device; and a controller that controls an interleave length in an interleave process for IDMA by the wireless communication unit.

(2)

The wireless communication device according to (1), wherein the controller controls whether to perform wireless communication using IDMA depending on whether a transmission sequence is a retransmitted sequence or not.

(3)

The wireless communication device according to (2), wherein the controller controls the wireless communication unit to perform wireless communication using IDMA when the transmission sequence is a retransmitted sequence.

(4)

The wireless communication device according to (2) or (3), wherein the controller controls the interleave length depending on a retransmission process type.

(5)

The wireless communication device according to any one of (2) to (4), wherein the controller controls an interleave pattern in the interleave process by the wireless communication unit.

(6)

The wireless communication device according to (5), wherein the controller controls the interleave pattern depending on the number of retransmissions.

(7)

The wireless communication device according to (5) or (6), wherein the controller controls the interleave pattern depending on a retransmission process type.

(8)

The wireless communication device according to any one of (2) to (7), wherein the controller controls whether to perform wireless communication using IDMA depending on the number of wireless communication devices that are retransmission targets.

(9)

The wireless communication device according to any one of (2) to (8), wherein the controller controls the wireless communication unit to employ chase combining (CC) as a retransmission process type.

(10)

The wireless communication device according to any one of (1) to (9), wherein the controller controls the interleave length on the basis of the quantity of radio resources available for transmission by the wireless communication unit and a used modulation scheme.

(11)

The wireless communication device according to any one of (1) to (10), wherein the controller controls the wireless communication unit to perform padding when a length of an input sequence to the interleave process does not reach the interleave length.

(12)

The wireless communication device according to (11), wherein the controller controls the wireless communication unit to perform padding on the input sequence to the interleave process.

(13)

The wireless communication device according to (11), wherein the controller controls the wireless communication unit to perform padding on an output sequence of the interleave process.

(14)

The wireless communication device according to any one of (1) to (13), wherein the wireless communication unit performs the interleave process having a sequence (codeword) obtained by connecting one or more error correction code sequences (code blocks) as a target.

(15)

A wireless communication device including:

a wireless communication unit that performs wireless communication using IDMA with another wireless communication device; and a controller that controls the wireless communication unit to perform a deinterleave process depending on an interleave length used for an interleave process for IDMA by the other wireless communication device.

(16)

A wireless communication method including:

performing wireless communication using IDMA with another wireless communication device; and controlling an interleave length in an interleave process for IDMA through a processor.

(17)

The wireless communication method according to (16), including controlling wireless communication using IDMA to be performed when a transmission sequence is a retransmitted sequence.

(18)

A wireless communication method including:

performing wireless communication using IDMA with another wireless communication device; and controlling a deinterleave process depending on an interleave length used for an interleave process for IDMA by the other wireless communication device to be performed through a processor.

A wireless communication method.

(19)

A program for causing a computer to function as:

a wireless communication unit that performs wireless communication using IDMA with another wireless communication device; and a controller that controls an interleave length in an interleave process for IDMA by the wireless communication unit.

(20)

A program for causing a computer to function as:

a wireless communication unit that performs wireless communication using IDMA with another wireless communication device; and a controller that controls the wireless communication unit to perform a deinterleave process depending on an interleave length used for an interleave process for IDMA by the other wireless communication device.

REFERENCE SIGNS LIST 1 wireless communication system 1
100 transmitting station
110 wireless communication unit
111 CRC adding unit
112 CB segmentation unit
113 CRC adding unit
114 FEC coding unit
115 rate-matching unit
116 CB connecting unit
117 interleaver setting unit
118 CW interleaver
120 storage unit
130 controller
200 receiving station
210 wireless communication unit
211 channel estimator
212 multiuser/multilayer detector
213 CW deinterleaver
214 CW decoder
215 CRC decoder
216 CW interleaver
217 soft bit buffer
218 PHY layer controller
220 storage unit
230 controller
300 communication control device
310 communication unit
320 storage unit
330 controller
400 cell
500 core network

The invention claimed is:

1. A wireless communication device comprising:
circuitry configured to
perform wireless communication using an interleave process with another wireless communication device; and
(i) determine a quantity of radio resources available for transmission by the wireless communication device, (ii) determine a modulation scheme used for the wireless communication performed by the wireless communication device, and (iii) control, in accordance with the determined quantity of radio resources and determined modulation scheme, an interleave length in the interleave process performed by the wireless communication device.

2. The wireless communication device according to claim 1, wherein the circuitry is configured to control whether to perform wireless communication using the interleave process depending on whether a transmission sequence is a retransmitted sequence or not.

3. The wireless communication device according to claim 2, wherein the circuitry is configured to perform wireless communication using the interleave process when the transmission sequence is a retransmitted sequence.

4. The wireless communication device according to claim 2, wherein the circuitry is configured to set the interleave length depending on a retransmission process type.

5. The wireless communication device according to claim 2, wherein the circuitry is configured to set an interleave pattern in the interleave process.

6. The wireless communication device according to claim 5, wherein the circuitry is configured to set the interleave pattern depending on the number of retransmissions.

7. The wireless communication device according to claim 5, wherein the circuitry is configured to control the interleave pattern depending on a retransmission process type.

8. The wireless communication device according to claim 2, wherein the circuitry is configured to control whether to perform wireless communication using the interleave process depending on the number of wireless communication devices that are retransmission targets.

9. The wireless communication device according to claim 2, wherein the circuitry is configured to employ chase combining (CC) as a retransmission process type.

10. The wireless communication device according to claim 2, wherein the circuitry is further configured to determine a retransmission process type and controls the interleave length in accordance with the determined retransmission process type.

11. The wireless communication device according to claim 1, wherein the interleave process is for interleave division multiple access (IDMA) with the another wireless communication device.

12. The wireless communication device according to claim 1, wherein the circuitry is configured to perform padding when a length of an input sequence to the interleave process does not reach the interleave length.

13. The wireless communication device according to claim 12, wherein the circuitry configured to perform padding on the input sequence to the interleave process.

14. The wireless communication device according to claim 12, wherein the circuitry configured to perform padding on an output sequence of the interleave process.

15. The wireless communication device according to claim 1, wherein the circuitry configured to perform the interleave process with a sequence (codeword) obtained by connecting one or more error correction code sequences (code blocks) as a target.

16. A wireless communication device comprising:
circuitry configured to
perform wireless communication using an interleave process with another wireless communication device; and
control a deinterleave process depending on an interleave length used for the interleave process performed by the another wireless communication device,
wherein the interleave length is controlled in accordance with a determined quantity of radio resources available for transmission by the another wireless communication device and a determined modulation scheme used for the transmission by the another wireless communication device.

17. A wireless communication method comprising:
performing, wireless communication using an interleave process with another wireless communication device;
determining, a quantity of radio resources available for performing the wireless communication;
determining, a modulation scheme used for the wireless communication performed; and
controlling, an interleave length in the interleave process.

18. The wireless communication method according to claim 17, further comprising:
controlling wireless communication using the interleave process to be performed when a transmission sequence is a retransmitted sequence.

* * * * *